US 9,023,577 B2

(12) United States Patent
Takeshita et al.

(10) Patent No.: US 9,023,577 B2
(45) Date of Patent: May 5, 2015

(54) RESIST COMPOSITION AND METHOD OF FORMING RESIST PATTERN

(75) Inventors: Masaru Takeshita, Kawasaki (JP); Hirokuni Saito, Kawasaki (JP); Jiro Yokoya, Kawasaki (JP); Tsuyoshi Nakamura, Kawasaki (JP)

(73) Assignee: Tokyo Ohka Kogyo Co., Ltd, Kawasaki-shi (JP)

( * ) Notice: Subject to any disclaimer, the term of this patent is extended or adjusted under 35 U.S.C. 154(b) by 112 days.

(21) Appl. No.: 13/346,166

(22) Filed: Jan. 9, 2012

(65) Prior Publication Data
US 2012/0183899 A1 Jul. 19, 2012

(30) Foreign Application Priority Data
Jan. 14, 2011 (JP) ................................. 2011-005712

(51) Int. Cl.
G03F 7/039 (2006.01)
G03F 7/004 (2006.01)
G03F 7/20 (2006.01)

(52) U.S. Cl.
CPC ............ *G03F 7/0048* (2013.01); *G03F 7/0397* (2013.01); *G03F 7/2041* (2013.01)

(58) Field of Classification Search
None
See application file for complete search history.

(56) References Cited

U.S. PATENT DOCUMENTS

| 5,945,517 | A | 8/1999 | Nitta et al. | |
| 6,153,733 | A | 11/2000 | Yukawa et al. | |
| 6,830,872 | B2 * | 12/2004 | Mizutani et al. | 430/276.1 |
| 7,074,543 | B2 | 7/2006 | Iwai et al. | |
| 2003/0073029 | A1 | 4/2003 | Sato et al. | 430/270.1 |
| 2004/0048190 | A1 * | 3/2004 | Momota | 430/270.1 |
| 2004/0053161 | A1 * | 3/2004 | Kanna et al. | 430/270.1 |
| 2004/0053163 | A1 * | 3/2004 | Fujita | 430/270.1 |
| 2004/0191676 | A1 * | 9/2004 | Nakao et al. | 430/270.1 |
| 2006/0009583 | A1 | 1/2006 | Kubota et al. | |
| 2008/0187860 | A1 | 8/2008 | Tsubaki et al. | |
| 2010/0047724 | A1 | 2/2010 | Takeshita et al. | |
| 2010/0190108 | A1 * | 7/2010 | Takeshita et al. | 430/270.1 |
| 2010/0316954 | A1 * | 12/2010 | Koyama et al. | 430/270.1 |
| 2012/0115086 | A1 * | 5/2012 | Yasuda et al. | 430/285.1 |

FOREIGN PATENT DOCUMENTS

| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2003-241385 | 8/2003 |
| JP | A-2003-246825 | 9/2003 |
| JP | A-2004-175981 | 6/2004 |
| JP | A-2004-184636 | 7/2004 |
| JP | A-2004-231950 | 8/2004 |
| JP | A-2005-097516 | 4/2005 |
| JP | A-2008-248244 | 10/2008 |
| JP | A-2008-248245 | 10/2008 |
| JP | A-2008-292975 | 12/2008 |
| JP | A-2010-217855 | 9/2010 |
| JP | 2010-254810 A * | 11/2010 |
| JP | A-2010-254810 | 11/2010 |
| JP | A-2011-053643 | 3/2011 |
| WO | WO 2004/074242 A2 | 9/2004 |
| WO | WO-2011004840 A1 * | 1/2011 |

OTHER PUBLICATIONS

Tomoya Oshikiri ; Atsushi Yasuda ; Keisuke Kato ; Shin-ichi Maeda; Primary structure control of ArF resist polymer by regulating feed rate of monomers and initiator. Proc. SPIE 7972, Advances in Resist Materials and Processing Technology XXVIII, 79721U (Apr. 15, 2011); doi:10.1117/12.879421.*
Gil et al., "First Microprocessors with Immersion Lithography", Proceedings of SPIE, (2005), vol. 5754, pp. 119-128.
Ebihara et al., "Beyond $k_1$=.0.25 lithography: 70nm L/S patterning using KrF scanners", Proceedings of SPIE (2003) vol. 5256, pp. 985-994.
Borodovsky, "Marching to the beat of Moore's Law", Proceedings of SPIE (2006), vol. 6153, pp. 615301-1 to 615301-19.
Office Action in Japanese Patent Application No. 2011-005712, mailed Jul. 8, 2014.

* cited by examiner

*Primary Examiner* — Cynthia Hamilton
(74) *Attorney, Agent, or Firm* — Knobbe Martens Olson & Bear, LLP

(57) ABSTRACT

A resist composition containing a base component (A) which exhibits changed solubility in a developing solution under the action of acid, and an acid generator component (B) which generates acid upon exposure, dissolved in an organic solvent (S) which contains an alcohol-based solvent, wherein the base component (A) contains a copolymer (A1) that exhibits increased polarity under the action of acid, and the copolymer (A1) is a copolymer in which a structural unit (a2), which is derived from an acrylate ester in which the hydrogen atom bonded to the carbon atom on the α-position may be substituted with a substituent, and includes a lactone-containing cyclic group, is dispersed uniformly within the copolymer molecule.

5 Claims, No Drawings

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2011-005712, filed Jan. 14, 2011, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization. Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as electron beam (EB), extreme ultraviolet radiation (EUV), and X-ray.

As the wavelength of exposure light sources is shortened, the resist materials for use with these types of exposure light sources require lithography properties such as a high resolution capable of reproducing patterns of minute dimensions, and a high level of sensitivity to these types of exposure light sources. A known type of resist material that satisfies these conditions is a chemically amplified resist composition.

For example, in the case where the developing solution is an alkali developing solution (namely, an alkali developing process), a chemically amplified resist composition containing a resin component (base resin) which exhibits increased solubility in an alkali developing solution under the action of acid, and an acid generator is typically used. If the resist film formed using the resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution. The unexposed portions remain as a pattern, resulting in the formation of a positive-type pattern.

The aforementioned base resin uses a resin in which the polarity increases under the action of acid, resulting in an increase in the solubility of the resin in an alkali developing solution, but a decrease in the solubility of the resin within organic solvents. Accordingly, if a process that uses a developing solution containing an organic solvent (an organic developing solution) is employed (hereinafter also referred to as a solvent developing process or negative-type developing process) instead of the alkali developing process, then within the exposed portions of the resist film, the solubility in the organic developing solution decreases relatively, meaning the unexposed portions are dissolved in the organic developing solution and removed, whereas the exposed portions remain as a pattern, resulting in the formation of a negative-type pattern. Patent Document 1 proposes a negative-type developing process.

Currently, resins and the like that contain structural units derived from (meth)acrylate esters within the main chain (acrylic resins) are now widely used as base resins for chemically amplified resist compositions that use ArF excimer laser lithography or the like, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

The base resin generally includes a plurality of structural units in order to improve the lithography properties and the like. For example, in the case of a resin that exhibits higher polarity under the action of acid, a base resin is typically used that includes not only a structural unit having an acid-degradable group that degrades under the action of the acid generated from the acid generator, but also a structural unit having a polar group such as a hydroxyl group, and a structural unit having a lactone structure (for example, see Patent Document 2). In particular, introduction into the base resin of a structural unit having a lactone structure is very effective in terms of improving the adhesion of the resist film to the substrate during pattern formation and improving the affinity between a developing solution containing water (particularly in the case of an alkali developing process) and the resist film, and makes it easier to obtain favorable lithography properties and a superior pattern shape, and is therefore commonly used.

As a technique for further improving the resolution, a lithography technique called liquid immersion lithography (hereinafter also referred to as "immersion exposure") is known, in which exposure (immersion exposure) is conducted in a state where the region between the objective lens of the exposure apparatus and the sample is filled with a liquid (an immersion medium) that has a larger refractive index than the refractive index of air (for example, see Non-Patent Document 1).

With this type of immersion exposure, it is considered that higher resolutions equivalent to those obtained using a shorter wavelength light source or a higher NA lens can be achieved using the same exposure light source wavelength, with no reduction in the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor elements, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is capable of being used in combination with currently studied super-resolution techniques such as phase shift methods and modified illumination methods. Currently, techniques using an ArF excimer laser as the exposure source are the most actively studied immersion exposure techniques. Further, water is mainly being investigated as the immersion medium.

Recently, a new lithography technique called a double patterning process has been proposed, in which a resist pattern is formed by conducting patterning two or more times (for example, see Non-Patent Documents 2 and 3). There are a number of varieties of double patterning processes, and examples include (1) a method in which a lithography step (from application of a resist composition through to exposure and developing) and an etching step are performed two or more times to form a pattern, and (2) a method in which the lithography step is repeated twice or more in succession. By using these double patterning processes, a resist pattern can be formed that has a higher resolution than a resist pattern formed using only a single lithography step (single patterning), even when a light source having the same exposure wavelength is used, and even when the same resist composition is used. Further, a double patterning process can be performed using an existing exposure apparatus.

PRIOR ART DOCUMENTS

Patent Documents

[Patent Document 1]
Japanese Unexamined Patent Application, First Publication No. 2008-292975
[Patent Document 2]
Japanese Unexamined Patent Application, First Publication No. 2003-241385

Non-Patent Documents

[Non-Patent Document 1] Proceedings of SPIE, vol. 5754, pp. 119 to 128 (2005)
[Non-Patent Document 2] Proceedings of SPIE, vol. 5256, pp. 985 to 994 (2003)
[Non-Patent Document 3] Proceedings of SPIE, vol. 6153, pp. 1 to 19 (2006)

DISCLOSURE OF INVENTION

Problems to be Solved by the Invention

However, in the type of double patterning process described above (where the developing solution is an alkali developing solution), and particularly in those cases where the resist material used in forming the first resist film is a positive-type chemically amplified resist composition, a problem arises in that the first resist pattern is easily damaged during the second patterning. Specific problems include a change in the shape of the first resist pattern (such as a reduction in the pattern height (thickness loss), or a reduction in the line width of a line pattern (pattern thinning)), or even destruction of the first resist pattern.

These problems are caused by the effects of the organic solvent used in the second resist material, or the effects of the exposure and the like performed during the second patterning. These types of problems become increasingly likely as the thickness of the first resist film is reduced, and as the dimensions of the resist pattern to be formed in the first resist film are reduced.

In order to prevent the types of resist pattern shape problems described above, techniques have been proposed for protecting the first resist pattern, for example by using a freezing agent following the first patterning, but these techniques are undesirable in terms of improving throughput.

Further, the use of a positive-type chemically amplified resist composition that uses an alcohol-based solvent as the second resist composition is another possibility, but if an alcohol-based solvent is used as the organic solvent for a conventional positive-type chemically amplified resist composition, then the solubility of the resist components such as the above-mentioned acrylic resin or the onium salt acid generator within the alcohol-based solvent tends to be unsatisfactory, causing problems such as precipitation over time or poor long-term stability. In particular, if a base resin produced using a conventional polymerization method contains a large amount of a structural unit having a lactone structure, then the solubility of the base resin in alcohol-based solvents tends to worsen. As a result, a structural unit having a lactone structure cannot be included in the base resin in a satisfactory amount, making it difficult to form a pattern having minute dimensions with favorable lithography properties and a superior pattern shape.

The present invention takes the above circumstances into consideration, with an object of providing a resist composition prepared by dissolution in an organic solvent containing an alcohol-based solvent, which is capable of forming a pattern having minute dimensions with a superior shape, as well as providing a method of forming a resist pattern.

Means to Solve the Problems

In order to achieve the above object, the present invention adopts the aspects described below.

Namely, a first aspect of the present invention is a resist composition containing a base component (A) which exhibits changed solubility in a developing solution under the action of acid, and an acid generator component (B) which generates acid upon exposure, dissolved in an organic solvent (S) which contains an alcohol-based solvent, wherein the base component (A) contains a copolymer (A1) that exhibits increased polarity under the action of acid, and the copolymer (A1) is a copolymer in which a structural unit (a2), which is derived from an acrylate ester in which the hydrogen atom bonded to the carbon atom on the α-position may be substituted with a substituent, and includes a lactone-containing cyclic group, is dispersed uniformly within the copolymer molecule.

A second aspect of the present invention is a method of forming a resist pattern that includes: forming a resist film on a substrate using the resist composition of the first aspect, conducting exposure of the resist film, and developing the resist film to form a resist pattern.

In the present description and claims, unless specified otherwise, the term "alkyl group" includes linear, branched and cyclic monovalent saturated hydrocarbon groups.

The term "alkylene group" includes linear, branched and cyclic divalent saturated hydrocarbon groups, unless specified otherwise.

A "fluorinated alkyl group" or a "fluorinated alkylene group" is a group in which some or all of the hydrogen atoms of an alkyl group or an alkylene group have each been substituted with a fluorine atom.

A "lower alkyl group" is an alkyl group of 1 to 5 carbon atoms.

A "halogenated alkyl group" is a group in which some or all of the hydrogen atoms of an alkyl group have each been substituted with a halogen atom. Examples of the halogen atom include a fluorine atom, chlorine atom, bromine atom or iodine atom.

A "hydroxyalkyl group" is a group in which some or all of the hydrogen atoms of an alkyl group have each been substituted with a hydroxyl group.

The term "aliphatic" is a relative concept used in relation to the term "aromatic", and defines a group or compound or the like that has no aromaticity.

The term "structural unit" refers to a monomer unit that contributes to the formation of a polymeric compound (a polymer or copolymer).

The term "exposure" is used as a general concept that includes irradiation with any form of radiation, including an ArF excimer laser, KrF excimer laser, $F_2$ excimer laser, extreme ultraviolet rays (EUV), vacuum ultraviolet rays (VUV), electron beam (EB), X-rays or soft X-rays.

Effect of the Invention

The present invention is able to provide a resist composition prepared by dissolution in an organic solvent containing an alcohol-based solvent, which is capable of forming a pattern having minute dimensions with a superior shape, as well as providing a method of forming a resist pattern that uses the resist composition.

DETAILED DESCRIPTION OF THE INVENTION

<<Resist Composition>>

The resist composition of the present invention is prepared by dissolving a base component (A) (hereinafter referred to as "component (A)") which exhibits changed solubility in a developing solution under the action of acid, and an acid generator component (B) (hereinafter referred to as "component (B)") which generates acid upon exposure, in an organic solvent (S) which contains an alcohol-based solvent.

When the resist film that is formed using the resist composition is subjected to selective exposure, acid is generated from the component (B) in the exposed portions, and the solubility of the component (A) in a developing solution changes under the action of the generated acid, whereas in the unexposed portions, the solubility of the component (A) in the developing solution does not change, meaning a difference in solubility in the developing solution develops between the exposed portions and the unexposed portions. As a result, subsequent developing of the resist film can be used to form a resist pattern, by dissolving and removing either the exposed portions in the case of a positive-type resist pattern, or the unexposed portions in the case of a negative-type resist pattern.

In this description, a resist composition used in forming a positive-type resist pattern is referred to as a "positive-type resist composition", whereas a resist composition used in forming a negative-type resist pattern is referred to as a "negative-type resist composition".

The resist composition of the present invention may be used for either an alkali developing process in which an alkali developing solution is used for the developing treatment during formation of the resist pattern, or a solvent developing process (hereinafter also referred to as a "negative-type developing process") in which a developing solution containing an organic solvent (an organic developing solution) is used for the developing treatment.

<Component (A)>

The component (A) is a base component which exhibits changed solubility in a developing solution under the action of acid.

In the present description and claims, the term "base component" refers to an organic compound capable of forming a film, and is preferably an organic compound having a molecular weight of 500 or more. Ensuring that the organic compound has a molecular weight of 500 or more ensures a satisfactory film-forming ability, and facilitates the formation of nano level resist patterns.

The "organic compounds having a molecular weight of 500 or more" may be broadly classified into non-polymers and polymers.

In general, compounds which have a molecular weight of at least 500 but less than 4,000 may be used as non-polymers. Hereinafter, the term "low molecular weight compound" is used to describe a non-polymer having a molecular weight of at least 500 but less than 4,000.

In terms of the polymers, compounds which have a molecular weight of 1,000 or more may be used. In the present description and claims, the terms "polymeric compound" and "resin" are used to describe a polymer having a molecular weight of 1,000 or more.

In the case of a polymeric compound, the "molecular weight" refers to the polystyrene-equivalent weight-average molecular weight determined by gel permeation chromatography (GPC).

In the present invention, the component (A) contains a copolymer (A1) (hereinafter referred to as "component (A1)") that exhibits increased polarity under the action of acid. In other words, the resist composition of the present invention is a resist composition which forms a positive-type pattern in an alkali developing process, but forms a negative-type pattern in a solvent developing process.

By including the component (A1), the polarity of the base component changes upon exposure, and therefore favorable developing contrast can be achieved, not only in an alkali developing process, but also in a solvent developing process.

In those cases where an alkali developing process is used, the component (A1) is substantially insoluble in the alkali developing solution prior to exposure, but when acid is generated from the component (B) upon exposure, the action of the acid causes an increase in the polarity of the component (A1) that increases the solubility in the alkali developing solution. Accordingly, during resist pattern formation, by conducting selective exposure of a resist film formed by applying the resist composition to a substrate, the exposed portions change from being substantially insoluble in an alkali developing solution to being soluble, while the unexposed portions remain substantially insoluble in the alkali developing solution, meaning alkali developing can be used to form a positive-type pattern.

Further, in those cases where a solvent developing process is used, the component (A1) exhibits good solubility in the organic developing solution prior to exposure, but when acid is generated from the component (B) upon exposure, the action of the acid causes an increase in the polarity of the component (A1) that reduces the solubility in the organic developing solution. Accordingly, during resist pattern formation, by conducting selective exposure of a resist film formed by applying the resist composition to a substrate, the exposed portions change from being soluble in an organic developing solution to being substantially insoluble, while the unexposed portions remain soluble in the organic developing solution, meaning developing with the organic developing solution can be used to achieve contrast between the exposed portions and unexposed portions, enabling formation of a negative-type pattern.

In the present invention, the component (A1) is a copolymer in which a structural unit (a2), which is derived from an acrylate ester in which the hydrogen atom bonded to the carbon atom on the α-position may be substituted with a substituent and includes a lactone-containing cyclic group, is dispersed uniformly within the copolymer molecule.

The component (A1) is preferably a copolymer which, in addition to the structural unit (a2), also includes a structural unit (a1), which is derived from an acrylate ester in which the hydrogen atom bonded to the carbon atom on the α-position may be substituted with a substituent, and contains an acid-degradable group that exhibits increased polarity under the action of acid.

Further, the copolymer (A1) is preferably a copolymer which, in addition to the structural unit (a2), or in addition to the combination of the structural unit (a1) and the structural unit (a2), also includes a structural unit (a3), which is derived from an acrylate ester in which the hydrogen atom bonded to the carbon atom on the α-position may be substituted with a substituent, and contains a polar group-containing aliphatic hydrocarbon group.

In the present description and claims, a "structural unit derived from an acrylate ester" refers to a structural unit that is formed by the cleavage of the ethylenic double bond of an acrylate ester.

The term "acrylate ester" describes a compound in which the hydrogen atom at the carboxyl group terminal of acrylic acid ($CH_2$=CH—COOH) has been substituted with an organic group.

In the acrylate ester, the hydrogen atom bonded to the carbon atom on the α-position may be substituted with a substituent. Examples of the substituent that may substitute the hydrogen atom bonded to the carbon atom on the α-position include atoms other than a hydrogen atom and groups, and specific examples include alkyl groups of 1 to 5 carbon atoms, halogenated alkyl groups of 1 to 5 carbon atoms and hydroxyalkyl groups of 1 to 5 carbon atoms. The "carbon atom on the α-position of an acrylate ester" refers to the carbon atom bonded to the carbonyl group, unless specified otherwise.

In the following description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe either or both of the acrylate ester and the α-substituted acrylate ester.

In an α-substituted acrylate ester, an alkyl group for the α-position substituent is preferably a linear or branched alkyl group, and specific examples include a methyl group, ethyl group, propyl group, isopropyl group, n-butyl group, isobutyl group, tert-butyl group, pentyl group, isopentyl group or neopentyl group.

Further, specific examples of the halogenated alkyl group for the α-position substituent include groups in which some or all of the hydrogen atoms of an above-mentioned "alkyl group for the α-position substituent" have each been substituted with a halogen atom. Examples of the halogen atom include a fluorine atom, chlorine atom, bromine atom or iodine atom, and a fluorine atom is particularly desirable.

A hydrogen atom, an alkyl group of 1 to 5 carbon atoms or a halogenated alkyl group of 1 to 5 carbon atoms is preferably bonded to the carbon atom on the α-position of an α-substituted acrylate ester, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

[Structural Unit (a2)]

The structural unit (a2) is a structural unit derived from an acrylate ester in which the hydrogen atom bonded to the carbon atom on the α-position may be substituted with a substituent, and includes a lactone-containing cyclic group.

In this description, the term "lactone-containing cyclic group" refers to a cyclic group including a single ring (lactone ring) containing an —O—C(=O)— structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion of the resist film to the substrate, and improving the affinity between a developing solution containing water (particularly in the case of an alkali developing process) and the resist film.

There are no particular limitations on the structural unit (a2), and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specific examples of the structural unit (a2) include structural units represented by general formulas (a2-1) to (a2-5) shown below.

[Chemical Formula 1]

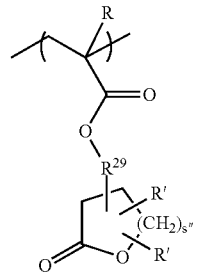

(a2-1)

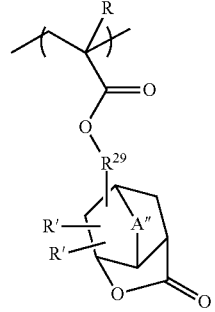

(a2-2)

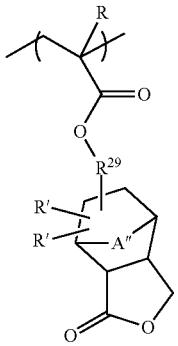

(a2-3)

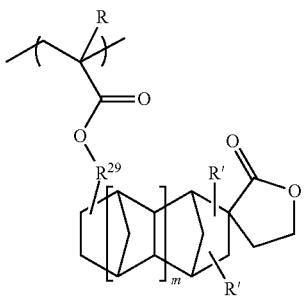

(a2-4)

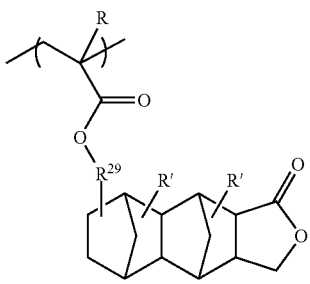

(a2-5)

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents either a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), examples of the alkyl group and halogenated alkyl group for R include the same alkyl groups and halogenated alkyl groups as those listed above, within the description of the α-substituted acrylate ester, as examples of the substituent that may be bonded to the carbon atom on the α-position. R is preferably a hydrogen atom, an alkyl group of 1 to 5 carbon atoms or a fluorinated alkyl group of 1 to 5 carbon atoms, and is most preferably a hydrogen atom or a methyl group.

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of factors such as industrial availability, R' is preferably a hydrogen atom.

R" is preferably a hydrogen atom or a linear, branched or cyclic alkyl group of 1 to 15 carbon atoms.

When R" is a linear or branched alkyl group, the alkyl group preferably contains 1 to 10 carbon atoms, and more preferably 1 to 5 carbon atoms When R" is a cyclic alkyl group, the alkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group.

There are no particular limitations on the divalent linking group for $R^{29}$, but a divalent hydrocarbon group which may have a substituent or a divalent linking group containing a hetero atom is preferred.

The expression that the hydrocarbon group "may have a substituent" means that some or all of the hydrogen atoms within the hydrocarbon group may each be substituted with a substituent (an atom other than a hydrogen atom or a group).

The hydrocarbon group may be an aliphatic hydrocarbon group or an aromatic hydrocarbon group.

An "aliphatic hydrocarbon group" refers to a hydrocarbon group that has no aromaticity.

The aliphatic hydrocarbon group for the divalent hydrocarbon group of $R^{29}$ may be either saturated or unsaturated, but in most cases, is preferably saturated.

More specific examples of the aliphatic hydrocarbon group include linear or branched aliphatic hydrocarbon groups and aliphatic hydrocarbon groups that include a ring within the structure.

The linear or branched aliphatic hydrocarbon group preferably contains 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those described above.

The alicyclic hydrocarbon group preferably contains 3 to 20 carbon atoms, and more preferably 3 to 12 carbon atoms.

The alicyclic hydrocarbon group may be either a polycyclic group or a monocyclic group. As the monocyclic alicyclic group, a group in which two hydrogen atoms have been removed from a monocycloalkane is preferred. The monocycloalkane preferably contains 3 to 6 carbon atoms, and specific examples include cyclopentane and cyclohexane. As the polycyclic alicyclic group, a group in which two hydrogen atoms have been removed from a polycycloalkane is preferred. The polycycloalkane preferably contains 7 to 12 carbon atoms, and specific examples include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group that contains an aromatic ring.

The aromatic hydrocarbon group for the divalent hydrocarbon group of $R^{29}$ preferably contains 3 to 30 carbon atoms, more preferably 5 to 30 carbon atoms, still more preferably 5 to 20 carbon atoms, still more preferably 6 to 15 carbon atoms, and most preferably 6 to 10 carbon atoms. This number of carbon atoms does not include any carbon atoms within any substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which some of the carbon atoms that constitute one of the above aromatic hydrocarbon rings have been substituted with a hetero atom. Examples of the hetero atom in the aromatic heterocyclic rings include an oxygen atom, a sulfur atom or a nitrogen atom.

Specific examples of the aromatic hydrocarbon group include groups in which two hydrogen atoms have been removed from an above-mentioned aromatic hydrocarbon ring (namely, arylene groups), and groups in which one hydrogen atom from a group having one hydrogen atom removed from an above-mentioned aromatic hydrocarbon ring (namely, an aryl group) is substituted with an alkylene group (for example, groups in which one hydrogen atom is removed from the aryl group of an arylalkyl group such as a benzyl group, phenethyl group, 1-naphthylmethyl group, 2-naphthylmethyl group, 1-naphthylethyl group or 2-naphthylethyl group). The alkylene group (namely, the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an above-mentioned aromatic hydrocarbon group may be substituted with a substituent. Examples of the substituent include an alkyl group, alkoxy group, halogen atom, halogenated alkyl group, hydroxyl group, or oxygen atom (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent of the aromatic hydrocarbon group include a fluorine atom, chlorine atom, bromine atom or iodine atom, and a fluorine atom is preferred.

Examples of the halogenated alkyl group for the substituent include groups in which some or all of the hydrogen atoms of an above-mentioned alkyl group have each been substituted with a halogen atom.

Examples of the hetero atom in the "divalent linking group containing a hetero atom" include atoms other than a carbon atom or hydrogen atom, and specific examples include an oxygen atom, nitrogen atom, sulfur atom or halogen atom.

Specific examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, —NH—C(=O)—, =N—, groups represented by general formulas —$Y^{21}$—O—$Y^{22}$—, —[$Y^{21}$—C(=O)—O]$_{m'}$—$Y^{22}$— or —$Y^{21}$—O—C(=O)—$Y^{22}$— [wherein each of $Y^{21}$ and $Y^{22}$ independently represents a divalent hydrocarbon group which may have a substituent, O represents an oxygen atom, and m' represents an integer of 0 to 3].

When $R^{29}$ represents —NH—, the H may be substituted with a substituent such as an alkyl group or an acyl group or the like. The substituent (the alkyl group or acyl group or the like) preferably contains 1 to 10 carbon atoms, more preferably 1 to 8 carbon atoms, and most preferably 1 to 5 carbon atoms. In the formulas —$Y^{21}$—O—$Y^{22}$—, —[$Y^{21}$—C(=O)—O]$_{m'}$—$Y^{22}$— or —$Y^{21}$—O—C(=O)—$Y^{22}$—, each of $Y^{21}$ and $Y^{22}$ independently represents a divalent hydrocarbon group which may have a substituent. Examples of this divalent hydrocarbon group include the same groups as those described above for the "divalent hydrocarbon group which may have a substituent" for $R^{29}$.

$Y^{21}$ is preferably a linear aliphatic hydrocarbon group, more preferably a linear alkylene group, still more preferably a linear alkylene group of 1 to 5 carbon atoms, and most preferably a methylene group or ethylene group.

$Y^{22}$ is preferably a linear or branched aliphatic hydrocarbon group, and is more preferably a methylene group, ethylene group or alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[$Y^{21}$—C(=O)—O]$_{m'}$—$Y^{22}$—, m' represents an integer of 0 to 3, and is preferably an integer of 0 to 2, more preferably 0 or 1, and most preferably 1. In other words, the group represented by formula —[$Y^{21}$—C(=O)—O]$_{m'}$—$Y^{22}$— is most preferably a group represented by a formula —$Y^{21}$—C(=O)—O—$Y^{22}$—. Among such groups, groups represented by —(CH$_2$)$_a$—C(=O)—O—(CH$_2$)$_{b'}$— are particularly preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

The divalent linking group containing a hetero atom is preferably a linear group containing an oxygen atom as the hetero atom, such as a group containing an ether linkage or an ester linkage, and a group represented by one of the above formulas —$Y^{21}$—O—$Y^{22}$—, —[$Y^{21}$—C(=O)—O]$_{m'}$—$Y^{22}$— or —$Y^{21}$—O—C(=O)—$Y^{22}$— is particularly desirable.

Among the above possibilities, the divalent linking group for $R^{29}$ is preferably an alkylene group, an ester linkage (—C(=O)—O—) or a combination thereof. The alkylene group for the divalent linking group for $R^{29}$ is preferably a linear or branched alkylene group. Specific examples include the linear alkylene groups and branched alkylene groups among those groups listed above for the aliphatic hydrocarbon group for $R^{29}$.

s" is preferably an integer of 1 or 2.

Specific examples of the structural units represented by the above-mentioned general formulas (a2-1) to (a2-5) are shown below.

In each of the following formulas, $R^\alpha$ represents a hydrogen atom, a methyl group or a trifluoromethyl group.

[Chemical Formula 2]

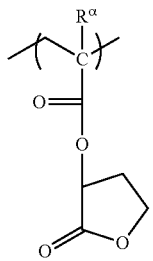

(a2-1-1)

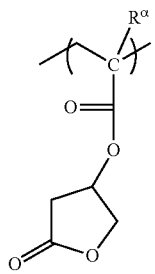

(a2-1-2)

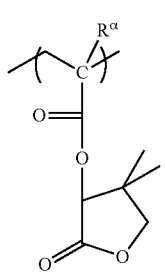

(a2-1-3)

-continued

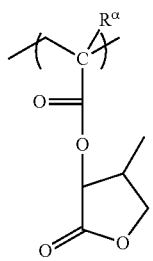

(a2-1-4)

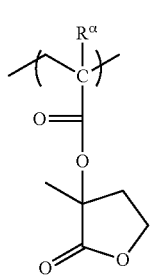

(a2-1-5)

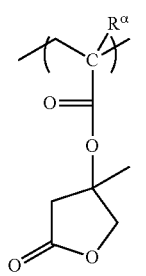

(a2-1-6)

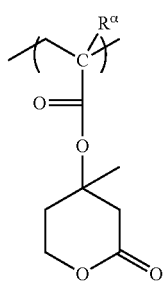

(a2-1-7)

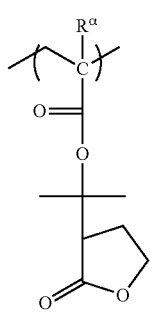

(a2-1-8)

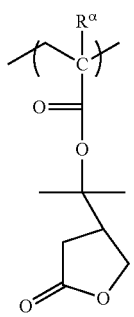
(a2-1-9)
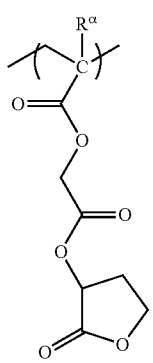
(a2-1-10)
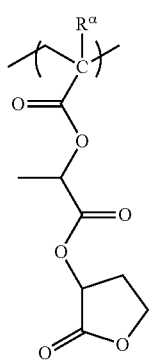
(a2-1-11)
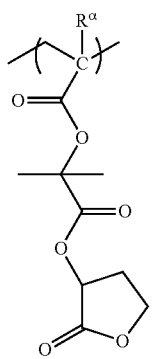
(a2-1-12)
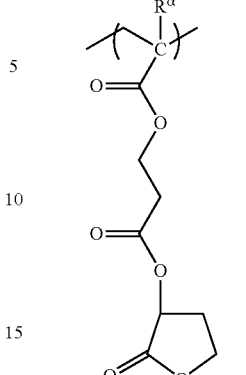
(a2-1-13)
[Chemical Formula 3]
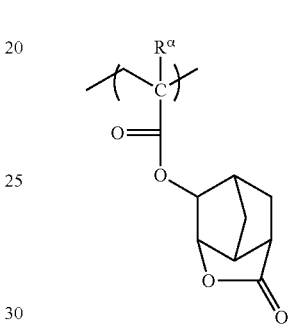
(a2-2-1)
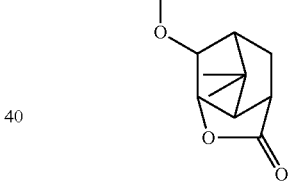
(a2-2-2)
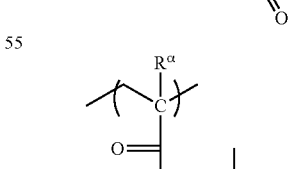
(a2-2-3)
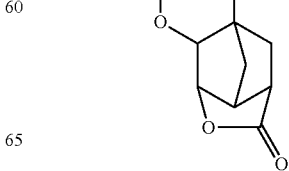
(a2-2-4)

-continued
(a2-2-5)
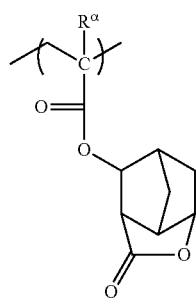
(a2-2-6)
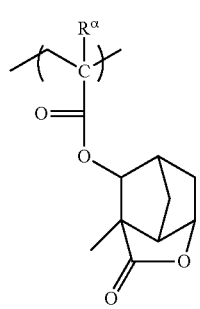
(a2-2-7)
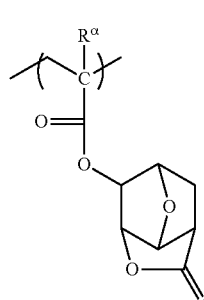
(a2-2-8)
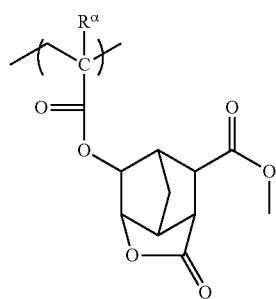
(a2-2-9)
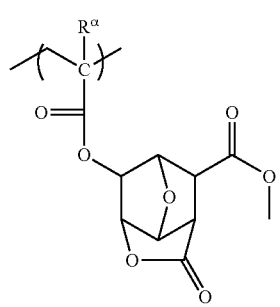
-continued
(a2-2-10)
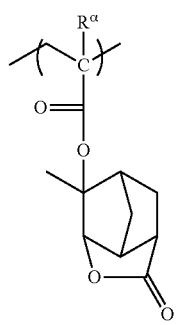
(a2-2-11)
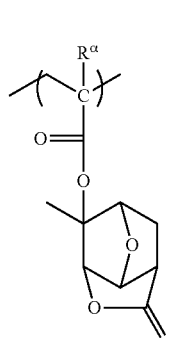
(a2-2-12)
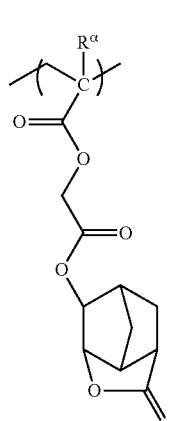
(a2-2-13)
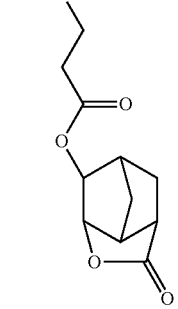

(a2-2-14)
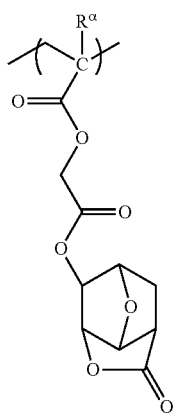
(a2-2-17)
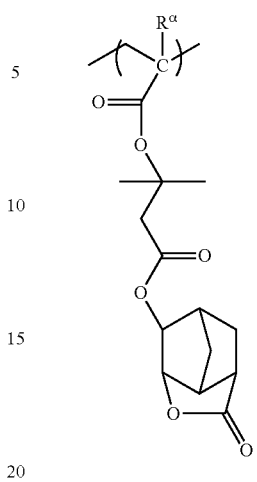
(a2-2-15)
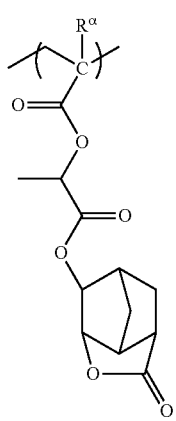
[Chemical Formula 4]
(a2-3-1)
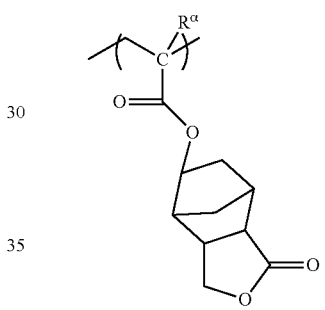
(a2-3-2)
(a2-2-16)
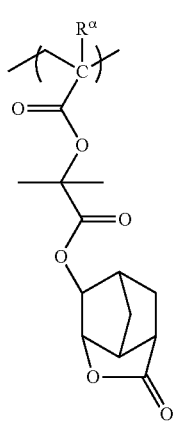
(a2-3-3)
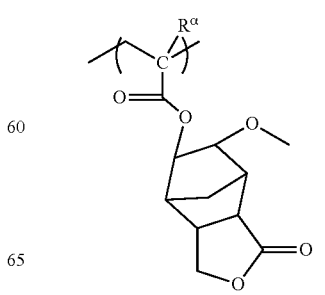

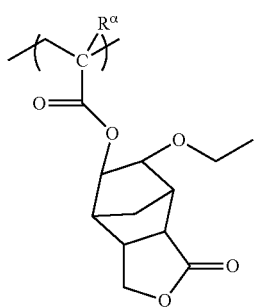
(a2-3-4)
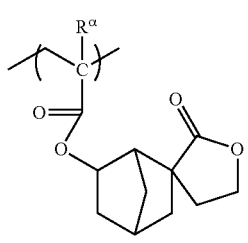
(a2-3-5)
[Chemical Formula 5]
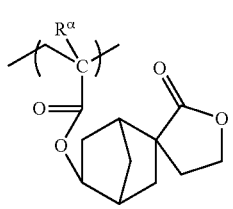
(a2-4-1)
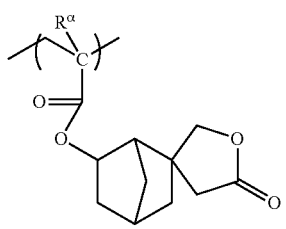
(a2-4-2)
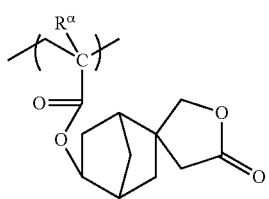
(a2-4-3)
(a2-4-4)
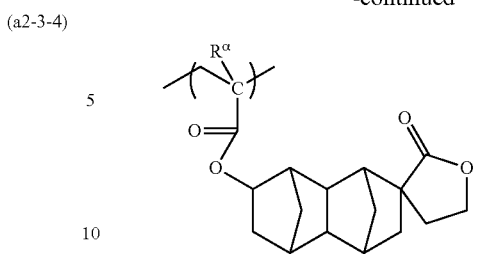
(a2-4-5)
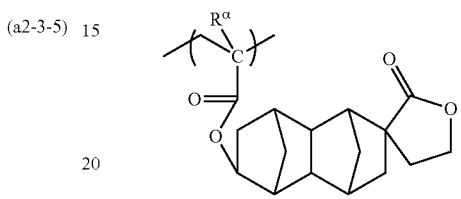
(a2-4-6)
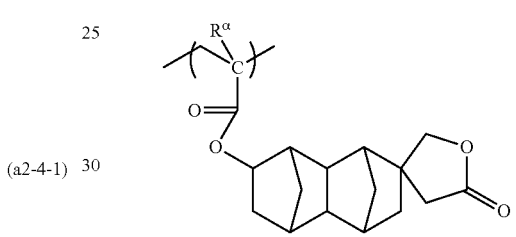
(a2-4-7)
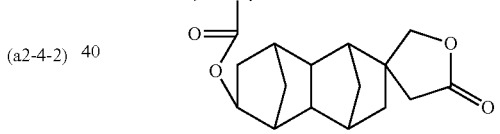
(a2-4-8)
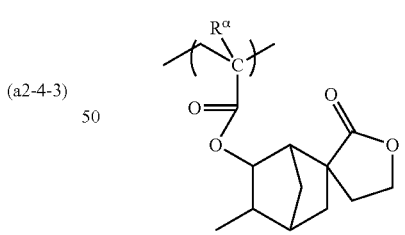
(a2-4-9)
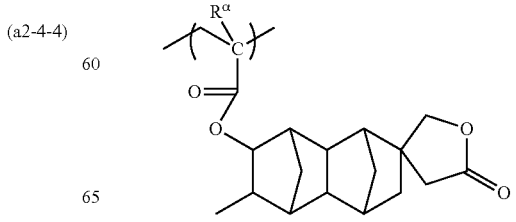
(a2-4-10)

(a2-4-11)
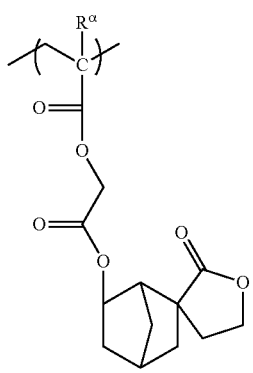
(a2-4-12)
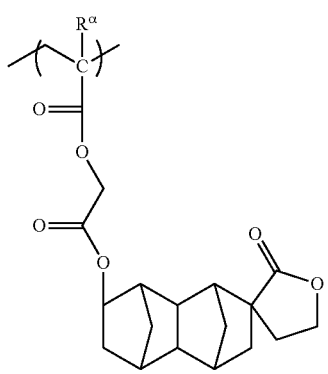
[Chemical Formula 6]
(a2-5-1)
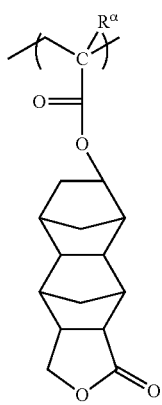
(a2-5-2)
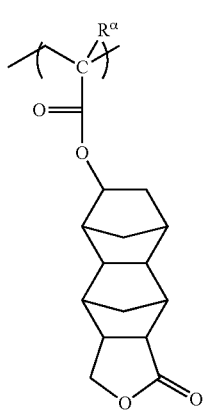
(a2-5-3)
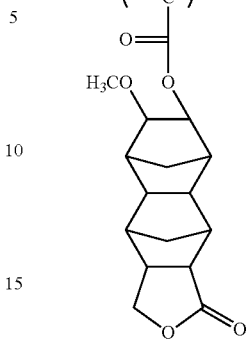
(a2-5-4)
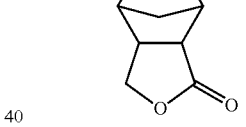
(a2-5-5)
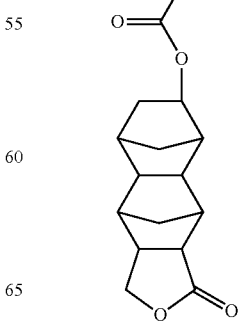

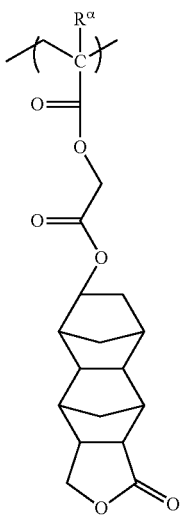

(a2-5-6)

As the structural unit (a2) within the component (A1), one type of structural unit may be used alone, or two or more types may be used in combination.

The structural unit (a2) is preferably at least one structural unit selected from the group consisting of structural units represented by general formulas (a2-1) to (a2-5), and is more preferably at least one structural unit selected from the group consisting of structural units represented by general formulas (a2-1) to (a2-3). Of these, it is particularly preferable to use at least one structural unit selected from the group consisting of the structural units represented by chemical formulas (a2-1-1), (a2-1-2), (a2-2-1), (a2-2-7), (a2-3-1) and (a2-3-5).

The amount of the structural unit (a2) within the component (A1), based on the combined total of all the structural units that constitute the component (A1), is preferably within a range from 1 to 60 mol %, more preferably from 5 to 55 mol %, and most preferably from 10 to 50 mol %.

By ensuring that the amount of the structural unit (a2) is at least as large as the lower limit of the above range, the effects generated by including the structural unit (a2) (such as improved adhesion of the resist film to the substrate, and better affinity with developing solutions containing water) are obtained satisfactorily, whereas by ensuring that the amount is not more than the upper limit of the above range, a good balance can be achieved with the other structural units.

[Structural Unit (a1)]

The structural unit (a1) is a structural unit which is derived from an acrylate ester in which the hydrogen atom bonded to the carbon atom on the α-position may be substituted with a substituent, and contains an acid-degradable group that exhibits increased polarity under the action of acid.

The term "acid-degradable group" describes a group having acid degradability which, under the action of the acid generated from the component (B) upon exposure, undergoes cleavage of at least some of the bonds within the structure of the acid-degradable group.

Examples of the acid-degradable group that exhibits increased polarity under the action of acid include, for example, groups which dissociate under the action of acid to form a polar group.

Examples of this polar group include a carboxyl group, hydroxyl group, amino group and sulfo group (—SO$_3$H). Among these groups, polar groups that contain an —OH within the structure (hereinafter referred to as "OH-containing polar groups") are preferred, a carboxyl group or a hydroxyl group is more preferred, and a carboxyl group is particularly desirable.

More specific examples of the acid-degradable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of the acid generated from the component (B) upon exposure, undergoes cleavage of at least the bond between the acid-dissociable group and the atom adjacent to the acid-dissociable group. An acid-dissociable group that constitutes an acid-degradable group must be a group of lower polarity than the polar group generated by dissociation of the acid-dissociable group, so that when the acid-dissociable group dissociates under the action of acid, a polar group having a higher polarity than the acid-dissociable group is generated, resulting in an increase in the polarity. This results in an increase in the polarity of the overall component (A1). In the present invention, increasing the polarity causes a relative increase in the solubility within alkali developing solutions, and a relative decrease in the solubility within organic developing solutions.

There are no particular limitations on the acid-dissociable group, and any of the groups that have been proposed as acid-dissociable groups for the base resins of chemically amplified resists can be used. Generally, groups that form either a cyclic or chain-like tertiary alkyl ester with the carboxyl group of the (meth)acrylic acid, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and aliphatic cyclic group-containing acid-dissociable groups.

Here, the term "aliphatic branched" refers to a branched structure having no aromaticity. The structure of the "aliphatic branched acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but in most cases, is preferably saturated.

Examples of the aliphatic branched, acid-dissociable group include groups represented by the formula —C(R$^{71}$)(R$^{72}$)(R$^{73}$). In this formula, each of R$^{71}$ to R$^{73}$ independently represents a linear alkyl group of 1 to 5 carbon atoms. The group represented by the formula —C(R$^{71}$)(R$^{72}$)(R$^{73}$) preferably has 4 to 8 carbon atoms, and specific examples include a tert-butyl group, 2-methyl-2-butyl group, 2-methyl-2-pentyl group and 3-methyl-3-pentyl group.

Among these, a tert-butyl group is particularly desirable.

The term "aliphatic cyclic group" refers to a monocyclic group or polycyclic group that has no aromaticity.

The aliphatic cyclic group within the "aliphatic cyclic group-containing acid-dissociable group" may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring structure of the "aliphatic cyclic group" excluding substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either monocyclic or polycyclic.

Examples of the aliphatic cyclic group include groups in which one or more hydrogen atoms have been removed from a monocycloalkane which may or may not be substituted with an alkyl group of 1 to 5 carbon atoms, a fluorine atom or a fluorinated alkyl group, and groups in which one or more hydrogen atoms have been removed from a polycycloalkane such as a bicycloalkane, tricycloalkane or tetracycloalkane. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, a portion of the carbon atoms that constitute the ring structure of any of these alicyclic hydrocarbon groups may be substituted with an ether linkage (—O—).

Examples of acid-dissociable groups containing an aliphatic cyclic group include:

(i) a group which forms a tertiary carbon atom on the ring structure of a monovalent aliphatic cyclic group in which a substituent (a group or an atom other than hydrogen) is bonded to the carbon atom to which an atom adjacent to the acid dissociable, dissolution inhibiting group (e.g., "—O—" within "—C(=O)—O— group") is bonded, and (ii) a group which has a monovalent aliphatic cyclic group, and a branched alkylene group containing a tertiary carbon atom that is bonded to the monovalent aliphatic cyclic group.

In the group (i), as the substituent bonded to the carbon atom to which an atom adjacent to the acid dissociable, dissolution inhibiting group is bonded on the ring skeleton of the aliphatic cyclic group, an alkyl group can be mentioned. Examples of these alkyl groups include the same groups as those described below for $R^{14}$ in formulas (1-1) to (1-9) shown below.

Specific examples of groups of type (i) include groups represented by general formulas (1-1) to (1-9) shown below.

Specific examples of groups of type (ii) include groups represented by general formulas (2-1) to (2-6) shown below.

[Chemical Formula 7]

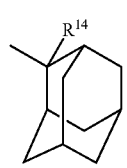

(1-1)

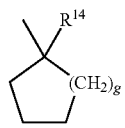

(1-2)

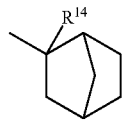

(1-3)

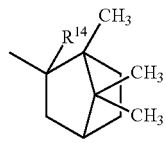

(1-4)

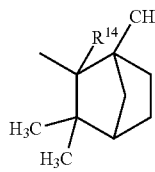

(1-5)

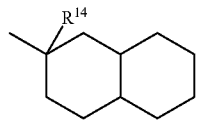

(1-6)

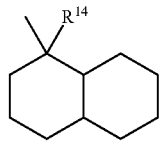

(1-7)

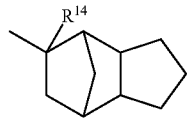

(1-8)

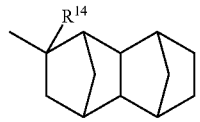

(1-9)

In the formulas above, $R^{14}$ represents an alkyl group, and g represents an integer of 0 to 8.

[Chemical Formula 8]

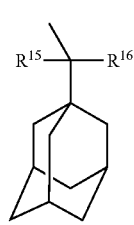

(2-1)

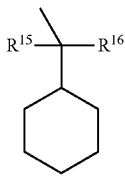

(2-2)

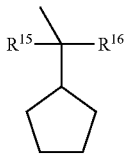

(2-3)

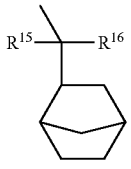

(2-4)

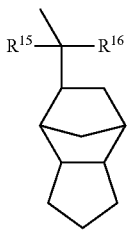

(2-5)

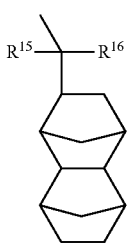

(2-6)

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and (2-1) to (2-6), some of the carbon atoms that constitute the ring may be replaced with an ethereal oxygen atom (—O—).

Further, in formulas (1-1) to (1-9) and (2-1) to (2-6), one or more of the hydrogen atoms bonded to the carbon atoms that constitute the ring may be substituted with a substituent. Examples of the substituent include an alkyl group of 1 to 5 carbon atoms, a fluorine atom, or a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group.

Examples of acetal-type acid-dissociable groups include groups (acid-dissociable groups (p1)) represented by general formula (p1) shown below.

[Chemical Formula 9]

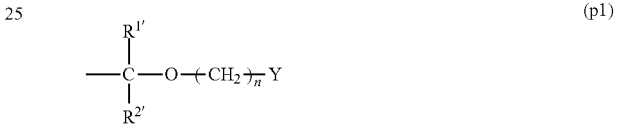

(p1)

In the formula, each of $R^{1'}$ and $R^{2'}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1'}$ and $R^{2'}$ include the same alkyl groups as those described above, within the description relating to the α-substituted acrylate ester, for the substituent which may be bonded to the carbon atom on the α-position. Among these, a methyl group or ethyl group is preferable, and a methyl group is the most desirable.

In the present invention, it is preferable that at least one of $R^{1'}$ and $R^{2'}$ is a hydrogen atom. That is, it is preferable that the acid-dissociable group (p1) is a group represented by general formula (p1-1) shown below.

[Chemical Formula 10]

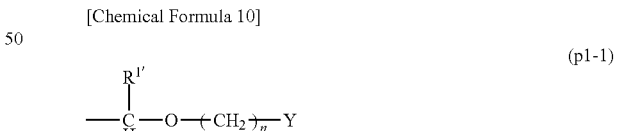

(p1-1)

In the formula, $R^{1'}$, n and Y are the same as defined above.

Examples of the alkyl group for Y include the same alkyl groups as those described above, within the description relating to the α-substituted acrylate ester, for the substituent which may be bonded to the carbon atom on the α-position.

As the aliphatic cyclic group for Y, any of the monocyclic or polycyclic aliphatic cyclic groups which have been proposed for conventional ArF resists and the like can be appropriately selected for use. For example, the same groups as those described above for the aliphatic cyclic group of the "aliphatic cyclic group-containing acid-dissociable group" can be used.

Further, as the acetal-type acid-dissociable group, groups represented by general formula (p2) shown below can also be used.

[Chemical Formula 11]

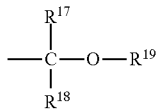
(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of the structural unit (a1) include structural units represented by general formula (a1-0-1) shown below and structural units represented by general formula (a1-0-2) shown below.

[Chemical Formula 12]

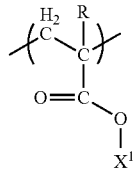
(a1-0-1)

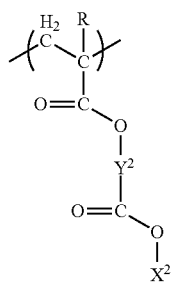
(a1-0-2)

In the formula, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In general formula (a1-0-1), examples of the alkyl group and the halogenated alkyl group for R include the same alkyl groups and halogenated alkyl groups as those described above, within the description relating to the α-substituted acrylate ester, for the substituent which may be bonded to the carbon atom on the α-position. R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, tertiary alkyl ester-type acid-dissociable groups are preferable.

In general formula (a1-0-2), R is the same as defined above.

$X^2$ is the same as defined for $X^1$ in general formula (a1-0-1).

Examples of the divalent linking group for $Y^2$ include the same divalent linking groups as those described above for $R^{29}$ in general formulas (a2-1) to (a2-5)

Among these groups, the divalent linking group for $Y^2$ is preferably a linear or branched alkylene group, a divalent alicyclic hydrocarbon group, or a divalent linking group containing a hetero atom. Of these, a linear or branched alkylene group or a divalent linking group containing a hetero atom is particularly desirable.

Specific examples of the structural units represented by the above general formula (a1-0-1) and the above general formula (a1-0-2) include structural units represented by general formulas (a1-1) to (a1-4) shown below.

[Chemical Formula 13]

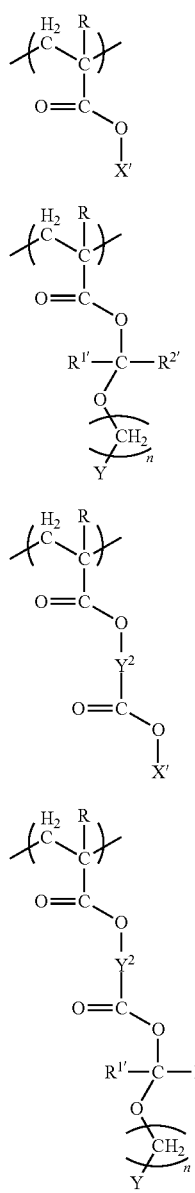

In the formulas, R, $R^{1'}$, $R^{2'}$, n, Y and $Y^2$ are the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y are respectively the same as defined above for $R^{1'}$, $R^{2'}$, n and Y in general formula (p1) described above in connection with the "acetal-type acid-dissociable group".

Examples of $Y^2$ include the same groups as those described above for $Y^2$ in general formula (a1-0-2).

Specific examples of the structural units represented by general formulas (a1-1) to (a1-4) are shown below.

In the formulas shown below, $R^\alpha$ represents a hydrogen atom, a methyl group or a trifluoromethyl group.

[Chemical Formula 14]

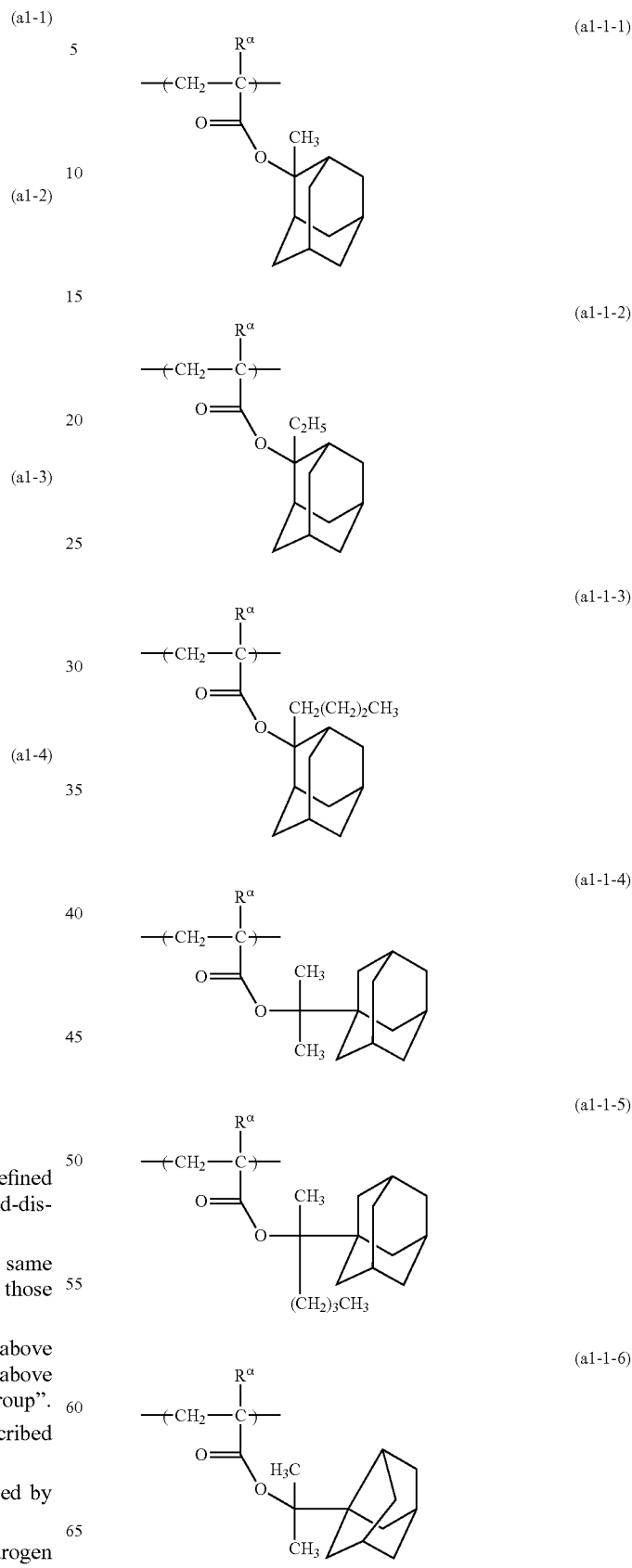

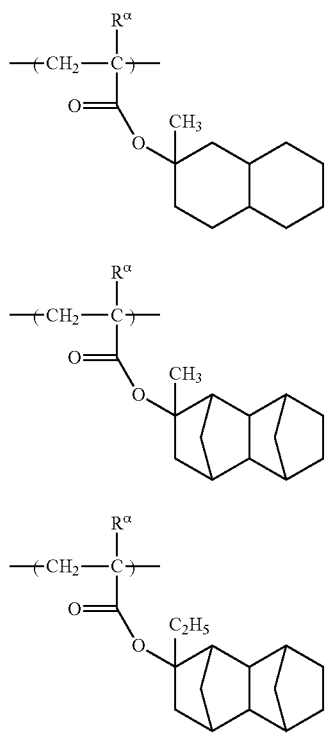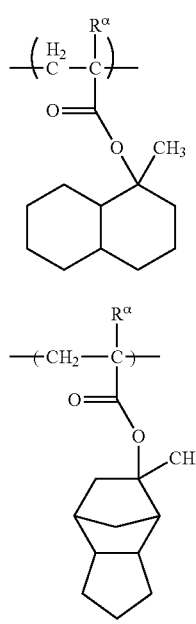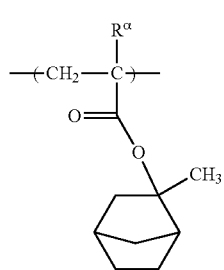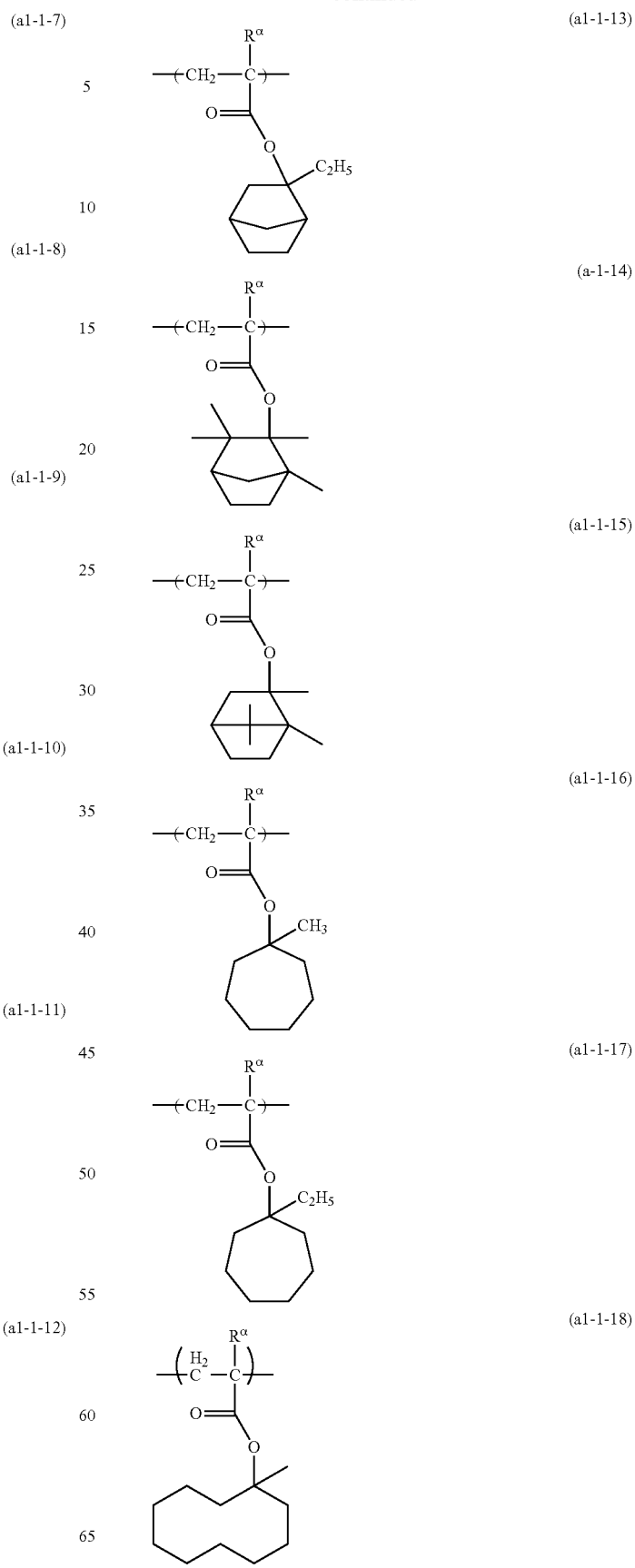

(a1-1-19) 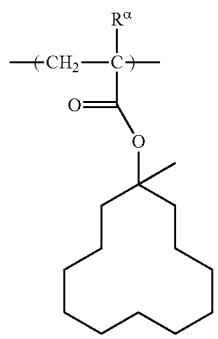
(a1-1-20) 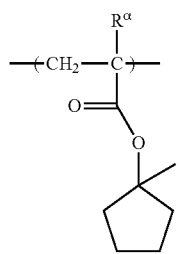
(a1-1-21) 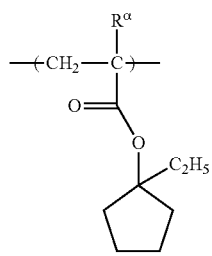
[Chemical Formula 16]
(a1-1-22) 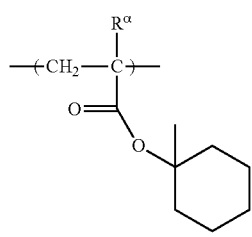
(a1-1-23) 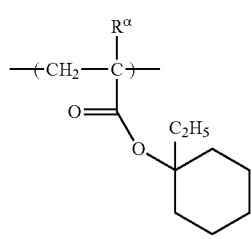
(a1-1-24) 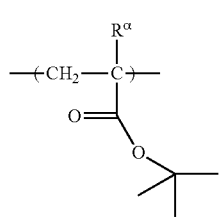
(a1-1-25) 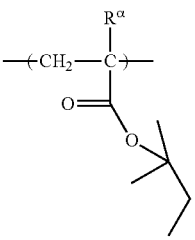
(a1-1-26) 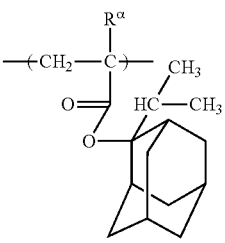
(a1-1-27) 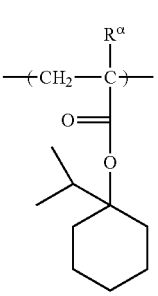
(a1-1-28) 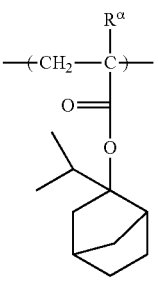
(a1-1-29) 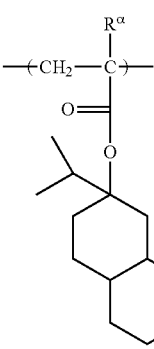

-continued
(a1-1-30)
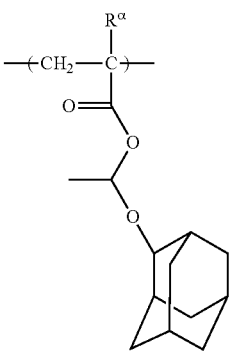
(a1-1-31)
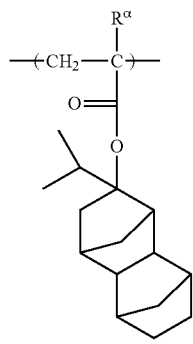
[Chemical Formula 17]
(a1-2-1)
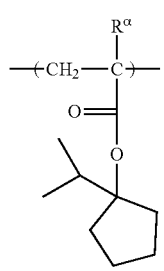
(a1-2-2)
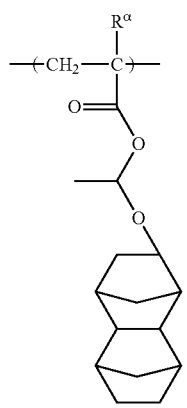
(a1-2-3)
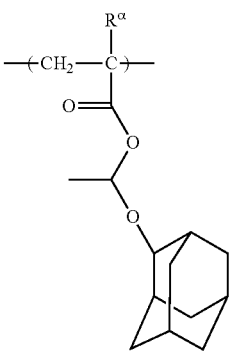
(a1-2-4)
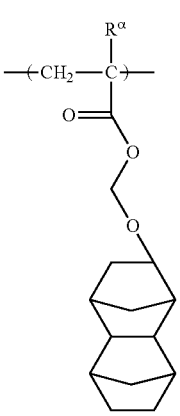
(a1-2-5)
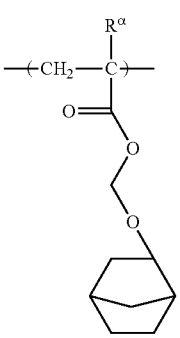
(a1-2-6)
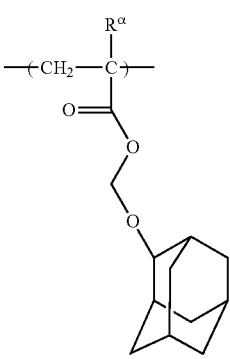

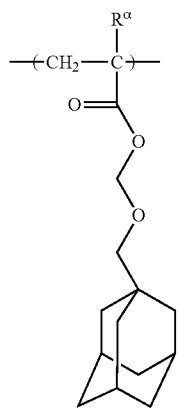 (a1-2-7)
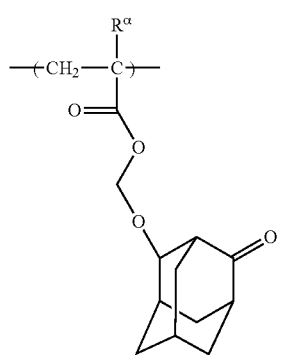 (a1-2-8)
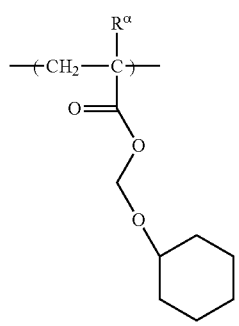 (a1-2-9)
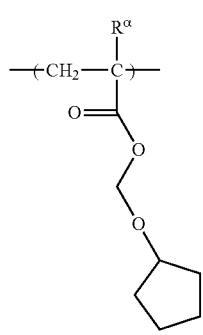 (a1-2-10)
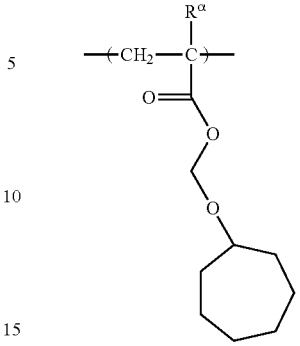 (a1-2-11)
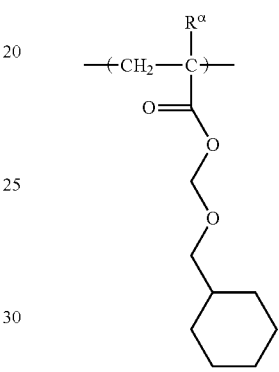 (a1-2-12)
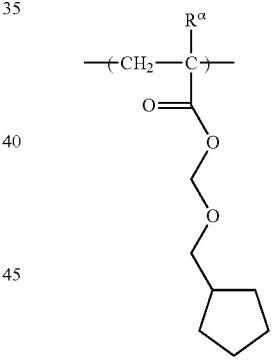 (a1-2-13)
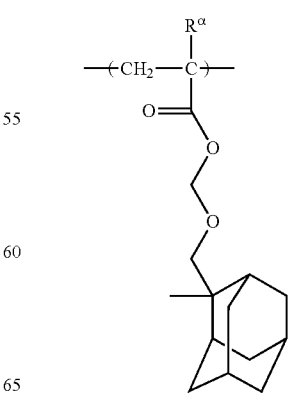 (a1-2-14)

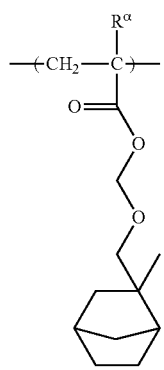
(a1-2-15)
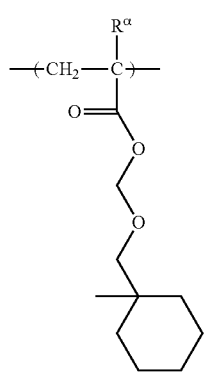
(a1-2-16)
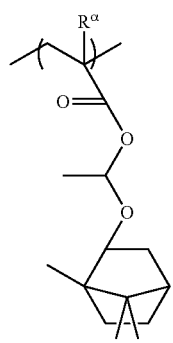
(a1-2-17)
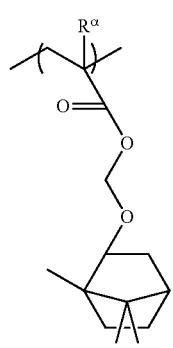
(a1-2-18)
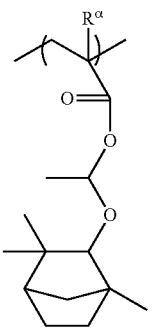
(a1-2-19)
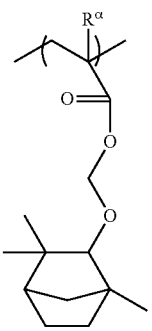
(a1-2-20)
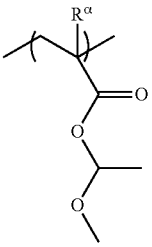
(a1-2-21)
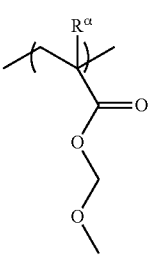
(a1-2-22)
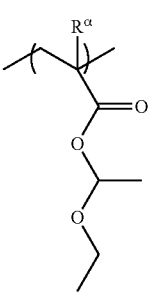
(a1-2-23)

(a1-2-24)
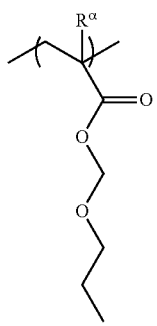
[Chemical Formula 18]
(a1-3-1)
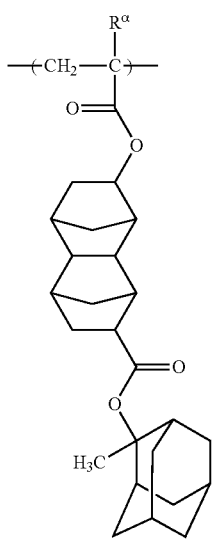
(a1-3-2)
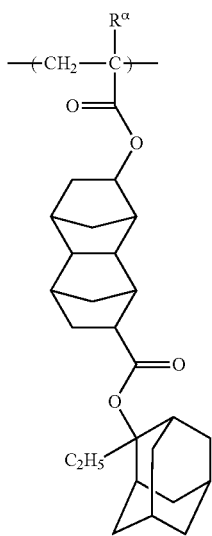
(a1-3-3)
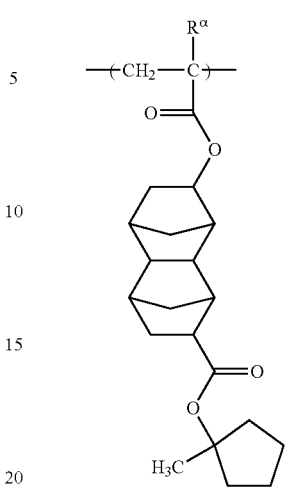
(a1-3-4)
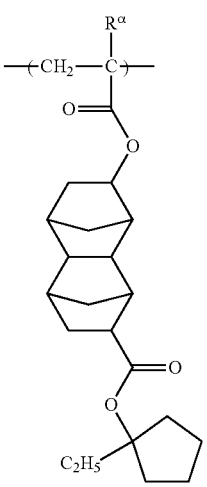
(a1-3-5)
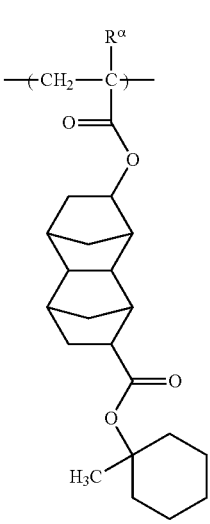

(a1-3-6)
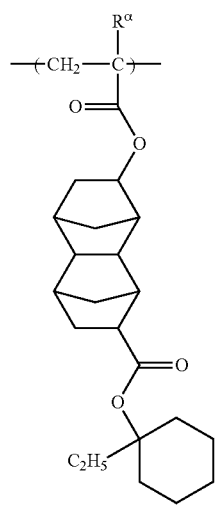
(a1-3-7)
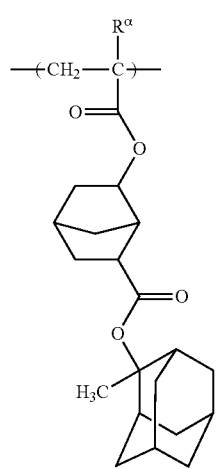
(a1-3-8)
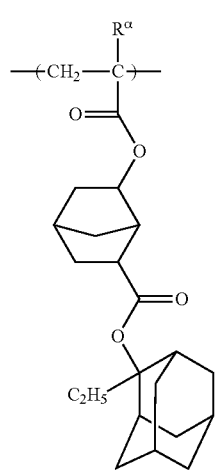
(a1-3-9)
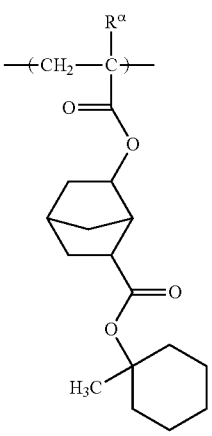
(a1-3-10)
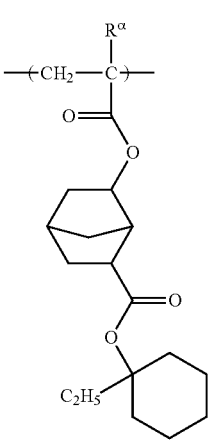
(a1-3-11)
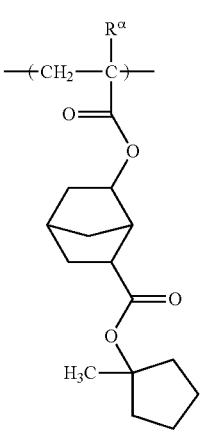

(a1-3-12) 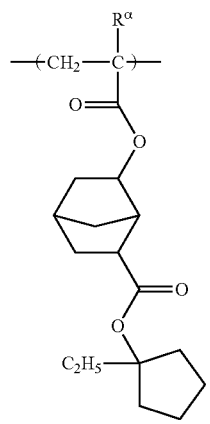
(a1-3-13) 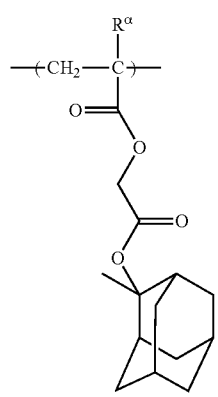
(a1-3-14) 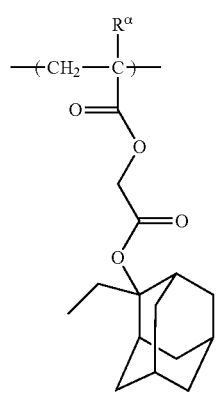
(a1-3-15) 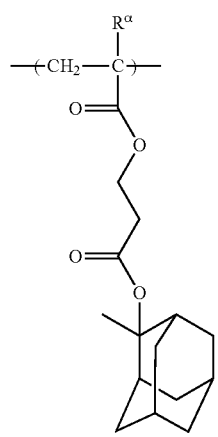
(a1-3-16) 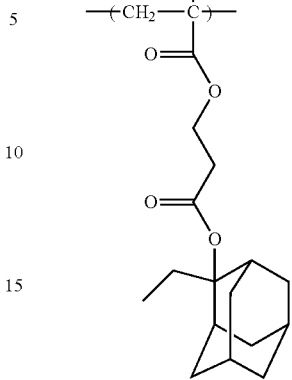
(a1-3-17) 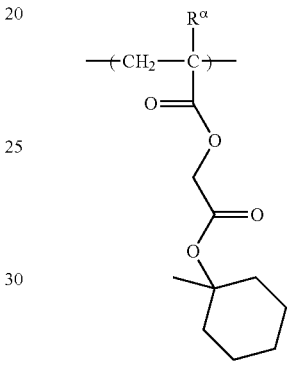
(a1-3-18) 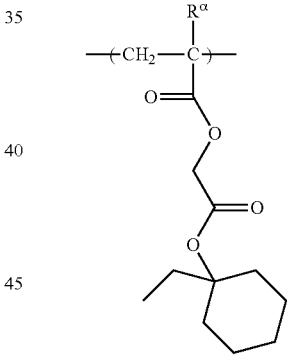
[Chemical Formula 19]
(a1-3-19) 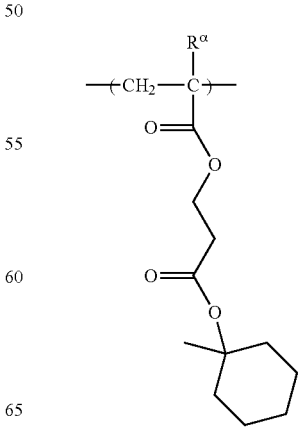

(a1-3-20)
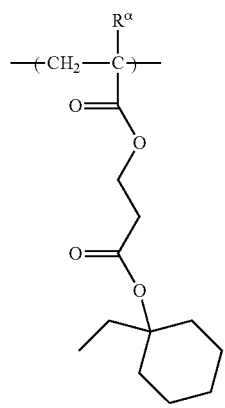
(a1-3-21)
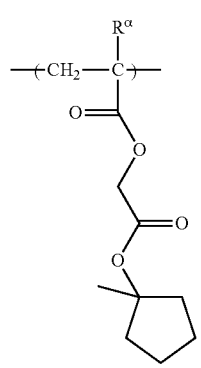
(a1-3-22)
(a1-3-23)
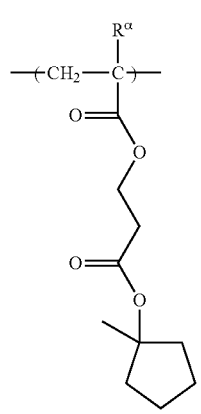
(a1-3-24)
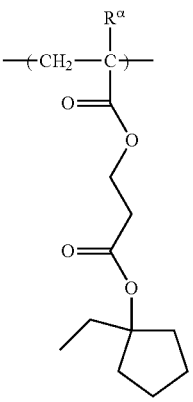
[Chemical Formula 20]
(a1-3-25)
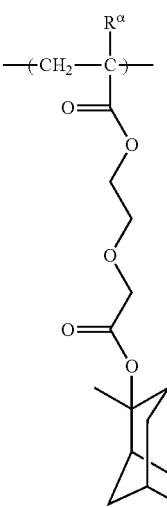
(a1-3-26)
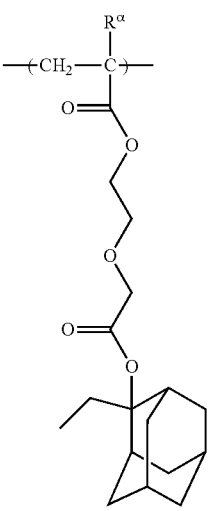

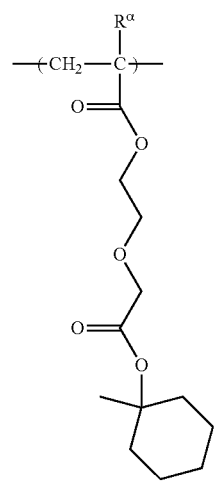
(a1-3-27)
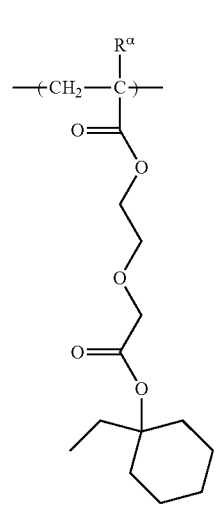
(a1-3-28)
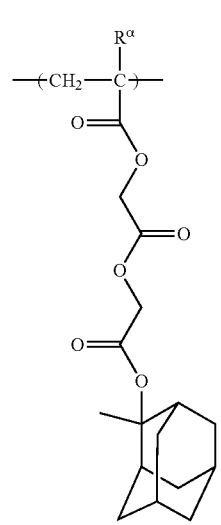
(a1-3-29)
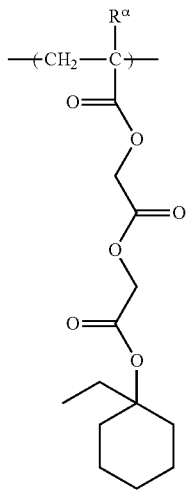
(a1-3-30)
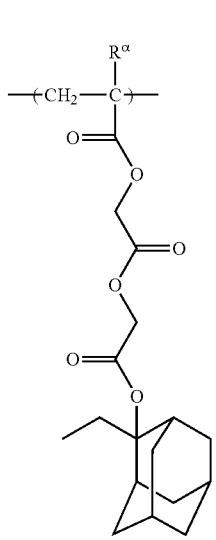
(a1-3-31)
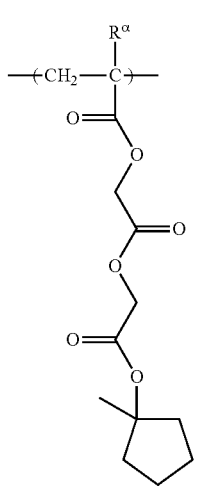
(a1-3-32)

[Chemical Formula 21]
(a1-4-1)
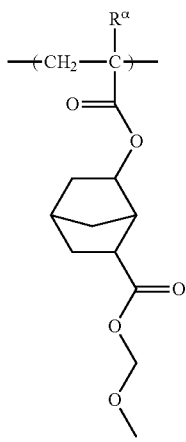
(a1-4-2)
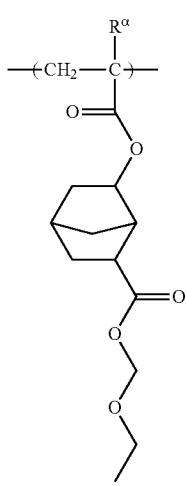
(a1-4-3)
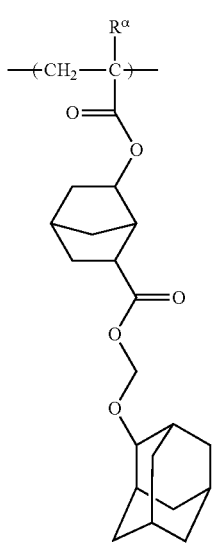
(A1-4-4)
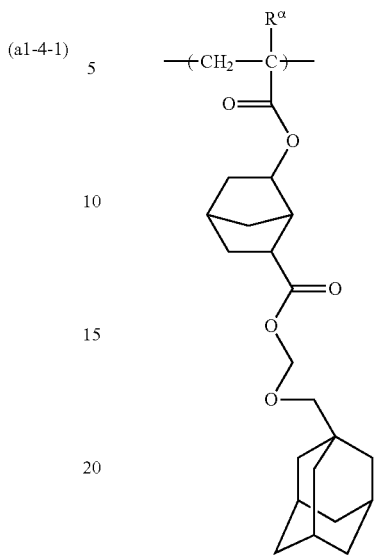
(a1-4-5)
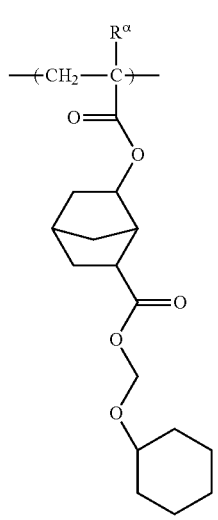
(a1-4-6)
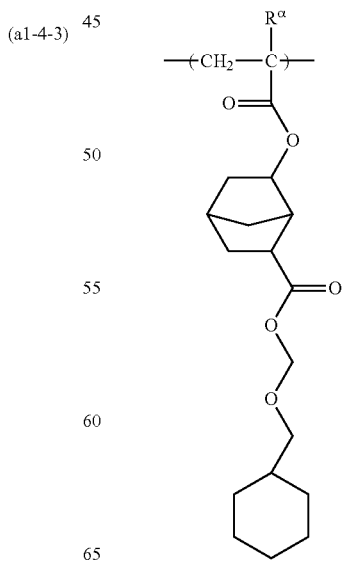

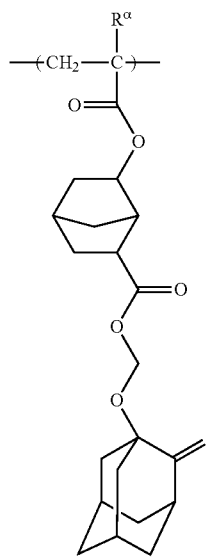 (a1-4-7)
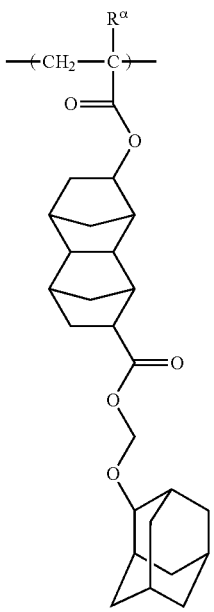 (a1-4-9)
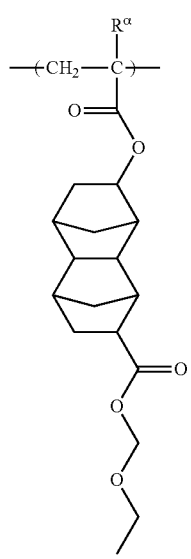 (a1-4-8)
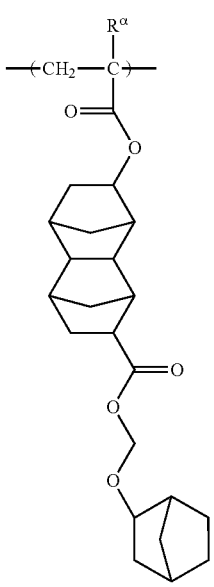 (a1-4-10)

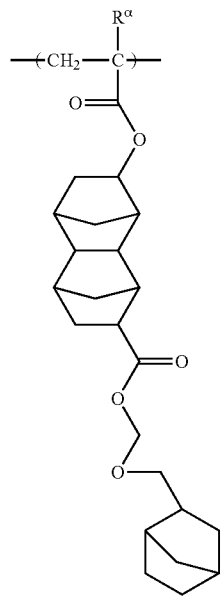
(a1-4-11)
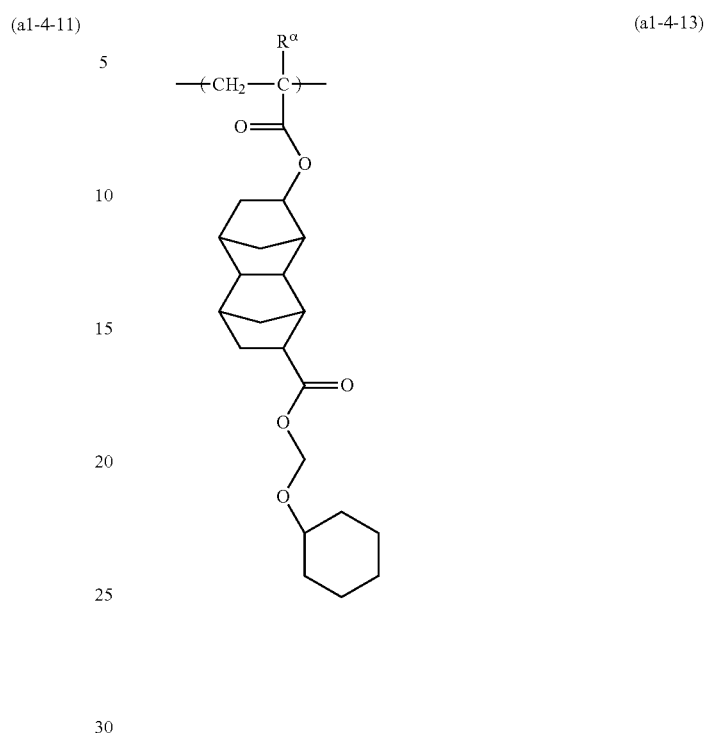
(a1-4-13)
(A1-4-12)
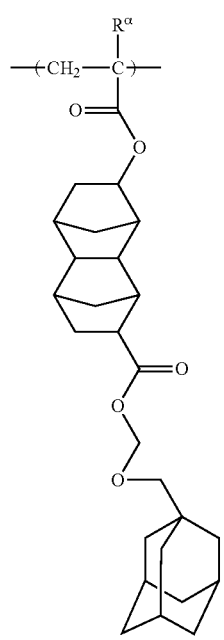
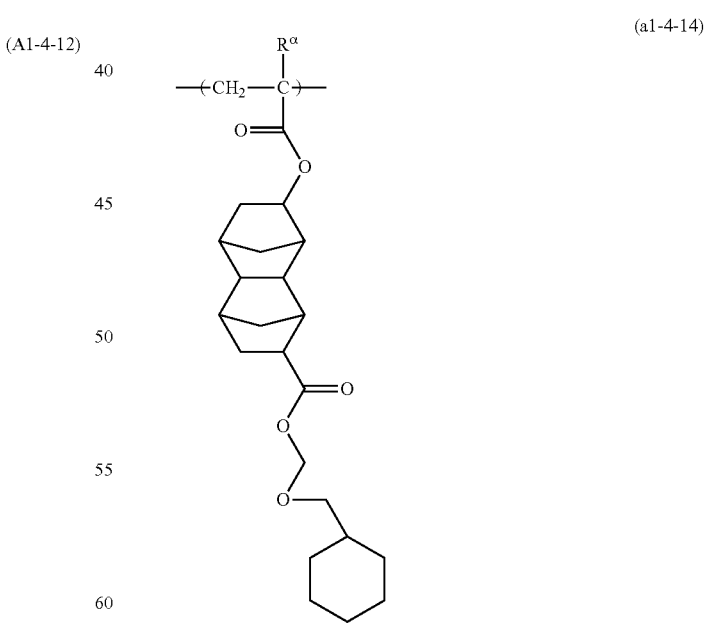
(a1-4-14)

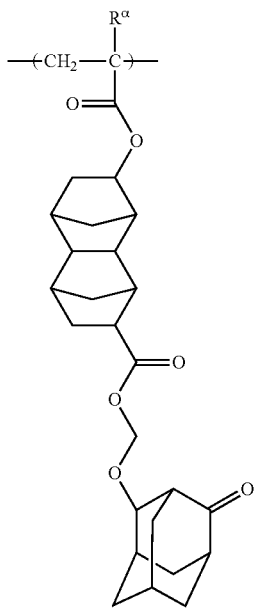

(a1-4-15)

Among the above units, structural units represented by general formula (a1-1), (a1-2) or (a1-3) are preferable, and more specifically, the use of at least one structural unit selected from the group consisting of structural units represented by formulas (a1-1-1) to (a1-1-4), formulas (a1-1-20) to (a1-1-23), formulas (a1-2-1) to (a1-2-24), and formulas (a1-3-25) to (a1-3-28) is more preferable.

Moreover, as the structural unit (a1), structural units represented by general formula (a1-1-01) shown below, which includes the structural units represented by formulas (a1-1-1) to (a1-1-3) and formula (a1-1-26), structural units represented by general formula (a1-1-02) shown below, which includes the structural units represented by formulas (a1-1-16) and (a1-1-17) and formulas (a1-1-20) to (a1-1-23), structural units represented by general formula (a1-3-01) shown below, which includes the structural units represented by formulas (a1-3-25) and (a1-3-26), and structural units represented by general formula (a1-3-02) shown below, which includes the structural units represented by formulas (a1-3-27) and (a1-3-28) are preferred.

[Chemical Formula 22]

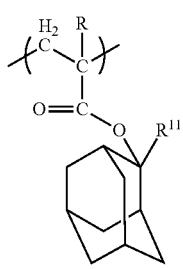

(a1-1-01)

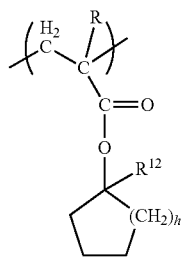

(a1-1-02)

In the formulas, each R independently represents a hydrogen atom, an alkyl group of 1 to 5 carbon atoms or a halogenated alkyl group of 1 to 5 carbon atoms, $R^{11}$ represents an alkyl group of 1 to 5 carbon atoms, $R^{12}$ represents an alkyl group of 1 to 7 carbon atoms, and h represents an integer of 1 to 6.

In general formula (a1-1-01), R is the same as defined above. The alkyl group of 1 to 5 carbon atoms for $R^{11}$ is the same as defined above for the alkyl group of 1 to 5 carbon atoms for R, and is preferably a methyl group, ethyl group or isopropyl group.

In general formula (a1-1-02), R is the same as defined above. The alkyl group of 1 to 5 carbon atoms for $R^{12}$ is the same as defined above for the alkyl group of 1 to 5 carbon atoms for R, and is preferably a methyl group, ethyl group or isopropyl group. h is preferably 1 or 2, and is most preferably 2.

[Chemical Formula 23]

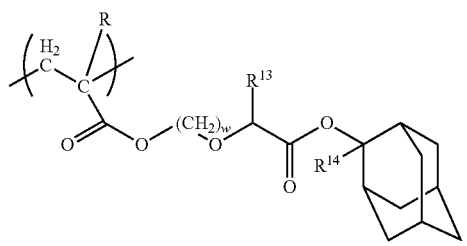

(a1-3-01)

In the formula, R represents a hydrogen atom, an alkyl group of 1 to 5 carbon atoms or a halogenated alkyl group of 1 to 5 carbon atoms, $R^{14}$ represents an alkyl group, le represents a hydrogen atom or a methyl group, and w represents an integer of 1 to 10.

[Chemical Formula 24]

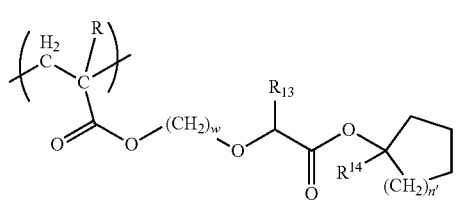

(a1-3-02)

In the formula, R represents a hydrogen atom, an alkyl group of 1 to 5 carbon atoms or a halogenated alkyl group of 1 to 5 carbon atoms, $R^{14}$ represents an alkyl group, $R^{13}$ represents a hydrogen atom or a methyl group, w represents an integer of 1 to 10, and n' represents an integer of 1 to 6.

In general formulas (a1-3-01) and (a1-3-02), R is the same as defined above.

$R^{13}$ is preferably a hydrogen atom.

The alkyl group for $R^{14}$ is the same as defined above for $R^{14}$ in general formulas (1-1) to (1-9), and is preferably a methyl group or an ethyl group.

n' is preferably 1 or 2, and is most preferably 2.

w is preferably an integer of 1 to 8, more preferably an integer of 2 to 5, and most preferably 2.

Further, as the structural unit (a1), structural units represented by general formula (a1-5) shown below are also preferred. By including this type of structural unit, the solubility of the component (A1) in the organic solvent (S) containing an alcohol-based solvent can be improved.

[Chemical Formula 25]

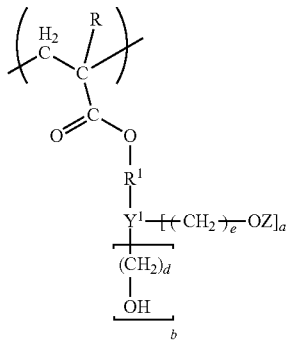

(a1-5)

In the above formula, R represents a hydrogen atom, an alkyl group of 1 to 5 carbon atoms or a halogenated alkyl group of 1 to 5 carbon atoms, OZ represents an acid-degradable group, $Y^1$ represents an aliphatic hydrocarbon group which may have a substituent, $R^1$ represents a single bond or a divalent linking group, a represents an integer of 1 to 3 and b represents an integer of 0 to 2, provided that a+b=1 to 3, and each of d and e independently represents an integer of 0 to 3.

In formula (a1-5), examples of the alkyl group and the halogenated alkyl group for R include the same alkyl groups and halogenated alkyl groups as those described above, within the description relating to the α-substituted acrylate ester, for the substituent which may be bonded to the carbon atom on the α-position.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a1-5), examples of the acid-degradable group for OZ include groups in which the hydrogen atom of an alcoholic hydroxyl group has been substituted with an acid-dissociable group.

The "acid-dissociable group" is a group having acid dissociability which, under the action of acid generated from the component (B) upon exposure, undergoes cleavage of at least the bond between the acid-dissociable group and the atom adjacent to the acid-dissociable group. In the present invention, the acid-dissociable group must be a group that exhibits a lower hydrophilicity than the alcoholic hydroxyl group generated upon dissociation of the acid-dissociable group, as this ensures that when the acid-dissociable group dissociates from the group in which the hydrogen atom of an alcoholic hydroxyl group has been substituted with the acid-dissociable group, an alcoholic hydroxyl group is generated, yielding an increase in hydrophilicity. As a result, the hydrophilicity of the entire component (A1) increases, causing a relative increase in the solubility within alkali developing solutions and a relative decrease in the solubility within organic developing solutions.

There are no particular limitations on the acid-dissociable group, and any of the groups that have been proposed as acid-dissociable groups for the base resins of chemically amplified resists can be used. Examples include the same acid-dissociable groups as those described above.

In terms of achieving superior solubility in the organic solvent (the resist solvent) when preparing a resist composition, and superior solubility in organic developing solutions, the acid-dissociable group is preferably a tertiary alkyl group-containing acid-dissociable group or an acetal-type acid-dissociable group.

(Tertiary Alkyl Group-Containing Acid-Dissociable Group)

The term "tertiary alkyl group" describes an alkyl group containing a tertiary carbon atom. As mentioned above, the term "alkyl group" describes monovalent saturated hydrocarbon groups, and includes chain-like (linear or branched) alkyl groups as well as alkyl groups having a cyclic structure.

The "tertiary alkyl group-containing acid-dissociable group" describes an acid-dissociable group containing a tertiary alkyl group within its structure. The tertiary alkyl group-containing acid-dissociable group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may constitute the tertiary alkyl group-containing acid-dissociable group together with the tertiary alkyl group include a carbonyloxy group, carbonyl group, alkylene group, or oxygen atom (—O—).

Examples of the tertiary alkyl group-containing acid-dissociable group include tertiary alkyl group-containing acid-dissociable groups which do not contain a cyclic structure, and tertiary alkyl group-containing acid-dissociable groups which contain a cyclic structure.

A "tertiary alkyl group-containing acid-dissociable group which does not contain a cyclic structure" is an acid-dissociable group that includes a branched-chain tertiary alkyl group as the tertiary alkyl group, and includes no cyclic structure within the group structure.

Examples of these branched-chain tertiary alkyl groups include the groups represented by general formula (I) shown below.

[Chemical Formula 26]

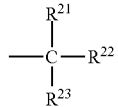

(I)

In formula (I), each of $R^{21}$ to $R^{23}$ independently represents a linear or branched alkyl group. These alkyl groups preferably contain 1 to 5 carbon atoms, and more preferably 1 to 3 carbon atoms.

Further, the total number of carbon atoms within the group represented by general formula (I) is preferably from 4 to 7 carbon atoms, more preferably from 4 to 6 carbon atoms, and most preferably 4 or 5 carbon atoms.

Specific examples of the group represented by general formula (I) include a tert-butyl group and tert-pentyl group, and a tert-butyl group is particularly desirable.

Examples of the tertiary alkyl group-containing acid-dissociable group which does not contain a cyclic structure include the branched-chain tertiary alkyl groups described above, tertiary alkyl group-containing chain-like alkyl groups in which an aforementioned branched-chain tertiary alkyl group is bonded to a linear or branched alkylene group, tertiary alkyloxycarbonyl groups containing an aforementioned branched-chain tertiary alkyl group as the tertiary alkyl group, and tertiary alkyloxycarbonylalkyl groups containing an aforementioned branched-chain tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by general formula (II) shown below.

In formula (II), $R^{21}$ to $R^{23}$ are the same as defined above for $R^{21}$ to $R^{23}$ in formula (I). As this chain-like tertiary alkyloxycarbonyl group, a tert-butyloxycarbonyl group (t-boc) or tert-pentyloxycarbonyl group is preferred.

[Chemical Formula 27]

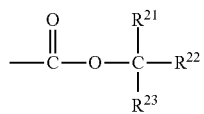
(II)

Examples of the chain-like tertiary alkyloxycarbonylalkyl groups include groups represented by general formula (III) shown below.

In formula (III), $R^{21}$ to $R^{23}$ are the same as defined above for $R^{21}$ to $R^{23}$ in formula (I). f represents an integer of 1 to 3, and is preferably 1 or 2.

As this chain-like tertiary alkyloxycarbonylalkyl group, a tert-butyloxycarbonylmethyl group or tert-butyloxycarbonylethyl group is preferred.

[Chemical Formula 28]

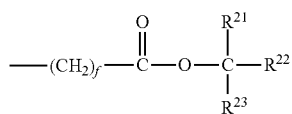
(III)

Of the above groups, from the viewpoint of the solubility contrast relative to an organic developing solution upon exposure, the tertiary alkyl group-containing acid-dissociable group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

A "tertiary alkyl group-containing acid-dissociable group which contains a cyclic structure" describes an acid-dissociable group that includes a tertiary carbon atom and a cyclic structure within the group structure.

In the tertiary alkyl group-containing acid-dissociable group which contains a cyclic structure, the cyclic structure preferably contains 4 to 12 carbon atoms, more preferably 5 to 10 carbon atoms, and most preferably 6 to 10 carbon atoms within the ring.

The cyclic structure is preferably an aliphatic cyclic group. An "aliphatic cyclic group" describes a monocyclic or polycyclic group that has no aromaticity.

The aliphatic cyclic group may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring structure of the aliphatic cyclic group excluding substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either monocyclic or polycyclic.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, a portion of the carbon atoms that constitute the ring structure of any of these alicyclic hydrocarbon groups may be substituted with an ether linkage (—O—).

Examples of the tertiary alkyl group within the tertiary alkyl group-containing acid-dissociable group which contains a cyclic structure include groups of type [1] or [2] listed below.

[1] A tertiary alkyl group which forms a tertiary carbon atom on the ring structure of a monovalent aliphatic cyclic group in which an alkyl group is bonded to the carbon atom to which an atom adjacent to the tertiary alkyl group is bonded

[2] A tertiary alkyl group having a monovalent aliphatic cyclic group, and an alkylene group having a tertiary carbon atom (namely, a branched-chain alkylene group), wherein the tertiary carbon atom is bonded to an atom adjacent to the tertiary alkyl group.

In these groups of type [1] and [2], examples of the monovalent aliphatic cyclic group include the same aliphatic cyclic groups as those described above in relation to the above-mentioned cyclic structure.

In a group of the above type [1], the alkyl group bonded to the aliphatic cyclic group may be a linear, branched or cyclic group, but is preferably a linear or branched group.

The linear alkyl group preferably contains 1 to 5 carbon atoms, more preferably 1 to 4 carbon atoms, and most preferably 1 or 2 carbon atoms. Specific examples include a methyl group, ethyl group, n-propyl group, n-butyl group or n-pentyl group. Among these groups, a methyl group, ethyl group or n-butyl group is preferred, and a methyl group or ethyl group is particularly desirable.

The branched alkyl group preferably contains 3 to 10 carbon atoms, and more preferably 3 to 5 carbon atoms. Specific examples include an isopropyl group, isobutyl group, tert-butyl group, isopentyl group or neopentyl group, and an isopropyl group is particularly desirable.

Specific examples of groups of type [1] include groups represented by the above-mentioned general formulas (1-1) to (1-9).

Specific examples of groups of type [2] include groups represented by the above-mentioned general formulas (2-1) to (2-6).

Examples of the tertiary alkyl group-containing acid-dissociable group which contains a cyclic structure include tertiary alkyl groups having a cyclic structure, tertiary alkyloxycarbonyl groups having a tertiary alkyl group with a cyclic structure as the tertiary alkyl group, and tertiary alkyloxycarbonylalkyl groups having a tertiary alkyl group with a cyclic structure as the tertiary alkyl group.

Examples of the above tertiary alkyl groups having a cyclic structure include the groups of type [1] and [2] described above.

Specific examples of the tertiary alkyloxycarbonyl groups include groups in which the $-C(R^{21})(R^{22})(R^{23})$ moiety in the above general formula (II) is substituted with a tertiary alkyl group having a cyclic structure.

Specific examples of the tertiary alkyloxycarbonylalkyl groups include groups in which the $-C(R^{21})(R^{22})(R^{23})$ moiety in the above general formula (III) is substituted with a tertiary alkyl group having a cyclic structure.

Among the various possibilities described above, the tertiary alkyl group-containing acid-dissociable group is preferably a group represented by the above general formula (II), and is most preferably a tert-butyloxycarbonyl group (t-boc).

(Acetal-Type Acid-Dissociable Group)

In an acetal-type acid-dissociable group, when acid is generated upon exposure, the action of that acid causes a cleavage of the bond between the acetal-type acid-dissociable group, and the oxygen atom to which the acetal-type acid-dissociable group is bonded.

Examples of the acetal-type acid-dissociable group include the same groups as those mentioned in the above description of the "acetal-type acid-dissociable group".

In the structural unit represented by formula (a1-5), specific examples of preferred acetal-type acid-dissociable groups include a methoxymethoxy group, ethoxymethoxy group, n-butoxymethoxy group, cyclohexyloxymethoxy group, adamantyloxymethoxy group, 1-ethoxyethoxy group, 1-n-butoxyethoxy group, 1-cyclohexyloxyethoxy group and 1-adamantyloxyethoxy group.

In the above formula (a1-5), $Y^1$ represents an aliphatic hydrocarbon group which may have a substituent.

An "aliphatic hydrocarbon group" describes a hydrocarbon group having no aromaticity.

The aliphatic hydrocarbon group for $Y^1$ may be a saturated aliphatic hydrocarbon group or an unsaturated aliphatic hydrocarbon group. Further, the aliphatic hydrocarbon group may be a linear, branched or cyclic group.

The expression that the aliphatic hydrocarbon group "may have a substituent" means that some of the carbon atoms that constitute the aliphatic hydrocarbon group may be substituted with a substituent containing a hetero atom, or that some or all of the hydrogen atoms that constitute the aliphatic hydrocarbon group may each be substituted with a substituent containing a hetero atom.

There are no particular limitations on the "hetero atom" within $Y^1$, provided it is an atom other than a carbon atom or a hydrogen atom, and examples include a halogen atom, oxygen atom, sulfur atom and nitrogen atom.

Examples of the halogen atom include a fluorine atom, chlorine atom, iodine atom and bromine atom.

The substituent containing a hetero atom may consist solely of the hetero atom, or may be a group that contains the hetero atom and a group or atom other than the hetero atom. Specific examples of the substituent containing a hetero atom include $-O-$, $-C(=O)-O-$, $-C(=O)-$, $-O-C(=O)-O-$, $-C(=O)-NH-$, $-NH-$ (wherein H may be substituted with a substituent such as an alkyl group or an acyl group), $-S-$, $-S(=O)_2-$ and $-S(=O)_2-O-$. When the aliphatic hydrocarbon group is a cyclic group, any of these substituents may be included within the ring structure of the aliphatic hydrocarbon group.

Examples of the substituent for substituting some or all of the hydrogen atoms that constitute the aliphatic hydrocarbon group include an alkoxy group, halogen atom, halogenated alkyl group, hydroxyl group, oxygen atom (=O), cyano group and alkyl group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have each been substituted with an aforementioned halogen atom.

Examples of the alkyl group include alkyl groups of 1 to 5 carbon atoms (namely, lower alkyl groups) such as a methyl group, ethyl group, propyl group, n-butyl group or tert-butyl group.

When $Y^1$ is a linear or branched aliphatic hydrocarbon group, the group preferably contains 1 to 10 carbon atoms, more preferably 1 to 5 carbon atoms, and most preferably 1 to 3 carbon atoms. Specifically, a chain-like alkylene group is ideal.

When $Y^1$ is a cyclic aliphatic hydrocarbon group (aliphatic cyclic group), the basic ring structure of the aliphatic cyclic group excluding substituents (the aliphatic ring) is not limited to structures constituted of only carbon and hydrogen (not limited to hydrocarbon rings), and a hetero atom such as an oxygen atom may be included within the structure of the ring (the aliphatic ring). Further, the "hydrocarbon ring" may be either saturated or unsaturated, but in most cases, is preferably saturated.

The aliphatic cyclic group may be either polycyclic or monocyclic. Examples of the aliphatic cyclic group include groups in which two or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated alkyl group. Specific examples include groups in which two or more hydrogen atoms have been removed from a monocycloalkane such as cyclopentane or cyclohexane, or in which two or more hydrogen atoms have been removed from a polycycloalkane such as adamantane, norbornane, isobornane, tricyclodecane or tetracyclododecane.

Further, other examples of the aliphatic cyclic group include groups in which two or more hydrogen atoms have been removed from tetrahydrofuran or tetrahydropyran, which may or may not be substituted with a lower alkyl group, a fluorine atom or a fluorinated alkyl group.

In the structural unit represented by formula (a1-5), the aliphatic cyclic group is preferably a polycyclic group, and among such groups, a group in which two or more hydrogen atoms have been removed from adamantane is particularly desirable.

In formula (a1-5), examples of the divalent linking group for $R^1$ include the same divalent linking groups as those described above for $R^{29}$ in general formulas (a2-1) to (a2-5). Of these, the divalent linking group for $R^1$ is preferably a linear or branched alkylene group, a divalent alicyclic hydrocarbon group or a divalent linking group containing a hetero atom. Among these, a linear or branched alkylene group or a divalent linking group containing a hetero atom is more preferable, and a linear alkylene group is particularly desirable.

When $R^1$ represents an alkylene group, the alkylene group preferably contains 1 to 10 carbon atoms, more preferably 1 to 6 carbon atoms, still more preferably 1 to 4 carbon atoms, and most preferably 1 to 3 carbon atoms. Specific examples include the same linear alkylene groups and branched alkylene groups as those described above.

When $R^1$ represents a divalent alicyclic hydrocarbon group, examples of the alicyclic hydrocarbon group include the same groups as those described above in relation to the "aliphatic hydrocarbon group that includes a ring within the structure".

The alicyclic hydrocarbon group is preferably a group in which two or more hydrogen atoms have been removed from cyclopentane, cyclohexane, norbornane, isobornane, adamantane, tricyclodecane or tetracyclododecane.

When $R^1$ represents a divalent linking group containing a hetero atom, specific examples of preferred linking groups include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, groups represented by general formulas -A-O—B—, -[A-C(=O)—O]$_{m'}$—B— or -A-O—C(=O)—B— [wherein each of A and B independently represents a divalent hydrocarbon group which may have a substituent, O represents an oxygen atom, and m' represents an integer of 0 to 3].

When $R^1$ represents —NH—, the H may be substituted with a substituent such as an alkyl group or an acyl group or the like. This substituent (the alkyl group or acyl group or the like) preferably contains 1 to 10 carbon atoms, more preferably 1 to 8 carbon atoms, and most preferably 1 to 5 carbon atoms. In the formulas -A-O—B—, -[A-C(=O)—O]$_{m'}$—B— and -A-O—C(=O)—B—, each of A and B independently represents a divalent hydrocarbon group which may have a substituent. Examples of these divalent hydrocarbon groups include the same groups as those described above for the "divalent hydrocarbon group which may have a substituent" in relation to $R^1$.

A is preferably a linear aliphatic hydrocarbon group, more preferably a linear alkylene group, still more preferably a linear alkylene group of 1 to 5 carbon atoms, and most preferably a methylene group or ethylene group.

B is preferably a linear or branched aliphatic hydrocarbon group, and is more preferably a methylene group, ethylene group or alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_{m'}$—B—, m' represents an integer of 0 to 3, preferably an integer of 0 to 2, more preferably 0 or 1, and most preferably 1. In other words, the group represented by -[A-C(=O)—O]$_{m'}$—B— is most preferably a group represented by the formula -A-C(=O)—O—B—. Among such groups, groups represented by —(CH$_2$)$_{a'}$—C(=O)—O—(CH$_2$)$_{b'}$— are particularly preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

The divalent linking group containing a hetero atom is preferably a linear group containing an oxygen atom as the hetero atom, such as a group containing an ether linkage or an ester linkage, and is most preferably a group represented by one of the above formulas -A-O—B—, -[A-C(=O)—O]$_{m'}$—B— and -A-O—C(=O)—B—.

In the above formula (a1-5), a represents an integer of 1 to 3, and b represents an integer of 0 to 2, provided that a+b is an integer of 1 to 3.

a is preferably either 1 or 2.

b is preferably 0.

a+b is preferably either 1 or 2.

d represents an integer of 0 to 3, is preferably 0 or 1, and is most preferably 0.

e represents an integer of 0 to 3, is preferably 0 or 1, and is most preferably 0.

Among the various possibilities described above, $R^1$ within formula (a1-5) is most preferably a single bond or a linear alkylene group of 1 to 3 carbon atoms. In other words, a structural unit represented by general formula (a1-51) shown below is preferred.

Of such units, a structural unit represented by general formula (a1-511), (a1-512) or (a1-513) shown below is particularly desirable.

[Chemical Formula 29]

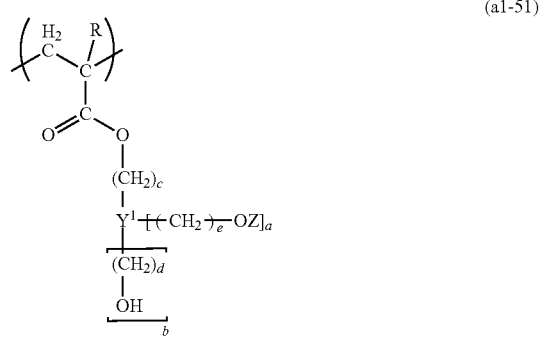

(a1-51)

In formula (a1-51), R, OZ, $Y^1$, a, b, d and e are each the same as defined above, and c represents an integer of 0 to 3.

[Chemical Formula 30]

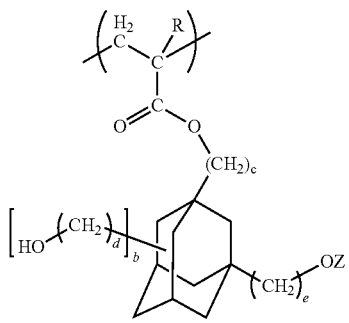

(a1-511)

In the above formula, R, OZ, b, c, d and e are each the same as defined above.

[Chemical Formula 31]

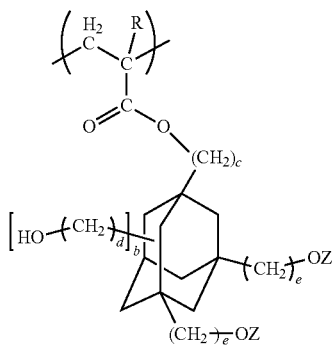

(a1-512)

In the above formula, R, OZ, b, c, d and e are each the same as defined above.

[Chemical Formula 32]

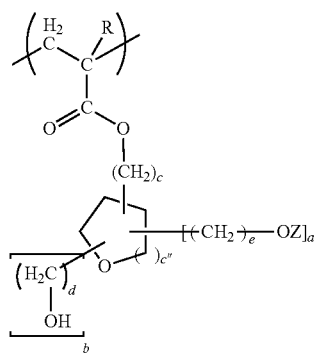

(a1-513)

In the above formula, R, OZ, a, b, c, d and e are each the same as defined above, and c" represents an integer of 1 to 3.

In formula (a1-51), c represents an integer of 0 to 3, and is preferably 0 or 1, and most preferably 0.

In formula (a1-513), c" represents an integer of 1 to 3, and is preferably 1 or 2, and most preferably 1.

In those cases where c within formula (a1-513) is 0, it is preferable that the oxygen atom at the terminal of the carbonyloxy group (—C(=O)—O—) of the acrylate ester is not bonded to a carbon atom bonded to the oxygen atom within the ring. In other words, when c represents 0, it is preferable that two or more carbon atoms exist between the terminal oxygen atom and the oxygen atom within the ring (excluding the case where there is only one carbon atom (namely, the case of an acetal linkage)).

As the structural unit (a1), one type of structural unit may be used alone, or two or more types may be used in combination.

The amount of the structural unit (a1) within the component (A1), based on the combined total of all the structural units that constitute the component (A1), is preferably within a range from 5 to 80 mol %, more preferably from 10 to 80 mol %, and most preferably from 15 to 75 mol %. By ensuring that the amount of the structural unit (a1) is at least as large as the lower limit of the above range, a pattern can be formed readily when the component (A1) is used to prepare a resist composition, and the lithography properties such as the sensitivity, resolution, line width roughness (LWR), line edge roughness (LER) and exposure latitude (EL) can also be improved. By ensuring that the amount of the structural unit (a1) is not more than the upper limit of the above range, a good balance can be achieved with the other structural units.

[Structural Unit (a3)]

The structural unit (a3) is a structural unit which is derived from an acrylate ester in which the hydrogen atom bonded to the carbon atom on the α-position may be substituted with a substituent, and contains a polar group-containing aliphatic hydrocarbon group (but excluding those units that may be classified as the above-described structural units (a2) and (a1)).

By including the structural unit (a3) within the component (A1), the hydrophilicity of the exposed portions of the component (A1) is improved, and because the solubility in the developing solution can be more easily changed, the resolution can be relatively enhanced.

Examples of the polar group include a hydroxyl group, cyano group, carboxyl group, or hydroxyalkyl group in which some of the hydrogen atoms of the alkyl group of 1 to 10 carbon atoms have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and cyclic aliphatic hydrocarbon groups (cyclic groups).

These cyclic groups may be either monocyclic or polycyclic, and can be selected appropriately from the multitude of groups that have been proposed for the resins of resist compositions designed for use with ArF excimer lasers. The cyclic group is preferably a polycyclic group, which most preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group of 1 to 10 carbon atoms have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid, whereas when the hydrocarbon group is a polycyclic group, structural units represented by formulas (a3-1), (a3-2) and (a3-3) shown below are preferable.

[Chemical Formula 33]

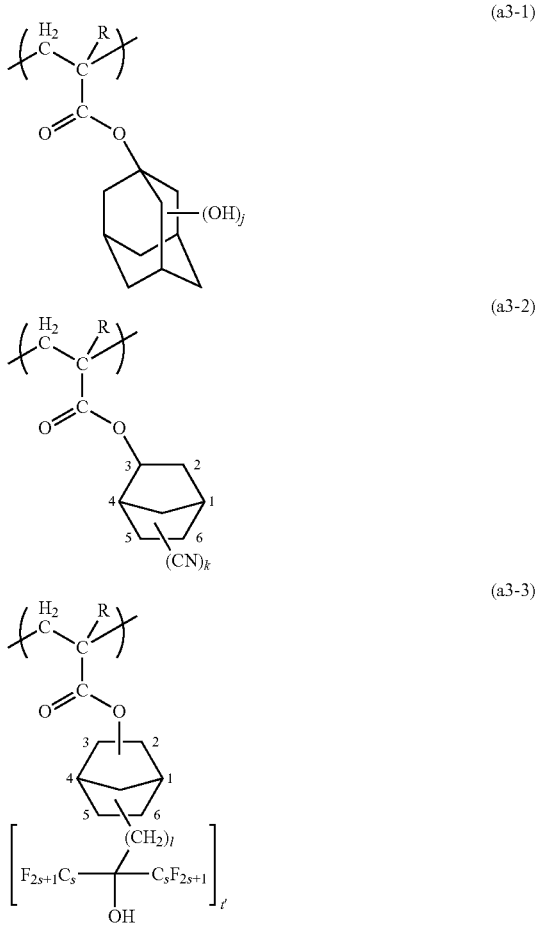

In the formulas, R is the same as defined above, j represents an integer of 1 to 3, k represents an integer of 1 to 3, t' represents an integer of 1 to 3, l represents an integer of 1 to 5, and s represents an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3) within the component (A1), one type of structural unit may be used alone, or two or more types may be used in combination.

The amount of the structural unit (a3) within the component (A1), based on the combined total of all the structural units that constitute the component (A1), is preferably within a range from 5 to 50 mol %, more preferably from 5 to 40 mol %, and still more preferably from 5 to 25 mol %. By ensuring that the amount of the structural unit (a3) is at least as large as the lower limit of the above range, the effects generated by including the structural unit (a3) are obtained satisfactorily, whereas by ensuring that the amount is not more than the upper limit of the above range, a good balance can be achieved with the other structural units.

[Other Structural Units]

The component (A1) may also include structural units other than the structural units described above, as long as the effects of the present invention are not impaired.

There are no particular limitations on these other structural units, and any other structural unit which cannot be classified as one of the above structural units may be used. For example, any of the multitude of conventional structural units used within resist resins for ArF excimer lasers or KrF excimer lasers (and particularly for ArF excimer lasers) can be used.

Specific examples of these other structural units include a structural unit (a0), which is derived from an acrylate ester in which the hydrogen atom bonded to the carbon atom on the α-position may be substituted with a substituent, and contains an —SO$_2$-containing cyclic group, and a structural unit (a4), which is derived from an acrylate ester in which the hydrogen atom bonded to the carbon atom on the α-position may be substituted with a substituent, and contains a non-acid-dissociable aliphatic polycyclic group.

—Structural Unit (a0)

The structural unit (a0) is a structural unit which is derived from an acrylate ester in which the hydrogen atom bonded to the carbon atom on the α-position may be substituted with a substituent, and contains an —SO$_2$-containing cyclic group.

By incorporating an —SO$_2$-containing cyclic group, the structural unit (a0) enhances the adhesion between the substrate and a resist film formed using a resist composition containing the component (A1). Further, the structural unit (a0) also contributes to improvements in lithography properties such as the sensitivity, resolution, EL, LWR, LER and mask reproducibility.

In this description, the term "—SO$_2$-containing cyclic group" refers to a cyclic group which includes a ring containing an —SO$_2$— moiety within the ring structure, and specifically refers to cyclic groups in which the sulfur atom of the —SO$_2$— forms a part of the ring structure of the cyclic group.

The ring containing the —SO$_2$— moiety within the ring structure is counted as the first ring, so that groups containing only that ring are referred to as monocyclic groups, and groups containing other ring structures are described as polycyclic groups regardless of the structure of the other rings.

The —SO$_2$-containing cyclic group may be either monocyclic or polycyclic.

The —SO$_2$-containing cyclic group is preferably a cyclic group containing an —O—SO$_2$-moiety within the ring structure, namely a cyclic group containing a sultone ring in which the —O—S— within the —O—SO$_2$— forms a part of the ring structure of the cyclic group.

The —SO$_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which some of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$— moiety that constitutes part of the ring structure has been substituted with an —$SO_2$-moiety, and groups in which at least one hydrogen atom has been removed from an aliphatic hydrocarbon ring in which a —$CH_2$—$CH_2$— moiety that constitutes part of the ring structure has been substituted with an —O—$SO_2$— moiety.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, groups in which two hydrogen atoms have been removed from a monocycloalkane of 3 to 6 carbon atoms are preferable, and specific examples of such monocycloalkanes include cyclopentane and cyclohexane. As the polycyclic alicyclic hydrocarbon group, groups in which two hydrogen atoms have been removed from a polycycloalkane of 7 to 12 carbon atoms are preferable, and specific examples of such polycycloalkanes include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R" (wherein R" represents a hydrogen atom or an alkyl group), hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group or hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the substituent alkyl groups described above.

Examples of the halogen atom for the substituent include a fluorine atom, chlorine atom, bromine atom or iodine atom, and a fluorine atom is preferable.

Examples of the halogenated alkyl group for the substituent include groups in which some or all of the hydrogen atoms of an aforementioned alkyl group substituent have each been substituted with an above-mentioned halogen atom. A fluorinated alkyl group is preferred as the halogenated alkyl group, and a perfluoroalkyl group is particularly desirable.

In the aforementioned —COOR" group and —O(C=O)R" group, R" is preferably a hydrogen atom, or a linear, branched or cyclic alkyl group of 1 to 15 carbon atoms.

In those cases where R" represents a linear or branched alkyl group, the alkyl group preferably contains 1 to 10 carbon atoms, and more preferably 1 to 5 carbon atoms, and is most preferably a methyl group or ethyl group.

In those cases where R" is a cyclic alkyl group, the alkyl group preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably contains 1 to 6 carbon atoms, and specific examples thereof include groups in which at least one hydrogen atom within an aforementioned alkyl group substituent has been substituted with a hydroxyl group.

More specific examples of the —$SO_2$-containing cyclic group include groups represented by general formulas (3-1) to (3-4) shown below.

[Chemical Formula 34]

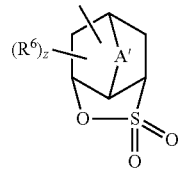

(3-1)

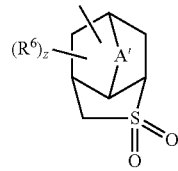

(3-2)

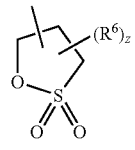

(3-3)

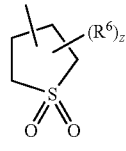

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^6$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, ethylene group, n-propylene group and isopropylene group.

Examples of the alkylene groups which contain an oxygen atom or a sulfur atom include the aforementioned alkylene groups in which —O— or —S— is either bonded to the terminal of the alkylene group or interposed within the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of R$^6$ groups may be the same or different from each other.

Examples of the alkyl group, alkoxy group, halogenated alkyl group, —COOR'' groups, —OC(=O)R'' groups and hydroxyalkyl group for R$^6$ include the same alkyl groups, alkoxy groups, halogenated alkyl groups, —COOR'' groups, —OC(=O)R'' groups and hydroxyalkyl groups as those described above for the substituent which the —SO$_2$-containing cyclic group may have.

Specific examples of the cyclic groups represented by general formulas (3-1) to (3-4) are shown below. In the formulas shown below, "Ac" represents an acetyl group.

[Chemical Formula 35]

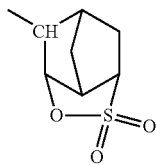
(3-1-1)

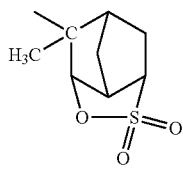
(3-1-2)

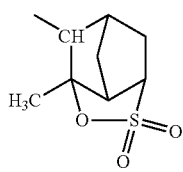
(3-1-3)

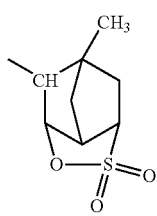
(3-1-4)

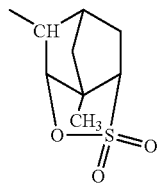
(3-1-5)

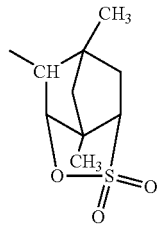
(3-1-6)

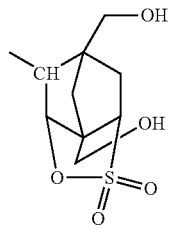
(3-1-7)

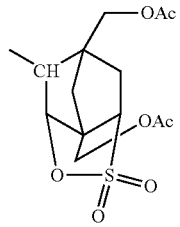
(3-1-8)

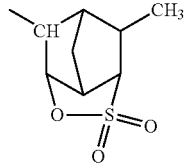
(3-1-9)

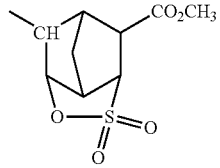
(3-1-10)

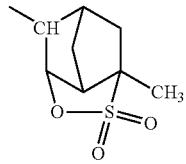
(3-1-11)

(3-1-12)

[Chemical Formula 36]
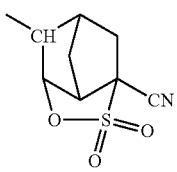 (3-1-13)
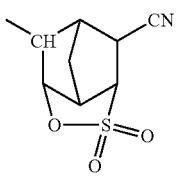 (3-1-14)
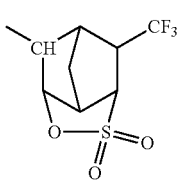 (3-1-15)
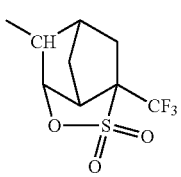 (3-1-16)
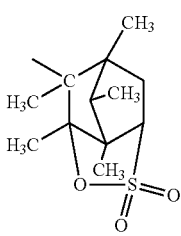 (3-1-17)
[Chemical Formula 37]
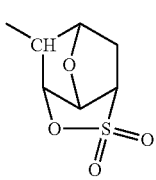 (3-1-18)
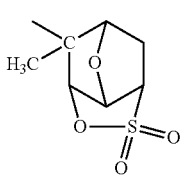 (3-1-19)
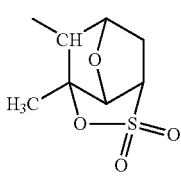 (3-1-20)
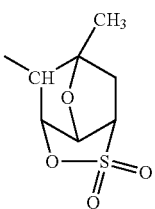 (3-1-21)
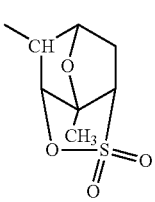 (3-1-22)
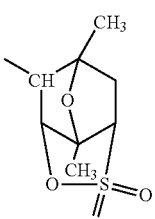 (3-1-23)
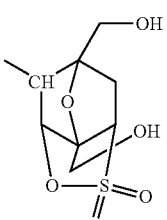 (3-1-24)
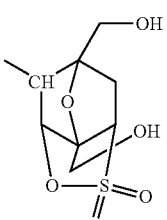 (3-1-25)
[Chemical Formula 38]
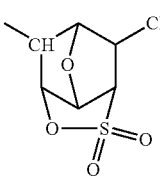 (3-1-26)
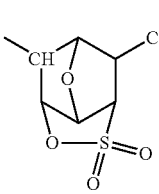 (3-1-27)

-continued (3-1-28) 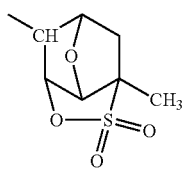

(3-1-29) 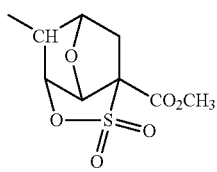

(3-1-30) 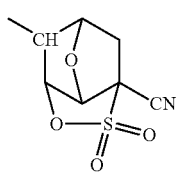

(3-1-31) 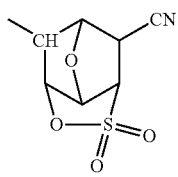

(3-1-32) 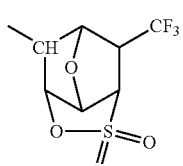

(3-1-33)

[Chemical Formula 39]

(3-2-1) 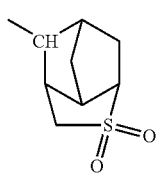

(3-2-2) 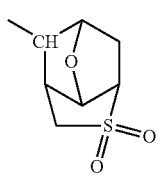

(3-3-1) 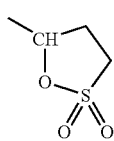

-continued (3-4-1) 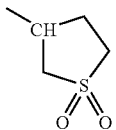

Of the groups shown above, the —$SO_2$-containing cyclic group is preferably a group represented by general formula (3-1), more preferably at least one group selected from the group consisting of groups represented by the above chemical formulas (3-1-1), (3-1-18), (3-3-1) and (3-4-1), and most preferably a group represented by chemical formula (3-1-1).

More specific examples of the structural unit (a0) include structural units represented by general formula (a0-0) shown below.

[Chemical Formula 40]

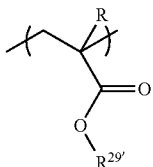

(a0-0)

In the formula, R represents a hydrogen atom, an alkyl group of 1 to 5 carbon atoms or a halogenated alkyl group of 1 to 5 carbon atoms, $R^3$ represents an —$SO_2$-containing cyclic group, and $R^{29'}$ represents a single bond or a divalent linking group.

In the formula (a0-0), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group or neopentyl group.

The halogenated alkyl group for R is a group in which some or all of the hydrogen atoms of an aforementioned alkyl group of 1 to 5 carbon atoms have each been substituted with a halogen atom. Examples of the halogen atom include a fluorine atom, a chlorine atom, a bromine atom and an iodine atom. A fluorine atom is particularly desirable.

As R, a hydrogen atom, an alkyl group of 1 to 5 carbon atoms or a fluorinated alkyl group of 1 to 5 carbon atoms is preferable, and in terms of industrial availability, a hydrogen atom or a methyl group is the most desirable.

In formula (a0-0), $R^3$ is the same as the —$SO_2$-containing cyclic group described above.

$R^{29'}$ may be either a single bond or a divalent linking group. A divalent linking group is preferable in terms of achieving superior effects for the present invention.

Examples of the divalent linking group for $R^{29'}$ include the same groups as those described above for $R^{29}$ in general formulas (a2-1) to (a2-5) within the description relating to the structural unit (a2).

As the divalent linking group for $R^{29'}$, alkylene groups, divalent alicyclic hydrocarbon groups, and divalent linking groups containing a hetero atom are preferred.

Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $R^{29}$.

As the divalent linking group containing an ester linkage, groups represented by general formula: —$R^2$—C(=O)—O— (wherein $R^2$ represents a divalent linking group) are preferred. In other words, the structural unit (a0) is preferably a structural unit represented by general formula (a0-0-1) shown below.

[Chemical Formula 41]

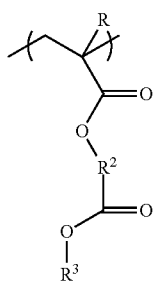

(a0-0-1)

In the formula, R represents a hydrogen atom, an alkyl group of 1 to 5 carbon atoms or a halogenated alkyl group of 1 to 5 carbon atoms, $R^2$ represents a divalent linking group, and $R^3$ represents an —$SO_2$-containing cyclic group.

There are no particular limitations on $R^2$, and the same groups as the divalent linking groups described above for $R^{29'}$ in general formula (a0-0) may be used.

As the divalent linking group for $R^2$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $R^{29'}$.

Of the above groups, a linear or branched alkylene group, or a divalent linking group containing an oxygen atom as a hetero atom is preferred.

As the linear alkylene group, a methylene group or ethylene group is preferred, and a methylene group is particularly desirable.

As the branched alkylene group, an alkylmethylene group or alkylethylene group is preferred, and —CH(CH$_3$)—, —C(CH$_3$)$_2$— and —C(CH$_3$)$_2$CH$_2$— are particularly desirable.

The divalent linking group containing an oxygen atom is preferably a divalent linking group containing an ether linkage or an ester linkage, and is more preferably a group represented by a formula —$Y^{21}$—O—$Y^{22}$—, a formula [$Y^{21}$—C(=O)—O]$_m'$—$Y^{22}$—, or a formula —$Y^{21}$—O—C(=O)—$Y^{22}$—$Y^{21}$, $Y^{22}$ and are the same as defined above.

Among these, groups represented by the formula —$Y^{21}$—O—C(=O)—$Y^{22}$— are preferred, and groups represented by —(CH$_2$)$_{c'}$—O—C(=O)—(CH$_2$)$_{d'}$— are particularly desirable. c' represents an integer of 1 to 5, preferably an integer of 1 to 3, and more preferably 1 or 2. d' represents an integer of 1 to 5, preferably an integer of 1 to 3, and more preferably 1 or 2.

As the structural unit (a0), structural units represented by general formula (a0-0-11) or (a0-0-12) shown below are preferred, and structural units represented by formula (a0-0-12) are particularly desirable.

[Chemical Formula 42]

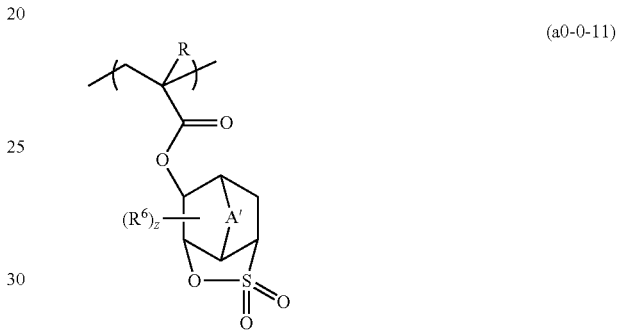

(a0-0-11)

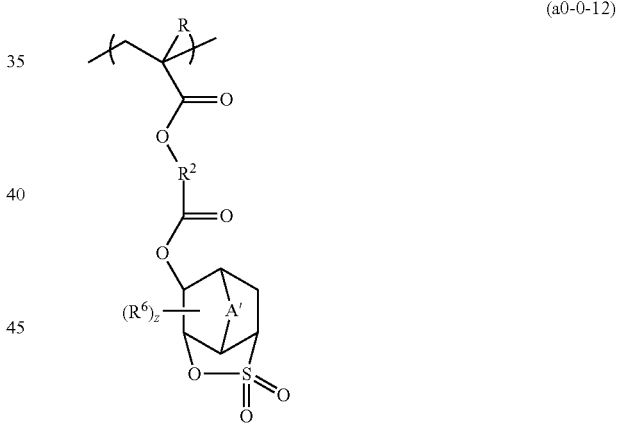

(a0-0-12)

In the formulas, R, A', $R^6$, z and $R^2$ are each the same as defined above.

In formula (a0-0-11), A' is preferably a methylene group, a ethylene group, an oxygen atom (—O—) or a sulfur atom (—S—).

$R^2$ is preferably a linear or branched alkylene group, or a divalent linking group containing an oxygen atom. Examples of the linear or branched alkylene group, and the divalent linking group containing an oxygen atom for $R^2$ include the same linear or branched alkylene groups, and divalent linking groups containing an oxygen described above.

As the structural unit represented by formula (a0-0-12), structural units represented by general formula (a0-0-12a) and (a0-0-12b) shown below are particularly desirable.

[Chemical Formula 43]

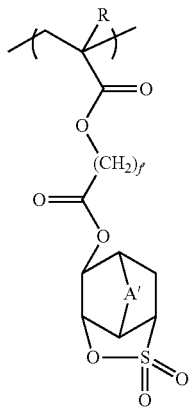
(a0-0-12a)

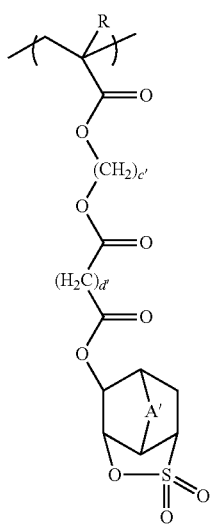
(a-0-0-12b)

In the above formulas, R and A' are each the same as defined above, c' and d' are each the same as defined above, and f represents an integer of 1 to 5 (and preferably an integer of 1 to 3).

As the structural unit (a0) within the component (A1), one type of structural unit may be used alone, or two or more types may be used in combination.

The amount of the structural unit (a0) within the component (A1), based on the combined total of all the structural units that constitute the component (A1), is preferably within a range from 1 to 15 mol %, more preferably from 1 to 10 mol %, and still more preferably from 5 to 10 mol %, as such an amount yields a favorable shape for a resist pattern formed using a resist composition containing the component (A1), and also produces excellent lithography properties such as EL, LWR, LER and mask reproducibility.

—Structural Unit (a4)

The structural unit (a4) is a structural unit which is derived from an acrylate ester in which the hydrogen atom bonded to the carbon atom on the α-position may be substituted with a substituent, and contains a non-acid-dissociable aliphatic polycyclic group.

In the structural unit (a4), examples of the above polycyclic group include the same polycyclic groups as those described above in connection with the structural unit (a1), and any of the multitude of conventional polycyclic groups used within the resin component of resist compositions designed for use with ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 44]

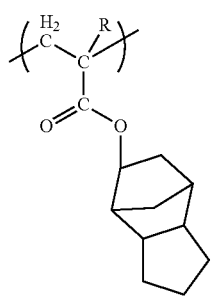
(a4-1)

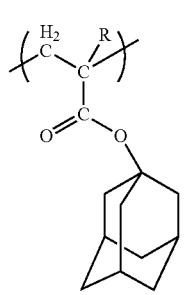
(a4-2)

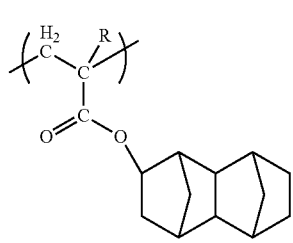
(a4-3)

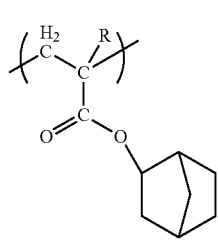
(a4-4)

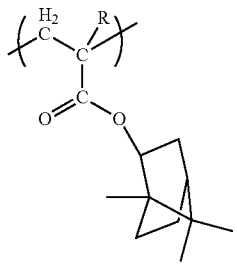

(a4-5)

In the formulas, R is the same as defined above.

When the structural unit (a4) is included in the component (A1), the amount of the structural unit (a4), based on the combined total of all the structural units that constitute the component (A1), is preferably within the range from 1 to 30 mol %, and more preferably from 10 to 20 mol %.

The component (A) included within the resist composition of the present invention includes the copolymer (A1) which exhibits increased polarity under the action of acid.

The component (A1) is preferably a copolymer containing the structural unit (a1) and the structural unit (a2).

Specific examples of such copolymers include copolymers consisting of the structural units (a1), (a2) and (a3), copolymers consisting of the structural units (a1), (a2), (a3) and (a0).

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. By ensuring that the weight average molecular weight is not more than the upper limit of the aforementioned range, the component (A1) exhibits satisfactory solubility in a resist solvent when used as a resist, whereas by ensuring that the weight average molecular weight is at least as large as the lower limit of the aforementioned range, dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn is the number-average molecular weight.

(Method of Polymerizing Copolymer (A1))

The component (A1) in the present invention is a copolymer in which the structural unit (a2) is dispersed uniformly within the molecule of the copolymer. This copolymer (A1) can be produced using the method of producing a polymer disclosed in Japanese Unexamined Patent Application, First Publication No. 2010-254810 [a method of producing a polymer by polymerizing two or more monomers $\alpha_1$ to $\alpha_n$ (wherein n represents an integer of 2 or greater), thereby producing a polymer (P) consisting of structural units $\alpha'_1$ to $\alpha'_n$ (wherein $\alpha'_1$ to $\alpha'_n$ represent structural units derived from the monomers $\alpha_1$ to $\alpha_n$ respectively)].

In other words, the component (A1) can be produced using a method of producing a polymer that includes a step of charging a reactor in advance with a first solution containing two or more monomers $\alpha_1$ to $\alpha_n$ in a first composition, and a step of adding to the reactor, in a dropwise manner, a second solution containing the monomers $\alpha_1$ to $\alpha_n$ in a second composition, wherein the second composition is the same as the design composition that represents the target compositional ratio between the structural units $\alpha'_1$ to $\alpha'_n$ within the polymer (P), and the first composition is a composition that has been determined in advance with due consideration of the design composition and the reactivity of each of the monomers used in the polymerization.

Specifically, the component (A1) can be produced in the manner described below.

First, the reactor is charged with the first solution containing the monomers $\alpha_1$ to $\alpha_n$ in a first composition, and following heating of the inside of the reactor to a predetermined polymerization temperature, the second solution containing the monomers $\alpha_1$ to $\alpha_n$ in a second composition is added dropwise to the reactor. The first solution and the second solution preferably contain a solvent.

A polymerization initiator may be included within the second solution, or may be added to the reactor separately from the second solution.

The rate of the dropwise addition may be uniform until the completion of the dropwise addition, or may be adjusted through multiple stages in accordance with the consumption of the monomers. The dropwise addition may be conducted continuously or intermittently.

The polymerization temperature is preferably within a range from 50 to 150° C.

Examples of the solvent include the solvents listed below.

Ethers: chain-like ethers (such as diethyl ether and propylene glycol monomethyl ether), and cyclic ethers (such as tetrahydrofuran (hereinafter abbreviated as "THF"), and 1,4-dioxane) and the like.

Esters: methyl acetate, ethyl acetate, butyl acetate, ethyl lactate, butyl lactate, propylene glycol monomethyl ether acetate (hereinafter abbreviated as "PGMEA"), and γ-butyrolactone and the like.

Ketones: acetone, methyl ethyl ketone, and methyl isobutyl ketone and the like.

Amides: N,N-dimethylacetamide, and N,N-dimethylformamide and the like.

Sulfoxides: dimethylsulfoxide and the like.

Aromatic hydrocarbons: benzene, toluene, and xylene and the like.

Aliphatic hydrocarbons: hexane and the like.

Alicyclic hydrocarbons: cyclohexane and the like.

As the solvent, a single solvent may be used alone, or two or more solvents may be used in combination.

The polymerization initiator preferably generates radicals efficiently upon heating. Specific examples of the polymerization initiator include azo compounds (such as 2,2'-azobisisobutyronitrile, dimethyl-2,2'-azobisisobutyrate, and 2,2'-azobis[2-(2-imidazolin-2-yl)propane]), and organic peroxides (such as 2,5-dimethyl-2,5-bis(tert-butylperoxy)hexane and di(4-tert-butylcyclohexyl)peroxydicarbonate) and the like.

The compositional ratio of the monomers within the second solution that is added dropwise (namely, the second composition) is the same as the target compositional ratio (the design composition) between the structural units $\alpha'_1$ to $a'_n$ within the polymer (P).

For example, in the case where the polymer (P) is a terpolymer obtained by copolymerizing monomers x, y and z, if the design composition (units: mol %, this also applies to design compositions described below) is x':y':z', then the second composition (units: mol %, this also applies to second compositions described below) x:y:z is set to the same ratio as the design composition x':y':z'.

The compositional ratio of the monomers within the first solution with which the reactor is initially charged (namely, the first composition) is a composition that has been determined in advance with due consideration of the design composition and the reactivity of each of the monomers used in the polymerization.

When the design composition (units: mol %) within the polymer (P) is $\alpha'_1:\alpha'_2:\ldots:\alpha'_n$, and the first composition (units: mol %) is represented by $\alpha_1:\alpha_2:\ldots:\alpha_n$, then if factors determined using the methods (i-1) to (i-3) described below are represented by $F_1, F_2, \ldots F_n$, it is preferable that $\alpha_1 = \alpha'_1/F_1$, $\alpha_2 = \alpha'_2/F_2, \ldots \alpha_n = \alpha'_n/F_n$.

(i-1) First, a dropwise addition solution containing a solvent and a monomer mixture having a monomer composition the same as the design composition $\alpha'_1:\alpha'_2:\ldots:\alpha'_n$ is added dropwise at a constant drip rate to a reactor containing only a solvent, and the compositional ratio (units: mol %) $M_1:M_2:\ldots:M_n$ of the monomers $\alpha_1$ to $\alpha_n$ remaining in the reactor when the time elapsed from the start of the dropwise addition is $t_1, t_2, t_3, \ldots$, and the ratio (units: mol %) $P_1:P_2:\ldots P_n$ of the structural units $\alpha'_1:\alpha'_2:\ldots:\alpha'_n$ within the polymer produced in the time periods between $t_1$ and $t_2$, between $t_2$ and $t_3$, ... are determined.

(i-2): The time period [the period between $t_m$ and $t_{m+1}$ (wherein m is an integer of 1 or greater)] for which the above ratio $P_1:P_2:\ldots P_n$ is closest to the design composition $\alpha'_1:\alpha'_2:\ldots:\alpha'_n$ is determined.

(i-3): Based on the values of $P_1:P_2:\ldots P_n$ for the time period between $t_m$ and $t_{m+1}$, and the values of $M_1:M_2:\ldots:M_n$ at the elapsed time $t_m$, the formulas below are used to calculate the factors $F_1, F_2, \ldots F_n$.

$F_1 = P_1/M_1, F_2 = P_2/M_2, F_n = P_n/M_n$

More specifically, if, for example, the polymer (P) is a terpolymer obtained by copolymerizing monomers x, y and z, and the design composition is x':y':z', then the first composition (units: mol %, this also applies to first compositions described below) $x_0:y_0:z_0$ is calculated from the formulas $x_0 = x'/Fx$, $y_0 = y'/Fy$ and $z_0 = z'/Fz$, using the factors Fx, Fy and Fz determined using the method described below.

(i) Method of Determining Factors Fx, Fy and Fz

The following description presents the case where the polymer (P) is a terpolymer as a specific example, but the factors can be determined in the same manner for a binary polymer or a quaternary or higher polymer.

(i-1'): First, a dropwise addition solution containing a solvent and a monomer mixture having a monomer composition the same as the design composition x':y':z' is added dropwise at a constant drip rate v to a reactor. The reactor is charged in advance with only a solvent.

The compositional ratio (units: mol %) Mx:My:Mz of the monomers x, y and z remaining in the reactor when the time elapsed from the start of the dropwise addition is $t_1, t_2, t_3, \ldots$, and the ratio (units: mol %) Px:Py:Pz of the structural units within the polymer produced in the time periods between $t_1$ and $t_2$, between $t_2$ and $t_3$, ... are determined.

(i-2'): The time period [the period between $t_m$ and $t_{m+1}$ (wherein m is an integer of 1 or greater)] for which the above ratio Px:Py:Pz is closest to the design composition x':y':z' is determined.

(i-3'): Based on the values of Px:Py:Pz for the time period between $t_m$ and $t_{m+1}$, and the values of Mx:My:Mz at the elapsed time $t_m$, the formulas below are used to calculate the factors Fx, Fy and Fz.

Fx = Px/Mx, Fy = Py/My, Fz = Pz/Mz

The factors Fx, Fy and Fz are values that reflect the relative reactivities of each of the monomers, and these factors change as the combination of monomers used in the polymerization changes, or as the design composition changes.

(ii) Method of Determining Monomer Content in the First Solution and Second Solution There are no particular limitations on the monomer content within the first solution and the second solution, provided that dropwise addition of the second solution to the first solution results in the production of the desired polymer having substantially the same composition as the design composition. Accordingly, even if the polymerization reaction is halted before all of the second solution has been added dropwise, the desired polymer can still be obtained.

The amount of the monomers contained within the first solution can be set in accordance with factors such as the desired solid fraction concentration within the polymer solution obtained upon production of the polymer within the first solution. For example, if the sum of the total amount of monomers contained within the first solution and the total amount of monomers contained within the second solution is deemed 100% by weight, then the monomer content within the first solution is preferably not more than 60% by weight, more preferably not more than 50% by weight, and still more preferably 40% by weight or less. There are no particular limitations on the lower limit, which is preferably set to any content exceeding 0% by weight that enables the first composition mentioned above to be satisfied.

The sum of the total amount of monomers contained within the first solution and the total amount of monomers contained within the second solution is preferably set in accordance with the amount of the polymer (P) that is to be produced.

Further, a method (ii-1) described below that uses the process described above for determining the above factors is preferably used to determine the ratio between the total amount of monomers contained within the first solution and the total amount of monomers contained within the second solution.

(ii-1) The proportion ($W_0$ % by weight) of the 100% by weight of the monomer mixture contained within the initial dropwise addition solution accounted for by the total weight of monomers that exist within the reactor at the above elapsed time $t_m$ is determined.

The weight ratio between the total amount of monomers contained within the first solution and the total amount of monomers contained within the second solution (namely, first solution:second solution) is preferably set to $W_0$: (100–$W_0$).

(iii) Production of Polymer

The drip rate during production of the polymer (P) is preferably the same as the drip rate v within the process described above for determining the above factors. There are no particular limitations on the drip rate v, which may be set to a similar value to the drip rate used in conventional dropwise polymerization methods.

(iv) Purification of Polymer

Following the dropwise addition of the second solution to the first solution and the resulting polymerization reaction, the polymerization reaction solution is precipitated by mixing with a solvent, and the thus obtained precipitate is appropriately washed and filtered to obtain the copolymer (A1).

The polymerization method described above exhibits good reproducibility, and enables the stable production of a high-quality polymer. The copolymer (A1) obtained using this polymerization method is particularly ideal as a polymer for a resist that requires a high degree of precision for the polymer composition.

In the resist composition of the present invention, a single component (A1) may be used alone within the component (A), or two or more different copolymers (A1) may be used in combination.

In the resist composition of the present invention, the component (A) may include, in addition to the component (A1) described above, a base component which does not correspond with the component (A1), but which exhibits changed solubility in a developing solution under the action of acid.

There are no particular limitations on this base component which does not correspond with the component (A1), and the base component may be selected appropriately from the multitude of conventional base components used for chemically amplified resist compositions, including base resins such as novolac resins and polyhydroxystyrene (PHS)-based resins, and low molecular weight compound components.

Examples of the low molecular weight compound components include low molecular weight compounds having a molecular weight of at least 500 but less than 4,000 that include both a hydrophilic group and an acid-dissociable group such as those described above in connection with the component (A1). Specific examples of these low molecular weight compounds include compounds having a plurality of phenol structures in which some of the hydrogen atoms of the hydroxyl groups have each been substituted with an aforementioned acid-dissociable group.

The proportion of the component (A1) within the component (A), based on the total weight of the component (A), is preferably not less than 25% by weight, more preferably 50% by weight or more, and still more preferably 75% by weight or more. The amount of the component (A1) may also represent 100% by weight of the component (A). Provided the amount is not less than 25% by weight, a resist pattern having superior resolution and a favorable shape with a high degree of rectangularity can be more readily formed.

In the resist composition, the amount of the component (A) can be adjusted appropriately depending on factors such as the thickness of the resist film to be formed.

<Component (B)>

In the present invention, there are no particular limitations on the acid generator component (B) contained within the resist composition, and any of the known acid generators used in conventional chemically amplified resist compositions can be used.

Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As an onium salt acid generator, compounds represented by general formulas (b-1) and (b-2) shown below may be used.

[Chemical Formula 45]

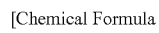
(b-1)

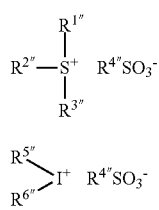
(b-2)

In the formulas, each of $R^{1\prime\prime}$ to $R^{3\prime\prime}$, $R^{5\prime\prime}$ and $R^{6\prime\prime}$ independently represents an aryl group which may have a substituent, an alkyl group or an alkenyl group, wherein two of $R^{1\prime\prime}$ to $R^{3\prime\prime}$ in formula (b-1) may be bonded to each other to form a ring together with the sulfur atom in the formula, and $R^{4\prime\prime}$ represents an alkyl group, halogenated alkyl group, aryl group or alkenyl group, which may have a substituent.

In formula (b-1), each of $R^{1\prime\prime}$ to $R^{3\prime\prime}$ independently represents an aryl group which may have a substituent, an alkyl group or an alkenyl group. Two of $R^{1\prime\prime}$ to $R^{3\prime\prime}$ may be bonded to each other to form a ring together with the sulfur atom in the formula.

Further, in terms of achieving better improvement in the lithography properties and the resist pattern shape, it is preferable that at least one of $R^{1\prime\prime}$ to $R^{3\prime\prime}$ is an aryl group, more preferable that two or more of $R^{1\prime\prime}$ to $R^{3\prime\prime}$ are aryl groups, and most preferable that all of $R^{1\prime\prime}$ to $R^{3\prime\prime}$ are aryl groups.

Examples of the aryl group for $R^{1\prime\prime}$ to $R^{3\prime\prime}$ include unsubstituted aryl groups of 6 to 20 carbon atoms, and substituted aryl groups in which some or all of the hydrogen atoms of an aforementioned unsubstituted aryl group have each been substituted with an alkyl group, alkoxy group, halogen atom, hydroxyl group, oxo group (=O), aryl group, alkoxyalkyloxy group, alkoxycarbonylalkyloxy group, —C—(=O)—O—$R^{6\prime}$, —O—C(=O)—$R^{7\prime}$ or —O—$R^{8\prime}$. Each of $R^{6\prime}$, $R^{7\prime}$ and $R^{8\prime}$ represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The unsubstituted aryl group for $R^{1\prime\prime}$ to $R^{3\prime\prime}$ is preferably an aryl group of 6 to 10 carbon atoms because such groups enable lower cost synthesis. Specific examples include a phenyl group and a naphthyl group.

The alkyl group as the substituent for the substituted aryl group for $R^{1\prime\prime}$ to $R^{3\prime\prime}$ is preferably an alkyl group having 1 to 5 carbon atoms, and most preferably a methyl group, ethyl group, propyl group, n-butyl group, or tert-butyl group.

The alkoxy group as the substituent for the substituted aryl group is preferably an alkoxy group having 1 to 5 carbon atoms, and most preferably a methoxy group, ethoxy group, n-propoxy group, iso-propoxy group, n-butoxy group or tert-butoxy group.

The halogen atom as the substituent for the substituted aryl group is preferably a fluorine atom.

Examples of the aryl group as the substituent for the substituted aryl group include the same aryl groups as those described above for $R^{1\prime\prime}$ to $R^{3\prime\prime}$, and of these, aryl groups of 6 to 20 carbon atoms are preferred, aryl groups of 6 to 10 carbon atoms are more preferred, and a phenyl group or naphthyl group is particularly desirable.

Examples of the alkoxyalkyloxy group as the substituent for the substituted aryl group include groups represented by the general formula shown below.

$$—O—C(R^{47})(R^{48})—O—R^{49}$$

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms and may be either linear or branched, is preferably an ethyl group or a methyl group, and is most preferably a methyl group.

It is preferable that at least one of $R^{47}$ and $R^{48}$ is a hydrogen atom, and it is particularly desirable that either one of $R^{47}$ and $R^{48}$ is a hydrogen atom and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and examples thereof include a methyl group, ethyl group, propyl group, n-butyl group or tert-butyl group.

The cyclic alkyl group for $R^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

Examples of the alkoxycarbonylalkyloxy group as the substituent for the substituted aryl group include groups represented by the general formula shown below.

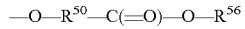

—O—$R^{50}$—C(=O)—O—$R^{56}$

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, ethylene group, trimethylene group, tetramethylene group and 1,1-dimethylethylene group.

Examples of the tertiary alkyl group for $R^{56}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Moreover, groups in which $R^{56}$ in the general formula —O—$R^{50}$—C(=O)—O—$R^{56}$ has been substituted with $R^{56'}$ may also be used. $R^{56'}$ represents a hydrogen atom, an alkyl group, a fluorinated alkyl group, or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which some or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which one or more hydrogen atoms within an aliphatic cyclic group have each been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

For $R^{56'}$, specific examples of the aliphatic cyclic groups containing a hetero atom within the ring structure include groups represented by formulas (L1) to (L6) and (S1) to (S4) shown below.

For $R^{56'}$, specific examples of the groups in which one or more hydrogen atoms within the aliphatic cyclic group have been substituted with a hetero atom include groups in which one or more hydrogen atoms within an aliphatic cyclic group have been substituted with an oxygen atom (=O).

Each of $R^{6'}$, $R^{7'}$ and $R^{8'}$ in the formulas —C—(=O)—O—$R^{6'}$, —O—C(=O)—$R^{7'}$ or —O—$R^{8'}$. represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The linear or branched saturated hydrocarbon group contains 1 to 25 carbon atoms, preferably 1 to 15 carbon atoms, and more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group, excluding tertiary alkyl groups, include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxygen atom (=O), cyano group or carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom or iodine atom, and a fluorine atom is preferable.

Examples of the halogenated alkyl group as a substituent for the linear or branched saturated hydrocarbon group include groups in which some or all of the hydrogen atoms within an aforementioned linear or branched saturated hydrocarbon group have each been substituted with an aforementioned halogen atom.

The cyclic saturated hydrocarbon group of 3 to 20 carbon atoms for $R^{6'}$, $R^{7'}$ and $R^{8'}$ may be either a polycyclic group or a monocyclic group. Examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, some of the carbon atoms that constitute the ring within the cyclic saturated hydrocarbon group may be substituted with a hetero atom, or a hydrogen atom bonded to the ring within the cyclic saturated hydrocarbon may be substituted with a substituent.

Examples of the former case include groups in which one or more hydrogen atoms have been removed from a heterocycloalkane in which some of the carbon atoms that constitute the ring(s) of an aforementioned monocycloalkane or a polycycloalkane have been substituted with a hetero atom such as an oxygen atom, sulfur atom or nitrogen atom. Further, the ring structure may include an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

In the latter case, examples of the substituent include the same substituents as those described above for the linear or branched saturated hydrocarbon group, or a lower alkyl group of 1 to 5 carbon atoms.

Further, $R^{6'}$, $R^{7'}$ and $R^{8'}$ may be a combination of a linear or branched alkyl group and a cyclic alkyl group.

Examples of combinations of a linear or branched alkyl group and a cyclic alkyl group include groups in which a cyclic alkyl group is bonded as a substituent to a linear or branched alkyl group, and groups in which a linear or branched alkyl group is bonded as a substituent to a cyclic alkyl group.

Examples of the linear aliphatic unsaturated hydrocarbon group for $R^{6'}$, $R^{7'}$ and $R^{8'}$ include a vinyl group, propenyl group (allyl group), and butynyl group.

Examples of the branched aliphatic unsaturated hydrocarbon group for $R^{6'}$, $R^{7'}$ and $R^{8'}$ include a 1-methylpropenyl group and 2-methylpropenyl group.

The linear or branched aliphatic unsaturated hydrocarbon group may have a substituent. Examples of the substituent include the same substituents as those described above for the linear or branched saturated hydrocarbon group.

Of the various possibilities described above, each of $R^{7'}$ and $R^{8'}$ is preferably a linear or branched saturated hydrocarbon group of 1 to 15 carbon atoms, or a cyclic saturated hydrocarbon group of 3 to 20 carbon atoms, as such groups yield superior lithography properties and resist pattern shape.

The aryl group for each of $R^{1''}$ to $R^{3''}$ is preferably a phenyl group or a naphthyl group.

Examples of the alkyl group for $R^{1''}$ to $R^{3''}$ include linear, branched and cyclic alkyl groups having 1 to 10 carbon atoms. In terms of achieving excellent resolution, the alkyl group preferably has 1 to 5 carbon atoms. Specific examples include a methyl group, ethyl group, n-propyl group, isopropyl group, n-butyl group, isobutyl group, n-pentyl group, cyclopentyl group, hexyl group, cyclohexyl group, nonyl group and decyl group. A methyl group is most preferable because it yields excellent resolution and enables synthesis to be conducted at a low cost.

The alkenyl group for $R^{1''}$ to $R^{3''}$ preferably has 2 to 10 carbon atoms, more preferably 2 to 5 carbon atoms, and still more preferably 2 to 4 carbon atoms. Specific examples of the alkenyl group include a vinyl group, propenyl group (allyl group), butynyl group, 1-methylpropenyl group and 2-methylpropenyl group.

In those cases where two of $R^{1''}$ to $R^{3''}$ are bonded to each other to form a ring together with the sulfur atom in the formula, the ring including the sulfur atom is preferably a 3- to 10-membered ring, and more preferably a 5- to 7-membered ring.

When two of $R^{1''}$ to $R^{3''}$ are bonded to each other to form a ring together with the sulfur atom in the formula, the remaining one of $R^{1''}$ to $R^{3''}$ is preferably an aryl group. Examples of this aryl group include the same groups as those described above for the aryl group for $R^{1''}$ to $R^{3''}$.

Specific examples of the cation moiety within the compound represented by formula (b-1) include triphenylsulfonium, (3,5-dimethylphenyl)diphenylsulfonium, (4-(2-adamantoxymethyloxy)-3,5-dimethylphenyl) diphenylsulfonium, (4-(2-adamantoxymethyloxy)phenyl) diphenylsulfonium, (4-(tert-butoxycarbonylmethyloxy) phenyl)diphenylsulfonium, (4-(tert-butoxycarbonylmethyloxy)-3,5-dimethylphenyl) diphenylsulfonium, (4-(2-methyl-2-adamantyloxycarbonylmethyloxy)phenyl) diphenylsulfonium, (4-(2-methyl-2-adamantyloxycarbonylmethyloxy)-3,5-dimethylphenyl) diphenylsulfonium, tri(4-methylphenyl)sulfonium, dimethyl (4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl) phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl) tetrahydrothiopyranium and 1-(4-methylphenyl)tetrahydrothiopyranium.

Furthermore, examples of preferred cation moieties within the compound represented by the above formula (b-1) include the cations shown below.

[Chemical Formula 46]

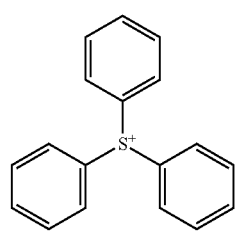

(b-1-1)

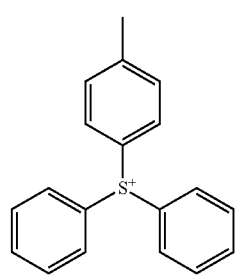

(b-1-2)

(b-1-3)
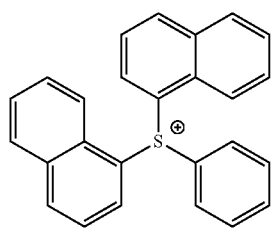
[Chemical Formula 47]
(b-1-4)
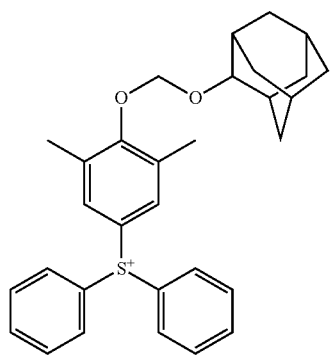
(b-1-5)
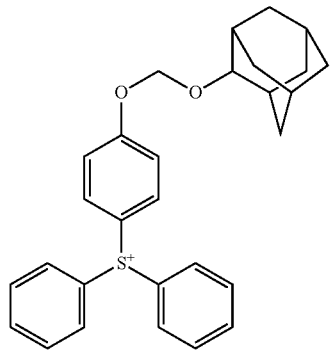
(b-1-6)
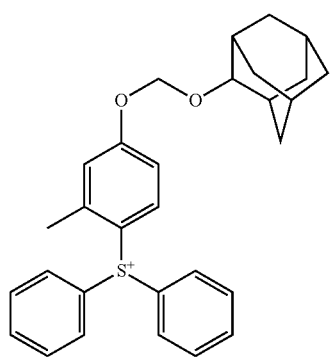
[Chemical Formula 48]
(b-1-7)
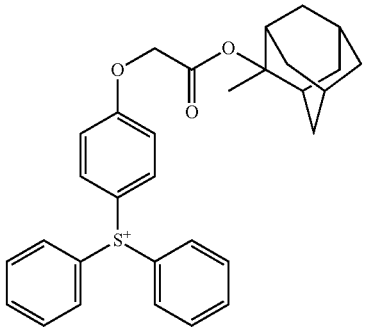
(b-1-8)
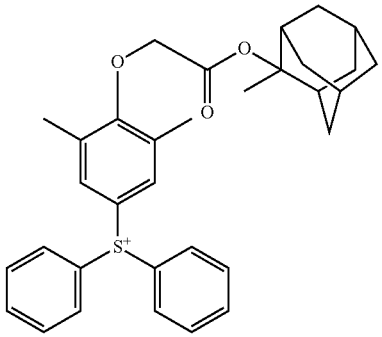
(b-1-9)
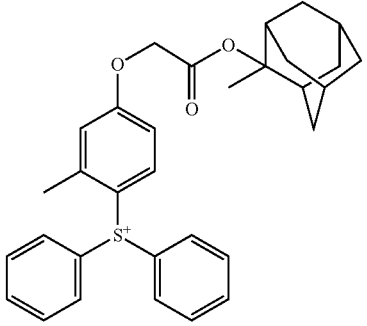
(b-1-10)
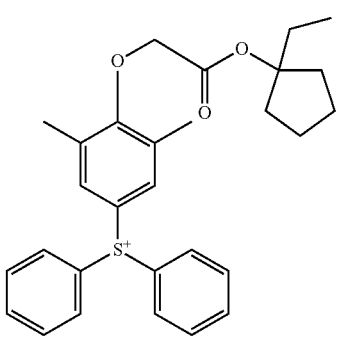

(b-1-11)
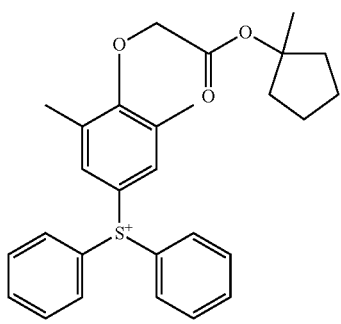
(b-1-12)
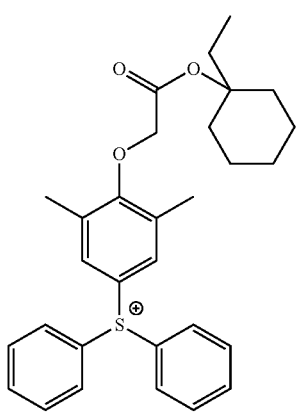
(b-1-13)
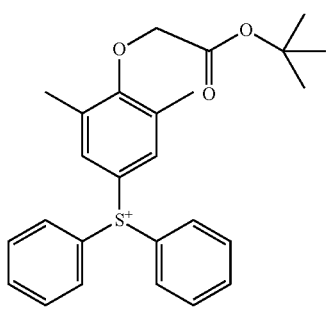
[Chemical Formula 49]
(b-1-14)
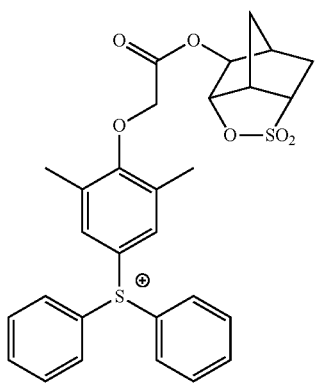
(b-1-15)
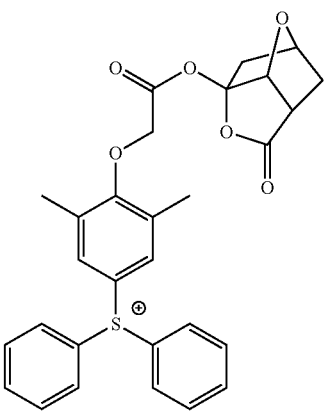
(b-1-16)
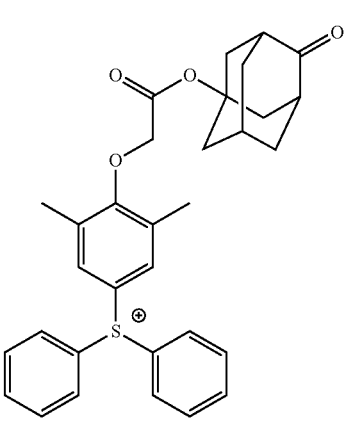
(b-1-17)
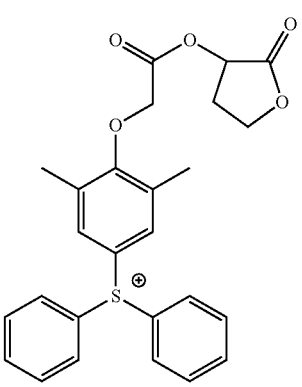
(b-1-18)
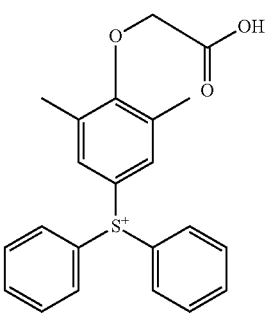

(b-1-19)
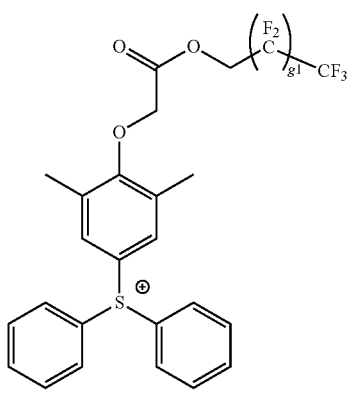
(b-1-23)
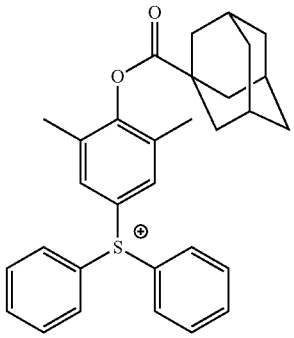
In the above formula, g1 represents the number of repeating units, and is typically an integer of 1 to 5.
[Chemical Formula 50]
(b-1-20)
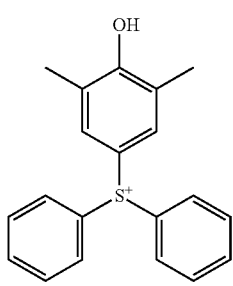
(b-1-24)
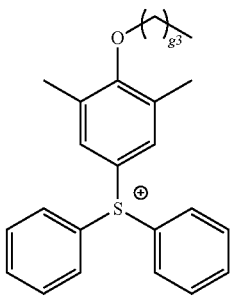
(b-1-25)
(b-1-21)
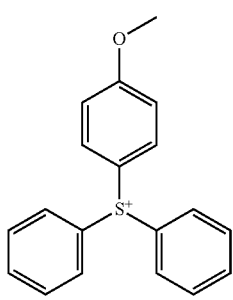
In the above formulas, g2 and g3 represent numbers of repeating units, wherein g2 is an integer of 0 to 20, and g3 is an integer of 0 to 20.
[Chemical Formula 52]
(b-1-26)
(b-1-22)
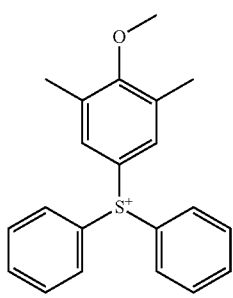
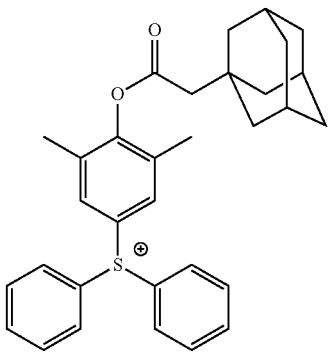

(b-1-27)
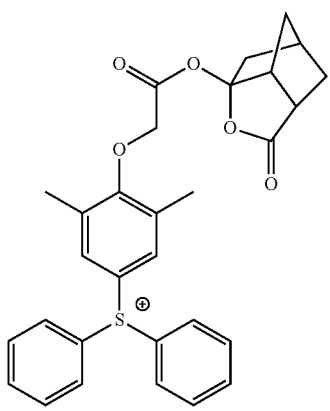

(b-1-28)
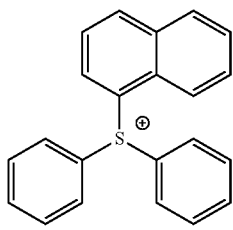

[Chemical Formula 53]

(b-1-29)
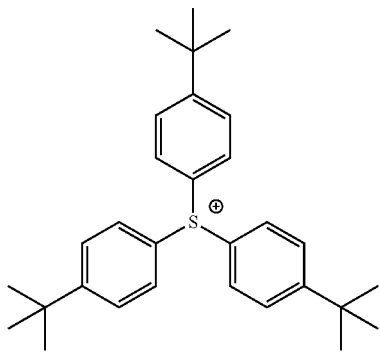

(b-1-30)
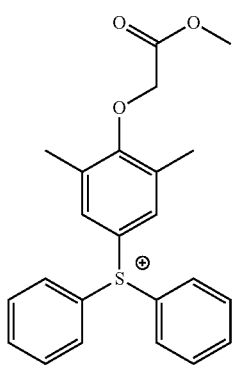

(b-1-31)
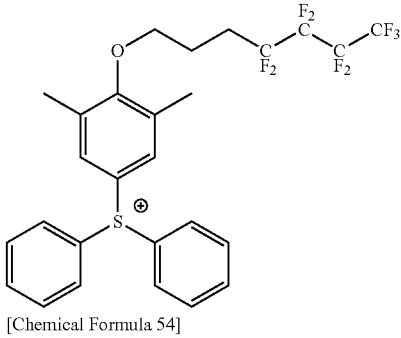

[Chemical Formula 54]

(b-1-32)

(b-1-33)
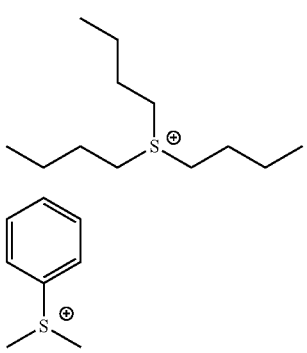

In the above formula (b-1), $R^{4'''}$ represents an alkyl group, halogenated alkyl group, aryl group or alkenyl group which may have a substituent.

The alkyl group for $R^{4'''}$ may be linear, branched or cyclic.

The linear or branched alkyl group preferably contains 1 to 10 carbon atoms, more preferably 1 to 8 carbon atoms, and most preferably 1 to 4 carbon atoms.

The cyclic alkyl group preferably contains 4 to 15 carbon atoms, more preferably 4 to 10 carbon atoms, and most preferably 6 to 10 carbon atoms.

Examples of the halogenated alkyl group for $R^{4'''}$ include groups in which some or all of the hydrogen atoms within an above-mentioned linear, branched or cyclic alkyl group have each been substituted with a halogen atom. Examples of the halogen atom include a fluorine atom, chlorine atom, bromine atom or iodine atom. A fluorine atom is preferred.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that some or all of the hydrogen atoms within the above-mentioned alkyl group, halogenated alkyl group, aryl group or alkenyl group may each be substituted with a substituent (an atom other than a hydrogen atom, or a group). $R^{4'''}$ may have one substituent, or two or more substituents.

Examples of the substituent include a halogen atom, a hetero atom, an alkyl group, and a group represented by the formula $X^b$-$Q^1$- (wherein $Q^1$ represents a divalent linking group containing an oxygen atom, and $X^b$ represents a hydrocarbon group of 3 to 30 carbon atoms which may have a substituent).

Examples of the halogen atom and alkyl group include the same halogen atoms and alkyl groups as those described above with respect to the halogenated alkyl group for $R^{4"}$.

Examples of the hetero atom include an oxygen atom, a nitrogen atom, and a sulfur atom.

In the group represented by formula $X^b$-$Q^1$-, $Q^1$ represents a divalent linking group containing an oxygen atom.

$Q^1$ may also contain atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (an ether bond, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of alkylene groups include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

$Q^1$ is preferably a divalent linking group containing an ester linkage or ether linkage, and is more preferably a group represented by —$R^{91}$—O—, —$R^{92}$—O—C(=O)— or —C(=O)—O—$R^{93}$—O—C(=O)—.

In the group represented by the formula $X^b$-$Q^1$-, the hydrocarbon group for $X^b$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are aromatic hydrocarbon rings having one hydrogen atom removed therefrom, such as a phenyl group, biphenylyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, some of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which some of the carbon atoms that constitute the ring within an aforementioned aryl group have been substituted with a hetero atom such as an oxygen atom, a sulfur atom or a nitrogen atom, and heteroarylalkyl groups in which some of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which some or all of the hydrogen atoms within an aforementioned alkyl group have each been substituted with an aforementioned halogen atom.

The aliphatic hydrocarbon group for $X^b$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $X^b$, some of the carbon atoms that constitute the aliphatic hydrocarbon group may be substituted with a substituent containing a hetero atom, and/or some or all of the hydrogen atoms that constitute the aliphatic hydrocarbon group may each be substituted with a substituent containing a hetero atom.

There are no particular limitations on this "hetero atom" within $X^b$, provided it is an atom other than a carbon atom or a hydrogen atom. Examples of the hetero atom include a halogen atom, oxygen atom, sulfur atom and nitrogen atom.

Examples of the halogen atom include a fluorine atom, chlorine atom, iodine atom and bromine atom.

The substituent containing a hetero atom may consist solely of the hetero atom, or may be a group that also contains a group or atom other than a hetero atom.

Specific examples of the substituent for substituting some of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, any of these substituents may be included within the ring structure of the aliphatic hydrocarbon group.

Examples of the substituent for substituting some or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 55]

(L1)

(L2)

(L3)

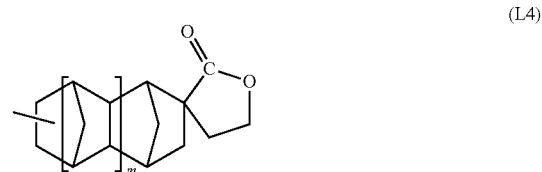

(L4)

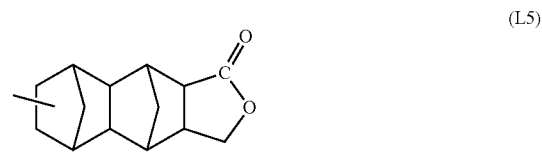

(L5)

(L6)

(S1)

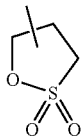
(S2)

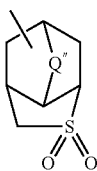
(S3)

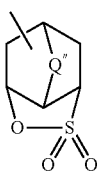
(S4)

In the formulas, Q'' represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms), and m represents 0 or 1.

Examples of the alkylene groups for Q'', $R^{94}$ and $R^{95}$ include the same alkylene groups as those described above for $R^{91}$ to $R^{93}$.

In these aliphatic cyclic groups, some of the hydrogen atoms bonded to the carbon atoms that constitute the ring structure may each be substituted with a substituent. Examples of this substituent include an alkyl group, alkoxy group, halogen atom, halogenated alkyl group, hydroxyl group or oxygen atom (═O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting some or all of the hydrogen atoms.

Among the various possibilities described above, $X^b$ is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L5), and (S3) and (S4) are preferable.

Further, $X^b$ is preferably a group containing a polar region, as such groups yield improved lithography properties and a superior resist pattern shape.

Examples of these groups containing a polar region include groups in which a portion of the carbon atoms that constitute the aliphatic cyclic group of an above-mentioned group $X^b$ have been substituted with a substituent containing a hetero atom, namely with a substituent such as —O—, —C(═O)—O—, —C(═O)—, —O—C(═O)—O—, —C(═O)—NH—, —NH— (wherein H may be substituted with a substituent such as an alkyl group or acyl group), —S—, —S(═O)$_2$— or —S(═O)$_2$—O.

Among the above possibilities, $R^{4'''}$ is preferably a group having $X^b$-$Q^1$- as a substituent. In such cases, $R^{4'''}$ is preferably a group represented by the formula $X^b$-$Q^1$-$Y^1$— (wherein $Q^1$ and $X^b$ are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula $X^b$-$Q^1$-$Y^1$—, examples of the alkylene group represented by $Y^1$ include those alkylene groups described above for $Q^1$ in which the number of carbon atoms is within a range from 1 to 4.

Examples of the fluorinated alkylene group for $Y^1$ include groups in which some or all of the hydrogen atoms of an aforementioned alkylene group have each been substituted with fluorine atoms.

Specific examples of $Y^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents with which the alkylene group or fluorinated alkylene group may be substituted include alkyl groups of 1 to 4 carbon atoms, alkoxy groups of 1 to 4 carbon atoms, and a hydroxyl group.

In the above formula (b-2), each of $R^{5'''}$ and $R^{6'''}$ independently represents an aryl group which may have a substituent, an alkyl group or an alkenyl group.

Further, in terms of achieving better improvement in the lithography properties and the resist pattern shape, it is preferable that at least one of $R^{5\prime\prime}$ and $R^{6\prime\prime}$ is an aryl group, and more preferable that both of $R^{5\prime\prime}$ and $R^{6\prime\prime}$ are aryl groups.

Examples of the aryl group for $R^{5\prime\prime}$ and $R^{6\prime\prime}$ include the same aryl groups as those described for $R^{1\prime\prime}$ to $R^{3\prime\prime}$.

Examples of the alkyl group for $R^{5\prime\prime}$ and $R^{6\prime\prime}$ include the same alkyl groups as those described for $R^{\prime\prime}$ to $R^{3\prime\prime}$.

Examples of the alkenyl group for $R^{5\prime\prime}$ and $R^{6\prime\prime}$ include the same alkenyl groups as those described for $R^{1\prime\prime}$ to $R^{3\prime\prime}$.

Among the various possibilities, the case in which $R^{5\prime\prime}$ and $R^{6\prime\prime}$ are both phenyl groups is the most desirable.

Specific examples of the cation moiety within compounds represented by formula (b-2) include diphenyliodonium and bis(4-tert-butylphenyl)iodonium.

Examples of $R^{4\prime\prime}$ within the formula (b-2) include the same groups as those described above for $R^{4\prime\prime}$ within formula (b-1).

Specific examples of the onium salt acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has either been replaced by an alkylsulfonate such as methanesulfonate, n-propanesulfonate, n-butanesulfonate, n-octanesulfonate, 1-adamantanesulfonate or 2-norbornanesulfonate, or been replaced by a sulfonate such as d-camphor-10-sulfonate, benzenesulfonate, perfluorobenzenesulfonate or p-toluenesulfonate.

Further, onium salts in which the anion moiety of these onium salts has been replaced by an anion moiety represented by any one of formulas (b1) to (b8) shown below can also be used.

[Chemical Formula 56]

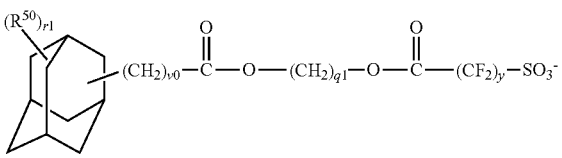
(b1)

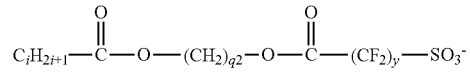
(b2)

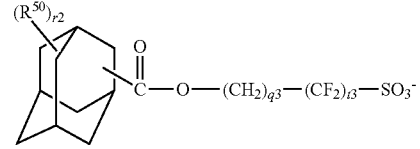
(b3)

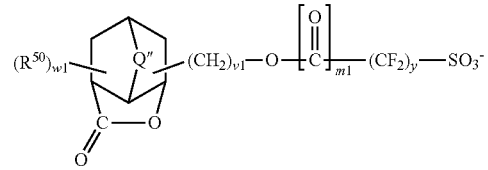
(b4)

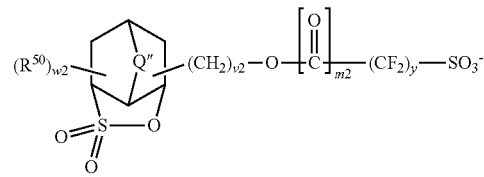
(b5)

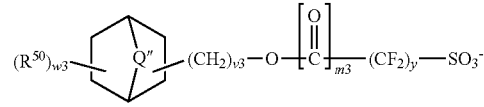
(b6)

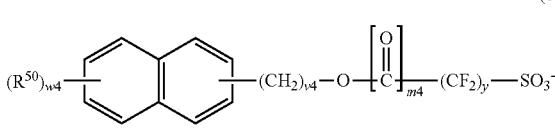
(b7)

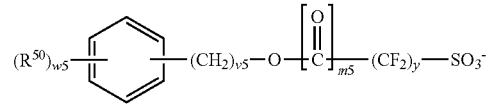
(b8)

In the formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q" is the same as defined above.

Examples of the substituent for $R^{50}$ include the same groups as those which the aforementioned aliphatic hydrocarbon group or aromatic hydrocarbon group for $X^b$ may have as a substituent.

If there are two or more $R^{50}$ groups, as indicated by the values r1, r2, and w1 to w5, then the plurality of $R^{50}$ groups within the compound may be the same or different from each other.

Further, onium salt acid generators in which the anion moiety ($R^{4n}SO_3^-$) in the above general formula (b-1) or (b-2) has been replaced with an anion moiety represented by general formula (b-3) or (b-4) shown below (but in which the cation moiety is the same as the cation shown in formula (b-1) or (b-2)) can also be used favorably as the onium salt acid generator.

[Chemical Formula 57]

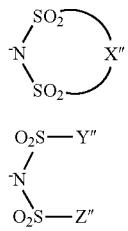

(b-3)

(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group contains 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group contains 1 to 10 carbon atoms, preferably 1 to 7 carbon atoms, and more preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less and electron beams is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

As the onium salt acid generator, onium salts of the above general formula (b-1) or (b-2) in which the anion moiety ($R^{4n}SO_3^-$) has been substituted with $R^a$—$COO^-$ (wherein $R^a$ represents an alkyl group or a fluorinated alkyl group) (and in which the cation moiety is the same as that of general formula (b-1) or (b-2)) may also be used.

Examples of $R^a$ in the above formula include the same groups as those listed above for $R^{4n}$.

Specific examples of $R^a$—$COO^-$ include a trifluoroacetate ion, an acetate ion, and a 1-adamantanecarboxylate ion.

Furthermore, a sulfonium salt having a cation moiety represented by general formula (b-5) or (b-6) shown below may also be used as an onium salt acid generator.

[Chemical Formula 58]

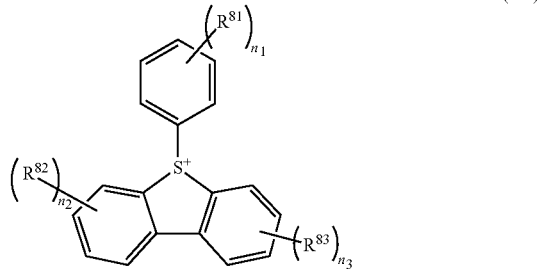

(b-5)

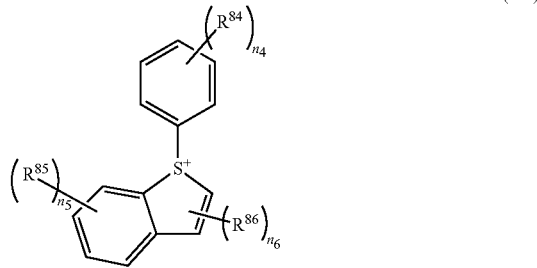

(b-6)

In the above formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{81}$ to $R^{86}$ is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have each been substituted with a hydroxyl group, and examples thereof include a hydroxymethyl group, hydroxyethyl group and hydroxypropyl group.

When the subscripts $n_1$ to $n_6$ appended to $R^{81}$ to $R^{86}$ represent an integer of 2 or more, the plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Examples of preferred cations represented by the above formula (b-5) or (b-6) include the cations shown below.

[Chemical Formula 59]

(b-5-1)
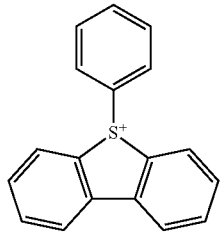

(b-5-2)
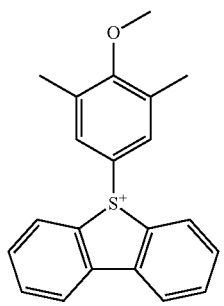

(b-5-3)
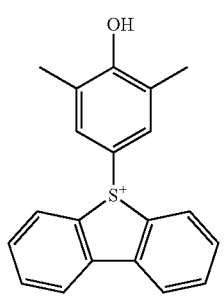

(b-5-4)
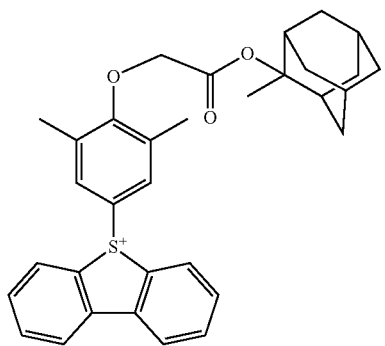

(b-5-5)
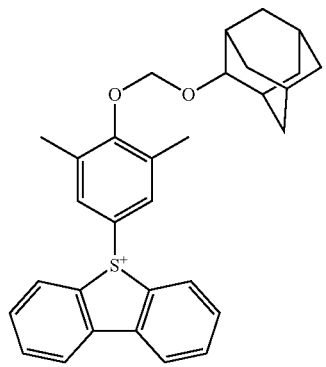

(b-5-6)
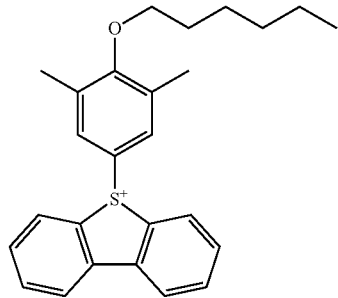

(b-6-1)
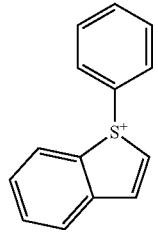

(b-6-2)
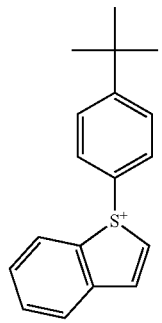

Moreover, a sulfonium salt having a cation moiety represented by general formula (b-7) or (b-8) shown below may also be used as an onium salt acid generator.

[Chemical Formula 60]

(b-7)
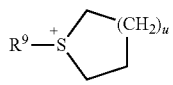

(b-8)

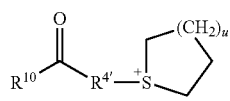

In formulas (b-7) and (b-8), each of $R^9$ and $R^m$ independently represents a phenyl group or naphthyl group which may have a substituent, an alkyl group of 1 to 5 carbon atoms, an alkoxy group or a hydroxyl group. Examples of the substituent include the same substituents as those described above for the substituted aryl groups mentioned within the description relating to the aryl groups of $R^{1''}$ to $R^{3''}$ (such as an alkyl group, alkoxy group, alkoxyalkyloxy group, alkoxycarbonylalkyloxy group, halogen atom, hydroxyl group, oxo group (=O), aryl group, —C—(=O)—O—$R^{6'}$, —O—C(=O)—$R^{7'}$ or —O—$R^{8'}$, or group represented by the above general formula —O—$R^{50}$—C(=O)—O—$R^{56}$ in which $R^{56}$ has been substituted with $R^{56'}$).

$R^{4'}$ represents an alkylene group of 1 to 5 carbon atoms.

u represents an integer of 1 to 3, and is most preferably 1 or 2.

Examples of preferred cations represented by formula (b-7) or (b-8) include the cations shown below. In the formula below, $R^C$ represents a substituent mentioned above within the description relating to the substituted aryl groups (namely, an alkyl group, alkoxy group, alkoxyalkyloxy group, alkoxycarbonylalkyloxy group, halogen atom, hydroxyl group, oxo group (=O), aryl group, —C—(=O)—O—$R^{6'}$ or —O—C(=O)—$R^{7'}$ or —O—$R^{8'}$).

[Chemical Formula 61]

(b-7-1)

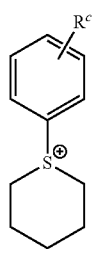

(b-7-2)

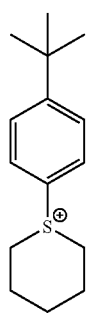

(b-7-3)

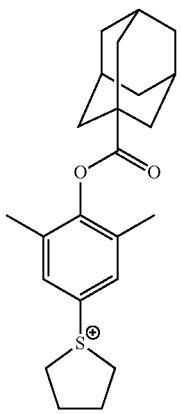

(b-7-4)

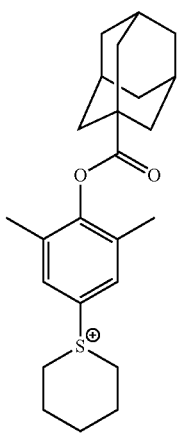

(b-7-5)

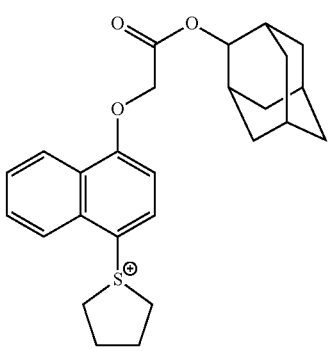

[Chemical Formula 62]

(b-8-1)

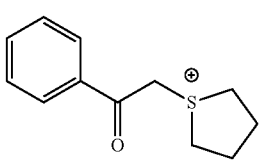

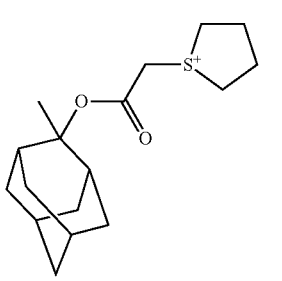

(b-8-2)

There are no particular limitations on the anion moiety of the sulfonium salt having a cation moiety represented by one of formulas (b-5) to (b-8), and the same anion moieties as those used within conventionally proposed onium salt acid generators may be used. Examples of such anion moieties include fluorinated alkylsulfonate ions such as the anion moieties ($R^{4"}SO_3^-$) of the onium salt acid generators represented by general formula (b-1) or (b-2) shown above, anion moieties represented by general formula (b-3) or (b-4) shown above, and anions represented by any of formulas (b1) to (b8) shown above.

In the present description, an oxime sulfonate acid generator is a compound having at least one group represented by general formula (B-1) shown below, and has a feature of generating acid upon irradiation (exposure). Such oxime sulfonate acid generators are widely used for chemically amplified resist compositions, and any of these known compounds may be selected as appropriate.

[Chemical Formula 63]

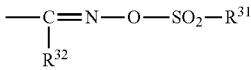

(B-1)

In formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

As the organic group for $R^{31}$, a linear, branched or cyclic alkyl group or aryl group is preferable. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that some or all of the hydrogen atoms of the alkyl group or aryl group may each be substituted with a substituent.

The alkyl group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. A "partially halogenated alkyl group" refers to an alkyl group in which some of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which some of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 64]

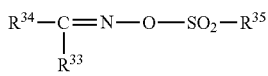

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 65]

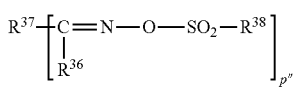

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 09-208554 (Chemical Formulas 18 and 19 shown in paragraphs [0012] to [0014]) and oxime sulfonate acid generators disclosed in International Patent Publication No. 04/074242 pamphlet (Examples 1 to 40 described on pages 65 to 86) may also be used favorably.

Furthermore, the following compounds may also be used as preferred examples.

[Chemical Formula 66]

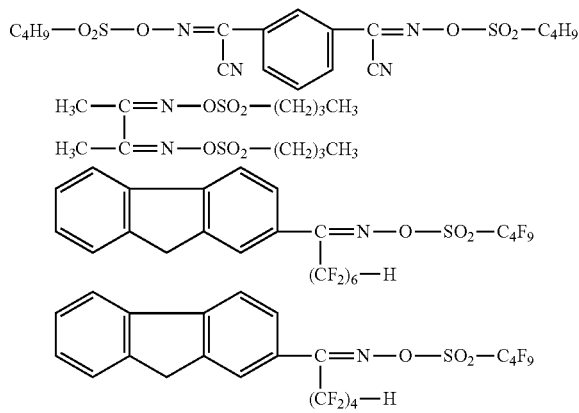

Of the above-mentioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types of acid generators may be used in combination.

The amount of the component (B) within the resist composition is preferably within a range from 0.5 to 60 parts by weight, more preferably from 1 to 50 parts by weight, and still more preferably from 1 to 40 parts by weight, relative to 100 parts by weight of the component (A). When the amount of the component (B) is within the above-mentioned range, formation of a resist pattern can be performed satisfactorily. Further, a uniform solution can be obtained when each of the components of the resist composition are dissolved in an organic solvent, and the storage stability of the solution tends to improve.

<Component (S)>

The resist composition of the present invention can be produced by dissolving the component (A) and the component (B) in an organic solvent (S) (hereinafter frequently referred to as "component (S)") containing an alcohol-based solvent (hereinafter frequently referred to as "component (S1)").

[Component (S1)]

In the present invention, the term "alcohol-based solvent" describes a compound in which at least one hydrogen atom of an aliphatic hydrocarbon has been substituted with a hydroxyl group, and which is a liquid at normal temperature and normal pressure. The structure of the main chain that constitutes the above aliphatic hydrocarbon may be a chain-like structure, a cyclic structure, a chain-like structure that includes a cyclic structure therein, or a chain-like structure that includes an ether linkage.

The component (S1) is preferably a monohydric alcohol, a dihydric alcohol, or a derivative of a dihydric alcohol or the like.

As the monohydric alcohol, a primary or secondary monohydric alcohol is preferred depending on the number of carbon atoms within the compound, and primary monohydric alcohols are the most desirable.

Here, a "monohydric alcohol" describes a compound in which one hydrogen atom within a hydrocarbon compound composed solely of carbon atoms and hydrogen atoms has been substituted with a hydroxyl group. This definition excludes derivatives of dihydric or higher polyhydric alcohols. The above-mentioned hydrocarbon compound may have either a chain-like structure or a cyclic structure.

A "dihydric alcohol" describes a compound in which two hydrogen atoms within an above-mentioned hydrocarbon compound have been substituted with hydroxyl groups, and excludes derivatives of trihydric or higher polyhydric alcohols.

Derivatives of dihydric alcohols include compounds in which one of the hydroxyl groups within a dihydric alcohol has been substituted with a substituent (such as an alkoxy group or alkoxyalkyloxy group).

The boiling point (under normal pressure) of the component (S1) is preferably within a range from 80 to 250° C., and more preferably from 90 to 220° C. From the viewpoints of coatability, stability of the composition upon storage, and bake temperature, the boiling point is most preferably within a range from 100 to 200° C.

Specific examples of the solvent (S1) include compounds having chain-like structures, such as 1-butoxy-2-propanol (BP), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy) ethanol, n-pentyl alcohol, s-pentyl alcohol, t-pentyl alcohol, isopentyl alcohol, isobutanol (also called isobutyl alcohol or 2-methyl-1-propanol), isopropyl alcohol, 2-ethylbutanol, neopentyl alcohol, n-butanol, s-butanol, t-butanol, 1-propanol, 2-methyl-1-butanol, 2-methyl-2-butanol and 4-methyl-2-pentanol, and polyhydric alcohols such as ethylene glycol, diethylene glycol, propylene glycol and dipropylene glycol.

Further, examples of compounds having cyclic structures include cyclopentane methanol, 1-cyclopentylethanol, cyclohexanol, cyclohexane methanol, cyclohexane ethanol, 1,2,3,6-tetrahydrobenzyl alcohol, exo-norborneol, 2-methylcyclohexanol, cycloheptanol, 3,5-dimethylcyclohexanol and benzyl alcohol.

Among the various possibilities for the component (S1), monohydric alcohols having a chain-like structure or derivatives of dihydric alcohols are preferred, 1-butoxy-2-propanol (BP), isobutanol (also called isobutyl alcohol or 2-methyl-1-propanol), 4-methyl-2-pentanol and n-butanol are more preferred, and 1-butoxy-2-propanol (BP) is the most desirable.

As the component (S1), one of the above organic solvents may be used alone, or two or more solvents may be used as in combination.

The amount of the component (S1) within the organic solvent (S) is preferably within a range from 50 to 100% by weight, more preferably from 50 to 90% by weight, and still more preferably from 50 to 70% by weight.

Ensuring that the amount of the component (S1) is at least as large as the lower limit of the above-mentioned range enhances the effects of the present invention. By ensuring that the amount of the component (S1) is not more than 90% by weight, and more preferably 70% by weight or less, the solubility of the component (A1) within the component (S) can be improved.

[Component (S2)]

The resist composition of the present invention may also include another organic solvent (hereinafter frequently referred to as "component (S2)") besides the component (S1).

The component (S2) may be any organic solvent which can dissolve the respective components to give a uniform solution, and one or more types of organic solvent may be selected appropriately from those solvents that have been conventionally known as solvents for chemically amplified resists.

Examples include lactones such as γ-butyrolactone, ketones such as acetone, methyl ethyl ketone, cyclohexanone (ANONE), methyl-n-pentyl ketone, methyl isopentyl ketone and 2-heptanone, polyhydric alcohol derivatives, including compounds having an ether bond, such as a monoalkyl ether (such as a monomethyl ether, monoethyl ether, monopropyl ether or monobutyl ether) or a monophenyl ether of a compound having an ester bond, including ethylene glycol monoacetate, diethylene glycol monoacetate, propylene glycol monoacetate and dipropylene glycol monoacetate [among these derivatives, propylene glycol monomethyl ether acetate (PGMEA) and propylene glycol monomethyl ether (PGME) are preferred], cyclic ethers such as dioxane, esters such as methyl lactate, ethyl lactate (EL), methyl acetate, ethyl acetate, butyl acetate (BA), methyl pyruvate, ethyl pyruvate, methyl methoxypropionate and ethyl ethoxypropionate, and aromatic organic solvents such as anisole, ethyl benzyl ether, cresyl methyl ether, diphenyl ether, dibenzyl ether, phenetole, butyl phenyl ether, n-butyl ether (dibutyl ether, DBE), ethylbenzene, diethylbenzene, pentylbenzene, isopropylbenzene, toluene, xylene, cymene and mesitylene.

As the component (S2), a single solvent may be used alone, or two or more solvents may be used as a solvent mixture.

Among the various possibilities, propylene glycol monomethyl ether acetate (PGMEA), propylene glycol monomethyl ether (PGME), cyclohexanone (ANONE), n-butyl ether (dibutyl ether, DBE) and butyl acetate (BA) are preferred.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

<Other Components>

[Component (D)]

The resist composition of the present invention may also include a nitrogen-containing organic compound (D) (hereinafter referred to as "component (D)") that does not correspond with any of the above components (A), (B) and (S), provided inclusion of the component (D) does not impair the effects of the present invention.

There are no particular limitations on the component (D) provided it functions as an acid diffusion control agent, namely, a quencher which traps the acid generated from the component (B) upon exposure. A multitude of these components (D) have already been proposed, and any of these known compounds may be used. Examples of these conventional compounds include amines such as aliphatic amines and aromatic amines, and of these, an aliphatic amine, and particularly a secondary aliphatic amine or tertiary aliphatic amine, is preferable.

An "aliphatic amine" is an amine having one or more aliphatic groups, wherein each of the aliphatic groups preferably contains 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), and cyclic amines.

The alkyl group and the alkyl group within the hydroxyalkyl group may be linear, branched or cyclic groups.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris [2-{2-(2-hydroxyethoxy)ethoxy}ethyl]amine.

Examples of the aromatic amines include aniline, pyridine, 4-dimethylaminopyridine, pyrrole, indole, pyrazole, imidazole and derivatives thereof, as well as diphenylamine, triphenylamine and tribenzylamine.

As the component (D), a single compound may be used alone, or two or more different compounds may be used in combination.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

[Component (E)]

In the present invention, for the purposes of preventing any deterioration in sensitivity, and improving the resist pattern shape and the post exposure stability of the latent image formed by the pattern-wise exposure of the resist layer, the resist composition may also include at least one compound (E) (hereinafter referred to as "component (E)") selected from the group consisting of organic carboxylic acids, and phosphorus oxo acids and derivatives thereof.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one compound may be used alone, or two or more different compounds may be used in combination.

The component (E) is typically used in an amount within a range from 0.01 to 5.0 parts by weight relative to 100 parts by weight of the component (A).

If desired, other miscible additives besides those described above may also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

According to the resist composition of the present invention, by using the copolymer (A1) which has the structural unit (a2) dispersed uniformly within the copolymer molecule as a base component (A), the resist composition obtained by dissolving the base component (A) in an organic solvent containing an alcohol-based solvent is capable of forming a pattern of minute dimensions with superior shape.

It is thought that the reasons for this effect are that because the structural unit (a2) is dispersed uniformly within the copolymer (A1), the solubility of the copolymer (A1) in the alcohol-based solvent is improved, and this improvement in the solubility enables a greater amount of the structural unit (a2) to be included within the copolymer (A1).

The copolymer (A1) having the structural unit (a2) dispersed uniformly within the copolymer molecule can be produced using the polymerization method described above (see Japanese Unexamined Patent Application, First Publication No. 2010-254810). In this polymerization method, a first solution that has been prepared with a specific monomer composition (the first composition) is first placed in a reactor, and a second solution that has been prepared with a monomer composition (the second composition) that is the same as the design composition is then added dropwise to the reactor to effect a reaction, meaning a polymer having substantially the design composition is produced from the start of the dropwise addition. Because the monomer composition that is added dropwise (the second composition), and the composition of the structural units within the polymer (the design composition) produced immediately following the dropwise addition are the same, the monomer composition of the residual solution within the reactor is maintained at a constant composition (the first composition). Accordingly, as long as the dropwise addition of the second solution to the reactor is continued, a steady state is achieved in which a polymer (P) that matches the design composition is produced in a continuous manner.

In a conventional polymerization method, because the monomer having the highest reaction rate tends to polymerize preferentially, the difference in reaction rates tends to cause specific structural units to polymerize in blocks, resulting in specific structural units becoming localized in certain regions of the polymer.

In the polymerization method described above, a polymer (P) that matches the design composition is produced continuously from immediately following the start of the dropwise addition, and the residual monomer composition within the reactor is maintained at a constant composition. As a result, it is thought that specific monomers are not polymerized in blocks, but rather, a plurality of structural units are polymerized in a random manner, meaning the structural units are dispersed uniformly through the polymer molecule.

In the copolymer (A1) obtained in this manner, the structural unit (a2) is dispersed uniformly within the copolymer molecule. It is thought that, as a result, the solubility of the copolymer in organic solvents containing an alcohol-based solvent is improved significantly. Further, this means that the structural unit (a2) can be introduced into the copolymer (A1) in a larger amount, and therefore a pattern of minute dimensions can be formed with superior shape and favorable lithography properties. Moreover, because the variation (dispersity) in the composition of the structural units that constitute the copolymer (A1) is minimal, a high resolution can be more readily obtained during resist pattern formation.

Furthermore, the resist composition of the present invention may be used as the second resist composition in a double patterning process, and because the resist composition of the present invention does not dissolve the first resist pattern formed using a first resist composition, a resist pattern can be formed by double patterning. In other words, in a method of forming a resist pattern that includes: applying a first resist composition to a substrate to form a first resist film, forming a first resist pattern by selectively exposing and then developing the first resist film, forming a second resist film by applying a second resist composition to the substrate having the first resist pattern formed thereon, and forming a resist pattern by selectively exposing and then developing the second resist film, the resist composition of the present invention is preferably used as the second resist composition.

The steps within the method of forming a resist pattern described above are the same as the steps in the method of forming a resist pattern according to the present invention described below.

In this manner, the resist composition of the present invention is ideal as a resist composition for a double patterning process, and is very useful, enabling very fine patterning to be performed with superior precision.

<<Method of Forming Resist Pattern>>

The method of forming a resist pattern according to the present invention includes: forming a resist film on a substrate using the resist composition according to the present invention described above, conducting exposure of the resist film, and developing the resist film to form a resist pattern.

The method of forming a resist pattern according to the present invention can be performed, for example, as follows.

Firstly, the resist composition of the present invention is applied onto a substrate using a spinner or the like, and a bake (post applied bake (PAB)) treatment is conducted under temperature conditions of 80 to 150° C. for 40 to 120 seconds, and preferably 60 to 90 seconds, to form a resist film.

Subsequently, the resist film is selectively exposed, either by exposure through a mask having a predetermined pattern formed therein (namely, a mask pattern) using an exposure apparatus such as an ArF exposure apparatus, an electron beam lithography apparatus or an EUV exposure apparatus, or by patterning via direct irradiation with an electron beam without using a mask pattern, and another bake (post exposure bake (PEB)) treatment is then conducted under temperature conditions of 80 to 150° C. for 40 to 120 seconds, and preferably 60 to 90 seconds.

The resist film is then subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using an organic solvent.

In the case of a solvent developing process, residual developing solution or rinse liquid adhered to the pattern following the developing treatment and/or rinse treatment may be removed using a supercritical fluid.

Drying is performed following the developing treatment or rinsing treatment. Further, in some cases, a bake treatment (post bake) may be performed following the developing treatment or rinsing treatment.

There are no particular limitations on the substrate, and a conventionally known substrate may be used. For example, substrates for electronic components, and such substrates having wiring patterns formed thereon can be used. Specific examples of the material of the substrate include metals such as silicon wafer, copper, chromium, iron and aluminum, as well as and glass. Suitable materials for the wiring pattern include copper, aluminum, nickel, and gold.

Further, as the substrate, any one of the above-mentioned substrates that has been provided with at least one film selected from the group consisting of inorganic films and organic films on the surface thereof may also be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

The wavelength to be used for exposure is not particularly limited, and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective for use with a KrF excimer laser, ArF excimer laser, EB and EUV, and is particularly effective for use with an ArF excimer laser, EB and EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is first filled with a solvent (an immersion medium) that has a larger refractive index than the refractive index of air, and the resist film is then subjected to exposure (immersion exposure) in this state.

The immersion medium preferably exhibits a refractive index larger than the refractive index of air but smaller than the refractive index of the resist film that is to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and one or more surfactants selected from the group consisting of ionic and nonionic fluorine-based surfactants and silicon-based surfactants may be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinsing treatment performed following a solvent developing process include those organic solvents among the solvents described above for the organic solvent of the organic developing solution which exhibit poor dissolution of the resist pattern.

Examples of typical solvents that may be used include one or more solvents selected from among hydrocarbon solvents, ketone-based solvents, ester-based solvents, alcohol-based solvents, amide-based solvents and ether-based solvents.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

The method of forming a resist pattern according to the present invention can also be used in a double patterning process in which patterning is performed two or more times to form the resist pattern.

A specific example of the double patterning process is a process that includes: forming a first resist film by applying a first resist composition to a substrate, forming a first resist pattern by selectively exposing and then developing the first resist film, forming a second resist film by applying a second resist composition onto the substrate having the first resist pattern formed thereon, and forming a resist pattern by selectively exposing then developing the second resist film. In this process, the method of forming a resist pattern according to the present invention is preferably used during the second patterning.

EXAMPLES

A more detailed description of the present invention is presented below based on a series of examples, although the present invention is in no way limited by these examples.

In the examples, a compound represented by a chemical formula (1) is designated as "compound (1)", and the same labeling system applies for compounds represented by other formulas.

<Copolymer (A1)>

Compounds (1) to (8), which represent the monomers used in the copolymers (A1) of the following examples of the present invention, are shown below.

[Chemical Formula 67]

(1)

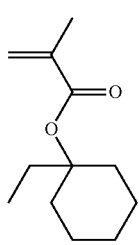

-continued (2)

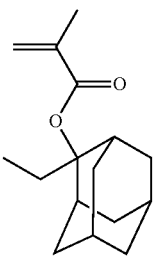

(3)

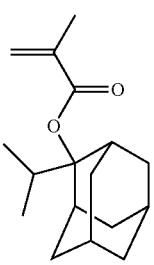

(4)

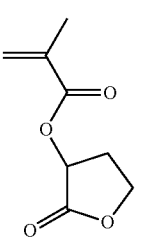

(5)

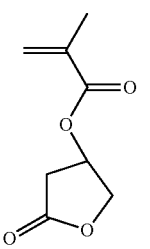

(6)

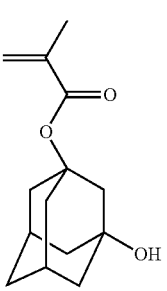

(7)

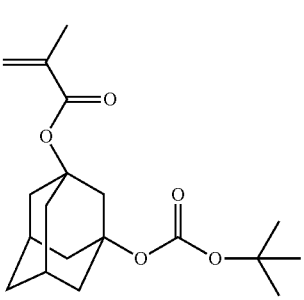

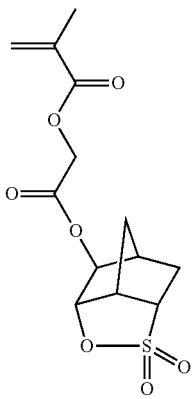

(8)

The copolymer (A1), namely the copolymer in which a structural unit (a2) derived from the compound (4) or the compound (5) was dispersed uniformly within the copolymer molecule, was a resist polymer (manufactured by Mitsubishi Rayon Co., Ltd.) produced using the method of producing a polymer according to the present invention that was originally disclosed in Japanese Unexamined Patent Application, First Publication No. 2010-254810.

The conventional copolymer (A2) was a resist polymer (manufactured by Mitsubishi Rayon Co., Ltd.) produced using a conventional dropwise addition polymerization method, which was different from the method of producing a polymer according to the present invention that was originally disclosed in Japanese Unexamined Patent Application, First Publication No. 2010-254810.

The proportions (mol %) of the structural units derived from each of the compounds that constitute the various copolymers, and the weight-average molecular weight (Mw) and dispersity (Mw/Mn) of each of the copolymers are shown below in Table 1 and Table 2.

The weight-average molecular weight (Mw) and the dispersity (Mw/Mn) values for each copolymer were determined by gel permeation chromatography (GPC) using standard polystyrenes. Further, the proportions (mol %) of the structural units derived from each of the compounds were calculated from the carbon-13 nuclear magnetic resonance spectrum (600 MHz $^{13}$C-NMR).

TABLE 1

| | Proportion of structural unit derived from each compound (mol %) | | | | | | | | | |
|---|---|---|---|---|---|---|---|---|---|---|
| Copolymer (A1) | Compound (1) | Compound (2) | Compound (3) | Compound (4) | Compound (5) | Compound (6) | Compound (7) | Compound (8) | Mw | Mw/Mn |
| A1-1-1 | 30 | | | 50 | | 20 | | | 5300 | 1.68 |
| A1-1-2 | 40 | | | 40 | | 20 | | | 5100 | 1.66 |
| A1-1-3 | 50 | | | 30 | | 20 | | | 4700 | 1.68 |
| A1-1-4 | 60 | | | 10 | | 30 | | | 5100 | 1.67 |
| A1-2-1 | 30 | | | | 50 | 20 | | | 4900 | 1.62 |
| A1-2-2 | 40 | | | | 40 | 20 | | | 5200 | 1.61 |
| A1-2-3 | 50 | | | | 30 | 20 | | | 4700 | 1.63 |
| A1-2-4 | 60 | | | | 10 | 30 | | | 5000 | 1.59 |
| A1-3-1 | | 30 | | | 50 | 20 | | | 5300 | 1.58 |
| A1-3-2 | | 40 | | | 40 | 20 | | | 5100 | 1.60 |
| A1-3-3 | | 50 | | | 30 | 20 | | | 4700 | 1.61 |
| A1-3-4 | | 60 | | | 10 | 30 | | | 4900 | 1.66 |
| A1-4-1 | | 35 | | | 35 | 15 | 15 | | 7200 | 1.59 |
| A1-4-2 | | 45 | | | 30 | 15 | 10 | | 6800 | 1.61 |
| A1-4-3 | | 45 | | | 25 | 15 | 15 | | 6900 | 1.63 |
| A1-4-4 | | 50 | | | 10 | 20 | 20 | | 7100 | 1.65 |
| A1-5-1 | | | 35 | | 35 | 15 | 15 | | 6900 | 1.62 |
| A1-5-2 | | | 45 | | 30 | 15 | 10 | | 7000 | 1.59 |
| A1-6-1 | | 35 | | | 30 | 15 | 15 | 5 | 4900 | 1.65 |
| A1-6-2 | | 45 | | | 25 | 15 | 10 | 5 | 5400 | 1.63 |

TABLE 2

| | Proportion of structural unit derived from each compound (mol %) | | | | | | | | | |
|---|---|---|---|---|---|---|---|---|---|---|
| Conventional Copolymer | Compound (1) | Compound (2) | Compound (3) | Compound (4) | Compound (5) | Compound (6) | Compound (7) | Compound (8) | Mw | Mw/Mn |
| A2-1-1 | 30 | | | 50 | | 20 | | | 5000 | 1.64 |
| A2-1-2 | 40 | | | 40 | | 20 | | | 4600 | 1.69 |
| A2-1-3 | 50 | | | 30 | | 20 | | | 4900 | 1.65 |
| A2-1-4 | 60 | | | 10 | | 30 | | | 5300 | 1.65 |
| A2-2-1 | 30 | | | | 50 | 20 | | | 5000 | 1.67 |
| A2-2-2 | 40 | | | | 40 | 20 | | | 4800 | 1.68 |
| A2-2-3 | 50 | | | | 30 | 20 | | | 4600 | 1.69 |
| A2-2-4 | 60 | | | | 10 | 30 | | | 4900 | 1.67 |
| A2-3-1 | | 30 | | | 50 | 20 | | | 5000 | 1.61 |
| A2-3-2 | | 40 | | | 40 | 20 | | | 4600 | 1.58 |
| A2-3-3 | | 50 | | | 30 | 20 | | | 4800 | 1.63 |
| A2-3-4 | | 60 | | | 10 | 30 | | | 5100 | 1.61 |
| A2-4-1 | | 35 | | | 35 | 15 | 15 | | 6700 | 1.55 |

TABLE 2-continued

| Conventional Copolymer | Proportion of structural unit derived from each compound (mol %) | | | | | | | | Mw | Mw/Mn |
|---|---|---|---|---|---|---|---|---|---|---|
| | Compound (1) | Compound (2) | Compound (3) | Compound (4) | Compound (5) | Compound (6) | Compound (7) | Compound (8) | | |
| A2-4-2 | | 45 | | | 30 | 15 | 10 | | 7000 | 1.58 |
| A2-4-3 | | 45 | | | 25 | 15 | 15 | | 6500 | 1.67 |
| A2-4-4 | | 50 | | | 10 | 20 | 20 | | 6500 | 1.64 |
| A2-5-1 | | | 35 | | 35 | 15 | 15 | | 6800 | 1.57 |
| A2-5-2 | | | 45 | | 30 | 15 | 10 | | 7200 | 1.63 |
| A2-6-1 | 35 | | | | 30 | 15 | 15 | 5 | 5200 | 1.64 |
| A2-6-2 | | 45 | | | 25 | 15 | 10 | 5 | 5200 | 1.58 |

The structures of the copolymers that were used are shown below.

For example, the copolymers (A1-1-1) to (A1-1-4) are all composed of the same three structural units, with the respective proportions of those structural units differing as shown in Table 1.

The copolymers (A2-1-1) to (A2-1-4) are all composed of the same three structural units as the copolymers (A1-1-1) to (A1-1-4), with the respective proportions of those structural units differing as shown in Table 2.

The copolymers (A1-1-1) to (A1-1-4) are copolymers which, compared with the copolymers (A2-1-1) to (A2-1-4), have each of the structural units that constitutes the copolymer distributed uniformly within the copolymer molecule.

[Chemical Formula 68]

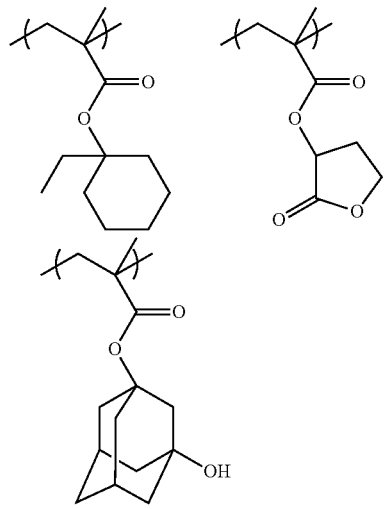

Copolymers (A1-1-1) to (A1-1-4)
Copolymers (A2-1-1) to (A2-1-4)

[Chemical Formula 69]

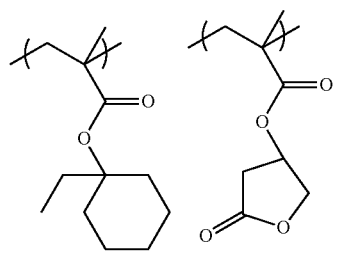

-continued

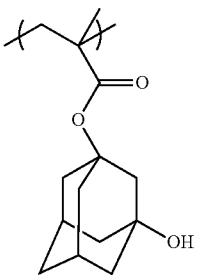

Copolymers (A1-2-1) to (A1-2-4)
Copolymers (A2-2-1) to (A2-2-4)

[Chemical Formula 70]

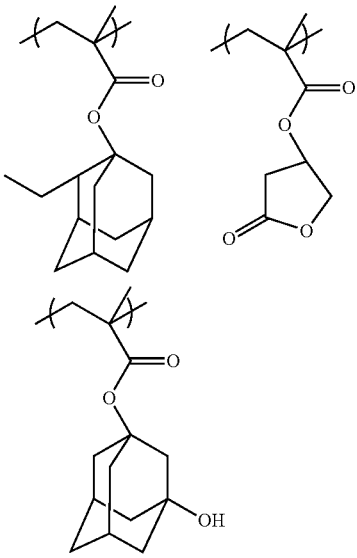

Copolymers (A1-3-1) to (A1-3-4)
Copolymers (A2-3-1) to (A2-3-4)

[Chemical Formula 71]

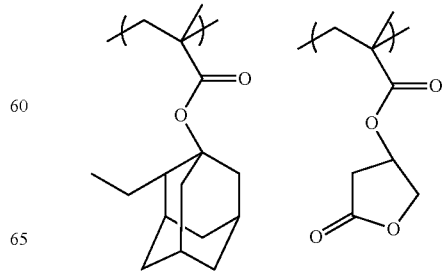

-continued

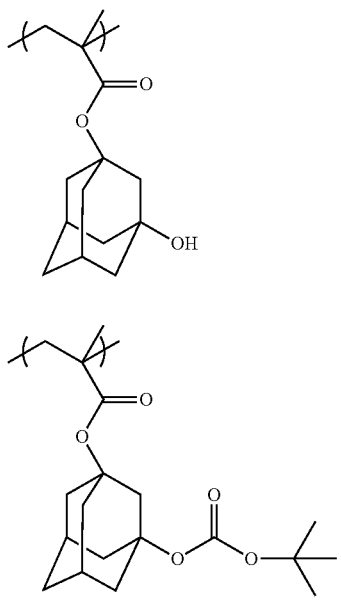

Copolymers (A1-4-1) to (A1-4-4)
Copolymers (A2-4-1) to (A2-4-4)

[Chemical Formula 72]

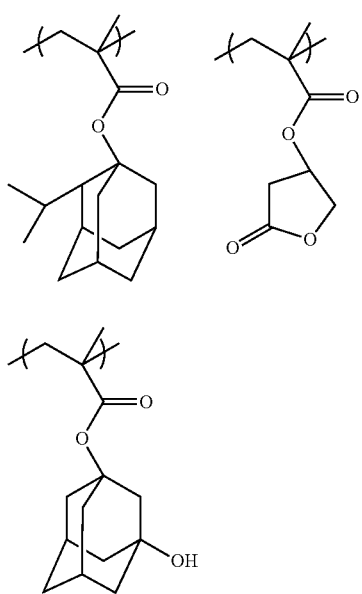

Copolymers (A1-5-1) to (A1-5-2)
Copolymers (A2-5-1) to (A2-5-2)

[Chemical Formula 73]

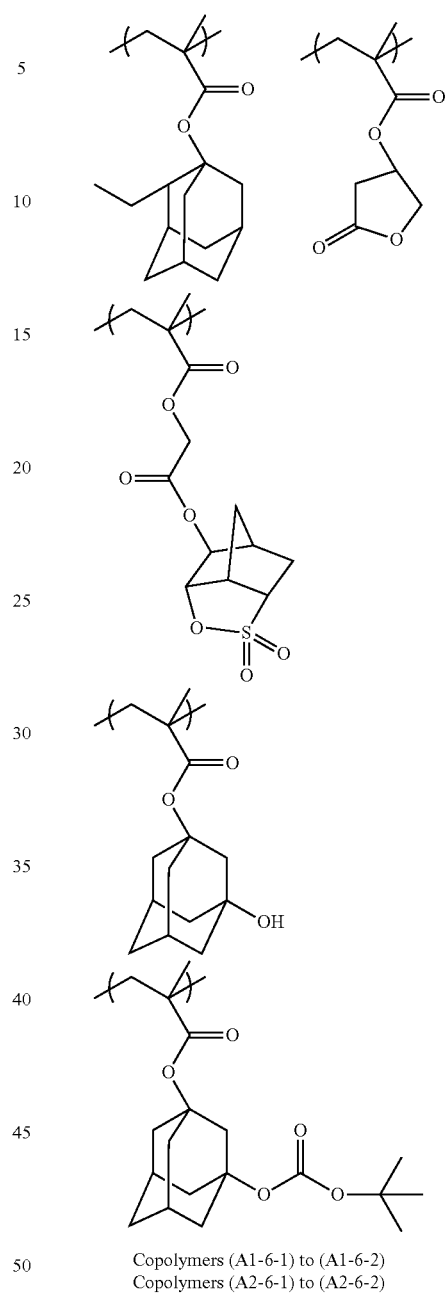

Copolymers (A1-6-1) to (A1-6-2)
Copolymers (A2-6-1) to (A2-6-2)

<Evaluation of Solubility of Copolymers in Organic Solvents>

Using the copolymers and organic solvents listed below, the solubility of the copolymers in the organic solvents was evaluated using the evaluation method described below.

—Copolymers
The above-mentioned copolymers (A1-1-1) to (A1-6-2)
The above-mentioned copolymers (A2-1-1) to (A2-6-2)

—Organic Solvents
A mixed solvent of BP and PM (BP/PM)
A mixed solvent of BP, PM and BA (BP/PM/BA)
A mixed solvent of BP, PM and DBE (BP/PM/DBE)
A mixed solvent of BP, PM and PE (BP/PM/PE)
A mixed solvent of BP, PM and ANONE (BP/PM/ANONE)

The abbreviations BP, PM, BA, DBE, PE and ANONE refer to the organic solvents listed below.

BP: 1-butoxy-2-propanol, PM: propylene glycol monomethyl ether acetate, BA: butyl acetate, DBE: n-butyl ether (dibutyl ether), PE: propylene glycol monomethyl ether, ANONE: cyclohexanone 0.1 g powder samples of each of the copolymers were mixed with 0.3 g samples of each of the above organic solvents to produce a solid fraction concentration of 25% by weight in each case, and a determination was made as to whether or not the powder dissolved in the organic solvent under room temperature conditions (23° C.).

If the powder did not dissolve, then an additional 0.6 g of the organic solvent was added to reduce the solid fraction concentration to 10% by weight, and a determination was made as to whether or not the powder dissolved under these conditions.

If the powder still did not dissolve, then an additional 1.0 g of the organic solvent was added to reduce the solid fraction concentration to 5% by weight, and a determination was made as to whether or not the powder dissolved under these conditions.

If the powder still did not dissolve, then an additional 3.0 g of the organic solvent was added to reduce the solid fraction concentration to 2% by weight, and a determination was made as to whether or not the powder dissolved under these conditions.

If the powder still did not dissolve, then an additional 5.0 g of the organic solvent was added to reduce the solid fraction concentration to 1% by weight, and a determination was made as to whether or not the powder dissolved under these conditions.

In addition to the solid fraction concentration levels mentioned above, 0.1 g powder samples of each of the copolymers were also mixed with 0.4 g samples of each of the above organic solvents to produce a solid fraction concentration of 20% by weight in each case, and a determination was made as to whether or not the powder dissolved in the organic solvent under room temperature conditions (23° C.).

Further, 0.15 g powder samples of each of the copolymers were also mixed with 0.85 g samples of each of the above organic solvents to produce a solid fraction concentration of 15% by weight in each case, and a determination was made as to whether or not the powder dissolved in the organic solvent under room temperature conditions (23° C.).

Furthermore, 0.15 g powder samples of each of the copolymers were also mixed with 4.85 g samples of each of the above organic solvents to produce a solid fraction concentration of 3% by weight in each case, and a determination was made as to whether or not the powder dissolved in the organic solvent under room temperature conditions (23° C.).

Tables 3 to 10 show the maximum concentration (% by weight) at which each of the copolymers dissolved in each of the organic solvents (the above mixed solvents). In the tables, the symbol x means the copolymer powder did not dissolve, and even a solution with a solid fraction concentration of 1% by weight could not be prepared (with the solution being cloudy, or the powder being simply dispersed in the solvent). The symbol - indicates that a solubility test was not performed.

TABLE 3

| | BP/PM (weight ratio) | | | |
|---|---|---|---|---|
| | 5/5 | 7/3 | 9/1 | 10/0 |
| Conventional copolymers | | | | |
| A2-1-1 | x | x | x | x |
| A2-1-2 | x | x | x | x |
| A2-1-3 | 1% by weight | x | x | x |
| A2-1-4 | 1% by weight | x | x | x |
| Copolymers (A1) | | | | |
| A1-1-1 | 5% by weight | 1% by weight | x | x |
| A1-1-2 | 15% by weight | 10% by weight | 1% by weight | x |
| A1-1-3 | 25% by weight | 15% by weight | 5% by weight | 2% by weight |
| A1-1-4 | 25% by weight | 15% by weight | 10% by weight | 5% by weight |

TABLE 4

| | BP/PM (weight ratio) | | | |
|---|---|---|---|---|
| | 5/5 | 7/3 | 9/1 | 10/0 |
| Conventional copolymers | | | | |
| A2-2-1 | x | x | x | x |
| A2-2-2 | x | x | x | x |
| A2-2-3 | 1% by weight | x | x | x |
| A2-2-4 | 3% by weight | 1% by weight | x | x |
| Copolymers (A1) | | | | |
| A1-2-1 | 15% by weight | 10% by weight | 1% by weight | x |
| A1-2-2 | 25% by weight | 25% by weight | 10% by weight | x |
| A1-2-3 | 25% by weight | 25% by weight | 10% by weight | 1% by weight |
| A1-2-4 | 25% by weight | 25% by weight | 15% by weight | 5% by weight |

TABLE 5

| | BP/PM (weight ratio) | | | |
|---|---|---|---|---|
| | 5/5 | 7/3 | 9/1 | 10/0 |
| Conventional copolymers | | | | |
| A2-3-1 | — | — | — | — |
| A2-3-2 | x | x | x | x |
| A2-3-3 | 1% by weight | x | x | x |
| A2-3-4 | 1% by weight | x | x | x |
| Copolymers (A1) | | | | |
| A1-3-1 | — | — | — | — |
| A1-3-2 | 25% by weight | 15% by weight | 10% by weight | x |
| A1-3-3 | 25% by weight | 25% by weight | 10% by weight | 1% by weight |
| A1-3-4 | 25% by weight | 25% by weight | 15% by weight | 2% by weight |

TABLE 6

| | BP/PM (weight ratio) | | | |
|---|---|---|---|---|
| | 5/5 | 7/3 | 9/1 | 10/0 |
| Conventional copolymers | | | | |
| A2-4-1 | 2% by weight | x | x | x |
| A2-4-2 | 5% by weight | 1% by weight | x | x |
| A2-4-3 | 20% by weight | 10% by weight | 5% by weight | x |
| A2-4-4 | 25% by weight | 20% by weight | 15% by weight | x |
| Copolymers (A1) | | | | |
| A1-4-1 | 25% by weight | 25% by weight | 25% by weight | 5% by weight |
| A1-4-2 | 25% by weight | 25% by weight | 25% by weight | 10% by weight |
| A1-4-3 | 25% by weight | 25% by weight | 25% by weight | 25% by weight |
| A1-4-4 | 25% by weight | 25% by weight | 25% by weight | 25% by weight |

TABLE 7

| | BP/PM (weight ratio) | | | |
|---|---|---|---|---|
| | 5/5 | 7/3 | 9/1 | 10/0 |
| Conventional copolymers | | | | |
| A2-5-1 | 5% by weight | x | x | x |
| A2-5-2 | 10% by weight | x | x | x |
| Copolymers (A1) | | | | |
| A1-5-1 | 25% by weight | 10% by weight | 5% by weight | 2% by weight |
| A1-5-2 | 25% by weight | 25% by weight | 10% by weight | 2% by weight |

TABLE 8

| | BP/PM (weight ratio) | | | |
|---|---|---|---|---|
| | 5/5 | 7/3 | 9/1 | 10/0 |
| Conventional copolymers | | | | |
| A2-6-1 | 5% by weight | x | x | x |
| A2-6-2 | 10% by weight | x | x | x |
| Copolymers (A1) | | | | |
| A1-6-1 | 25% by weight | 15% by weight | 10% by weight | x |
| A1-6-2 | 25% by weight | 25% by weight | 20% by weight | 5% by weight |

TABLE 9

| | BP/PM/BA (weight ratio) | | | |
|---|---|---|---|---|
| Conventional copolymer | 5/4/1 | 7/2/1 | 8/1/1 | 10/0/0 |
| A2-5-1 | 5% by weight | x | x | x |

TABLE 9-continued

| | BP/PM/DBE (weight ratio) | | | |
|---|---|---|---|---|
| Conventional copolymer | 50/15/35 | 70/15/15 | 80/15/5 | 10/0/0 |
| A2-5-1 | x | x | x | x |
| | BP/PM/BA (weight ratio) | | | |
| Copolymer (A1) | 5/4/1 | 7/2/1 | 8/1/1 | 10/0/0 |
| A1-5-1 | 25% by weight | 10% by weight | 10% by weight | 2% by weight |
| | BP/PM/DBE (weight ratio) | | | |
| Copolymer (A1) | 50/15/35 | 70/15/15 | 80/15/5 | 10/0/0 |
| A1-5-1 | x | 5% by weight | 5% by weight | 2% by weight |

TABLE 10

| Conventional copolymer | BP/PM/PE (weight ratio) | | | |
|---|---|---|---|---|
| | 5/4/1 | 7/2/1 | 8/1/1 | 10/0/0 |
| A2-5-1 | 5% by weight | x | x | x |
| Conventional copolymer | BP/PM/ANONE (weight ratio) | | | |
| | 5/4/1 | 7/2/1 | 8/1/1 | 10/0/0 |
| A2-5-1 | 5% by weight | 1% by weight | x | x |
| Copolymer (A1) | BP/PM/PE (weight ratio) | | | |
| | 5/4/1 | 7/2/1 | 8/1/1 | 10/0/0 |
| A1-5-1 | 25% by weight | 10% by weight | 10% by weight | 2% by weight |
| Copolymer (A1) | BP/PM/ANONE (weight ratio) | | | |
| | 5/4/1 | 7/2/1 | 8/1/1 | 10/0/0 |
| A1-5-1 | 25% by weight | 15% by weight | 10% by weight | 2% by weight |

Based on the results of Tables 3 to 10 it is evident that, compared with the conventional copolymers containing the same structural units in the same proportions (mol %), the copolymers (A1) exhibited superior solubility in each of the organic solvents (mixed solvents).

Further, for the copolymers (A1), it was confirmed that even if the proportion of the structural unit (a2) was increased, by controlling the nature of the other structural units and the respective proportions of those structural units, the copolymer could still be dissolved in organic solvents containing 50% by weight or more of an alcohol-based solvent.

<Preparation of Resist Compositions>

Examples 1 to 4, Comparative Examples 1 and 2

The components shown in Table 11 were mixed together and dissolved to prepare a series of resist compositions.

In comparative example 2, the copolymer (A2-2-4) did not dissolve in the component (S), meaning a resist composition could not be prepared. Accordingly, the evaluations described below were not performed for comparative example 2.

TABLE 11

|  | Component (A) | Component (B) |  | Component (D) | Component (E) | Component (S) |
|---|---|---|---|---|---|---|
| Comparative example 1 | (A)-1 [100] | (B)-1 [15.0] | — | (D)-1 [1.60] | (E)-1 [1.00] | (S)-1 [2700] |
| Example 1 | (A)-2 [100] | (B)-1 [15.0] | — | (D)-1 [1.60] | (E)-1 [1.00] | (S)-1 [2700] |
| Example 2 | (A)-3 [100] | (B)-1 [15.0] | — | (D)-1 [1.60] | (E)-1 [1.00] | (S)-1 [2700] |
| Comparative example 2 | (A)-4 [100] | (B)-2 [12.0] | (B)-3 [2.60] | (D)-1 [0.60] | (E)-1 [1.00] | (S)-1 [2700] |
| Example 3 | (A)-5 [100] | (B)-2 [12.0] | (B)-3 [2.60] | (D)-1 [0.60] | (E)-1 [1.00] | (S)-1 [2700] |
| Example 4 | (A)-6 [100] | (B)-2 [12.0] | (B)-3 [2.60] | (D)-1 [0.60] | (E)-1 [1.00] | (S)-1 [2700] |

In Table 11, the numerical values in brackets [ ] indicate the amount (in parts by weight) of the component added. Further, the reference symbols in Table 11 have the meanings shown below.

(A)-1: the above-mentioned copolymer (A2-4-3)
(A)-2: the above-mentioned copolymer (A1-4-3)
(A)-3: the above-mentioned copolymer (A1-4-1)
(A)-4: the above-mentioned copolymer (A2-2-4)
(A)-5: the above-mentioned copolymer (A1-2-4)
(A)-6: the above-mentioned copolymer (A1-2-2)
(B)-1: the compound represented by chemical formula (B)-1 shown below
(B)-2: the compound represented by chemical formula (B)-2 shown below
(B)-3: the compound represented by chemical formula (B)-3 shown below

[Chemical Formula 74]

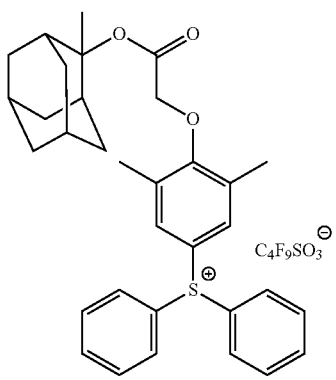

(B)-1

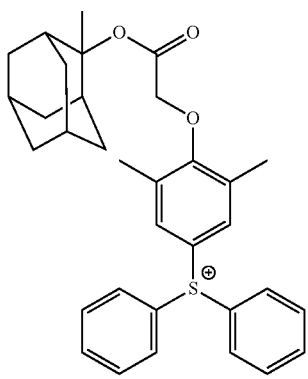

(B)-2

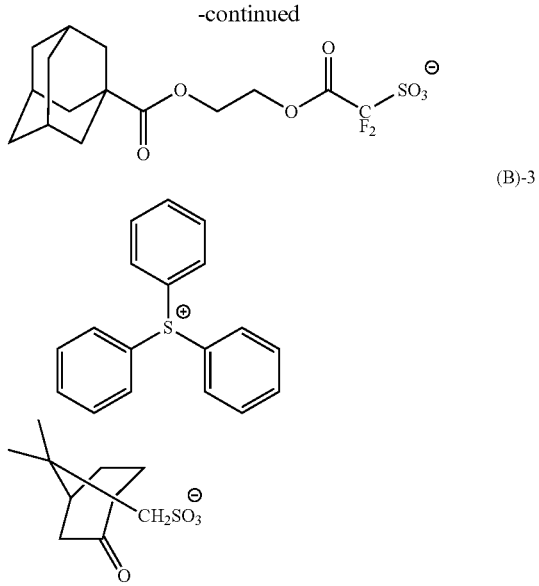

(D)-1: tri-n-pentylamine
(E)-1: salicylic acid
(S)-1: a mixed solvent of BP/PM=9/1 (weight ratio)

<Resist Pattern Formation>

An organic antireflection film composition (product name: ARC95, manufactured by Brewer Science Ltd.) was applied onto a 12-inch silicon wafer using a spinner, and the composition was then baked and dried at 205° C. for 90 seconds on a hotplate, thereby forming an organic antireflection film having a film thickness of 90 nm.

Each of the resist compositions prepared above was applied onto a thus formed antireflection film using a spinner, and the resist composition was then prebaked (PAB) and dried on a hotplate at a temperature indicated in Table 12 for 60 seconds, thereby forming a resist film having a film thickness of 80 nm.

Subsequently, a coating solution for forming a protective film (product name: TILC-057, manufactured by Tokyo Ohka Kogyo Co., Ltd.) was applied onto the resist film using a spinner, and was then heated at 90° C. for 60 seconds, thereby forming a top coat with a film thickness of 35 nm.

Using an ArF exposure apparatus for immersion lithography (product name: NSR-5609B, manufactured by Nikon Corporation, NA (numerical aperture)=1.07, Dipole (in/out: 0.78/0.97) w/POLANO), the resist film having the top coat formed thereon was selectively irradiated with an ArF excimer laser (193 nm) through a photomask (6% Att-PSM) targeting a line and space resist pattern (LS pattern) with a line width of 50 nm and a pitch of 100 nm.

Next, a post exposure bake (PEB) treatment was conducted at a temperature indicated in Table 12 for 60 seconds, followed by alkali development for 10 seconds at 23° C. in a 2.38% by weight aqueous solution of tetramethylammonium hydroxide (TMAH) (product name: NMD-3, manufactured by Tokyo Ohka Kogyo Co., Ltd.).

Subsequently, a postbake was conducted at 100° C. for 45 seconds.

As a result, an LS pattern in which lines having a width of 50 nm were arranged at equal intervals (pitch: 100 nm) was formed in the resist film. The optimum exposure dose Eop (mJ/cm$^2$) was determined. The results are shown in Table 12.

[Evaluation of Resistance to Pattern Collapse]

For the formation of the LS pattern having target dimensions including a line width of 50 nm and a pitch of 100 nm, the exposure time for the selective exposure was gradually lengthened, and the line width immediately prior to pattern collapse when the exposure dose exceeded the Eop value (namely, the critical dimension that was able to be resolved) was measured. The result is shown in Table 12 as the "pattern collapse (nm)" value.

[Evaluation of Exposure Latitude (EL)]

The exposure dose at which an LS pattern having a line width within a range specified by: [targeted dimension (line width of 50 nm)±5%] (namely, within a range from 47.5 nm to 52.5 nm) was formed was determined, and the EL (unit: %) was determined using the formula shown below. The results are shown in Table 12.

$$EL(\%)=(|E1-E2|/Eop) \times 100$$

In the formula, E1 represents the exposure dose (mJ/cm$^2$) for forming an LS pattern with a line width of 47.5 nm, and E2 represents the exposure dose (mJ/cm$^2$) for forming an LS pattern with a line width of 52.5 nm.

The larger the value for EL, the smaller the variation in the pattern size caused by fluctuation in the exposure dose.

[Evaluation of Line Width Roughness (LWR)]

For each of the LS patterns having a line width of 50 nm and a pitch of 100 nm formed at the above-mentioned Eop value, the line width was measured at 100 points along the lengthwise direction of the line using a measuring scanning electron microscope (SEM) (accelerating voltage: 800 V, product name: S-9220, manufactured by Hitachi, Ltd.), and from these results, the value of 3 times the standard deviation (s) (namely, 3s) was calculated as an indicator of the LWR. The results are shown in Table 12.

The smaller this value of 3s, the lower the level of roughness in the line width, indicating an LS pattern of more uniform width.

[Evaluation of Line Edge Roughness (LER)]

For each of the LS patterns formed at the above-mentioned Eop value, the line edge width (width of the fluctuation from a reference line) was measured at 100 points on the line using a measuring scanning electron microscope (SEM) (accelerating voltage: 800 V, product name: S-9220, manufactured by Hitachi, Ltd.), and from these results, the value of 3 times the standard deviation (s) (namely, 3s) was calculated as an indicator of the LER. The results are shown in Table 12.

The smaller this value of 3s, the lower the level of roughness in the line width (side walls), indicating an LS pattern of more uniform width.

[Evaluation of Resist Pattern Shape]

The cross-sectional shape of the LS pattern having a line width of 50 nm and a pitch of 100 nm formed at the above Eop value was inspected using a scanning electron microscope (SEM), and the LS pattern shape was evaluated. The results are shown in Table 12.

TABLE 12

|  | Comparative example 1 | Example 1 | Example 2 | Example 3 | Example 4 |
|---|---|---|---|---|---|
| PAB/PEB (° C.) | 120/90 | 120/90 | 120/90 | 110/90 | 110/90 |
| Eop (mJ/cm$^2$) | 22.7 | 19.9 | 20.7 | 52.4 | 43.4 |
| Pattern collapse (nm) | 41.8 | 40.9 | 34.2 | more than 50 | 32.2 |
| EL (%) | 9.81 | 13.44 | 13.85 | 4.61 | 13.32 |
| LWR (nm) | 5.87 | 5.04 | 4.48 | 11.14 | 4.98 |
| LER (nm) | 3.72 | 3.32 | 2.89 | 6.73 | 3.11 |
| Resist pattern shape | top slightly rounded | rectangular | rectangular | rectangular | rectangular |

Based on the evaluation results in Table 12, it was confirmed that, compared with the resist composition of comparative example 1, the resist compositions of examples 1 to 4 were able to form a pattern of minute dimensions with a superior shape.

Further, it is also evident that the resist composition of example 2, which contained a copolymer having a larger amount of the structural unit (a2) than the copolymer within example 1, exhibited lithography properties that were superior even to those of the resist composition of example 1. In a similar manner, it is evident that the resist composition of example 4, which contained a copolymer having a larger amount of the structural unit (a2) than the copolymer within example 3, exhibited lithography properties that were dramatically superior to those of the resist composition of example 3.

What is claimed is:

1. A resist composition, comprising a base component (A) which exhibits changed solubility in a developing solution under action of acid,
   the base component (A) comprising a copolymer (A1) that exhibits increased polarity under action of acid,
   the copolymer (A1) including a structural unit (a2), which is derived from an acrylate ester in which a hydrogen atom bonded to a carbon atom on an α-position may be substituted with a substituent, and comprises a lactone-containing cyclic group, wherein a proportion of the structural unit (a2) within the copolymer (A1), based on a combined total of all structural units that constitute the component (A1), is within a range from 40 to 60 mol%, wherein
   the structural unit (a2) is polymerized within the copolymer (A1) in a random manner,
   an acid generator component (B) which generates acid upon exposure, dissolved in an organic solvent (S) which comprises at least one alcohol-based solvent selected from the group consisting of 1-butoxy-2-propanol, isobutanol, 4-methyl-2-pentanol, and n-butanol,
   wherein an amount of the alcohol-based solvent within the organic solvent (S) is within a range from 50 to 70% by weight.

2. The resist composition according to claim 1, wherein the copolymer (A1) further comprises a structural unit (a1), which is derived from an acrylate ester in which a hydrogen atom bonded to a carbon atom on an α-position may be substituted with a substituent, and comprises an acid-degradable group that exhibits increased polarity under action of acid.

3. The resist composition according to claim 1, wherein the copolymer (A1) further comprises a structural unit (a3), which is derived from an acrylate ester in which a hydrogen atom bonded to a carbon atom on an α-position may be substituted with a substituent, and comprises a polar group-containing aliphatic hydrocarbon group.

4. A method of forming a resist pattern, the method comprising: forming a resist film on a substrate using the resist composition according to any one of claims 1, 2 or 3, conducting exposure of the resist film, and developing the resist film to form a resist pattern.

5. The resist composition according to claim 1, wherein the alcohol-based solvent includes 1-butoxy-2-propanol.

* * * * *

UNITED STATES PATENT AND TRADEMARK OFFICE
CERTIFICATE OF CORRECTION

PATENT NO.         : 9,023,577 B2                                    Page 1 of 1
APPLICATION NO.    : 13/346166
DATED              : May 5, 2015
INVENTOR(S)        : Masaru Takeshita et al.

It is certified that error appears in the above-identified patent and that said Letters Patent is hereby corrected as shown below:

In the specification,
Col. 1, line 27, "lead" should be --led--.
Col. 10, line 5, "atoms" should be --atoms.--.
Col. 27, line 47, "acid dissociable," should be --acid-dissociable,--.
Col. 32, line 55, "(a2-5)" should be --(a2-5).--.
Col. 62, line 47, "1e" should be --$R^{13}$--.
Col. 84, lines 1-2, "—$Y^{21}$—O—C(=O)—$Y^{22}$—$Y^{21}$,$Y^{22}$ and"
should be -- —$Y^{21}$—O—C(=O)—$Y^{22}$—. $Y^{21}$, $Y^{22}$— and m'--.
Col. 111, line 6, "$R^{'''}$" should be --$R^{1''}$--.
Col. 113, line 14, "($R^{4n}SO_3^-$)" should be --($R^{4''}SO_3^-$)--.
Col. 114, line 8, "$R^{4n}$." should be --$R^{4''}$.--.
Col. 129, line 66, "at it" should be --as it--.
Col. 139, line 7, "cyclohexanone" should be --cyclohexanone.--.
Col. 144, line 63, "NSR-5609B," should be --NSR-S609B,--.

In the claims,
Col. 146, line 47 (claim 1), "mol%," should be --mol %,--.

Signed and Sealed this
Sixteenth Day of February, 2016

Michelle K. Lee
*Director of the United States Patent and Trademark Office*